(12) United States Patent
Sakuma et al.

(10) Patent No.: US 9,305,936 B2
(45) Date of Patent: Apr. 5, 2016

(54) NONVOLATILE SEMICONDUCTOR MEMORY DEVICE AND METHOD OF MANUFACTURING THE SAME

(71) Applicant: Kabushiki Kaisha Toshiba, Minato-ku (JP)

(72) Inventors: Kiwamu Sakuma, Yokohama (JP); Masahiro Kiyotoshi, Yokkaichi (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 14/854,500

(22) Filed: Sep. 15, 2015

(65) Prior Publication Data

US 2016/0005757 A1 Jan. 7, 2016

Related U.S. Application Data

(62) Division of application No. 14/321,994, filed on Jul. 2, 2014.

(30) Foreign Application Priority Data

Jul. 3, 2013 (JP) ................................. 2013-139685

(51) Int. Cl.
*H01L 21/28* (2006.01)
*H01L 21/308* (2006.01)
(Continued)

(52) U.S. Cl.
CPC .... *H01L 27/11578* (2013.01); *H01L 21/28273* (2013.01); *H01L 21/28282* (2013.01);
(Continued)

(58) Field of Classification Search
CPC .................. H01L 21/28273; H01L 21/28282; H01L 27/1157; H01L 27/11551; H01L 27/11556; H01L 27/11578; H01L 27/11582; H01L 29/7889; H01L 29/7926; H01L 29/66825; H01L 29/66833

USPC ......... 438/142, 146, 257, 269, 287, 588, 591; 257/316, 324, 325, 326, 329, E27.057, 257/E27.096, E29.183, E29.3, E29.309

See application file for complete search history.

(56) References Cited

U.S. PATENT DOCUMENTS 7,352,018 B2 4/2008 Specht et al.
8,513,725 B2 * 8/2013 Sakuma ............ H01L 27/11519
257/314
(Continued)

FOREIGN PATENT DOCUMENTS

JP 2006-155750 A 6/2006
JP 2007-266143 A 10/2007
(Continued)

OTHER PUBLICATIONS

Wonjoo Kim, et al., "Multi-Layered Vertical Gate NAND Flash Overcoming Stacking Limit for Terabit Density Storage" 2009 Symposium on VLSI Technology Digest of Technical Papers, 2009,pp. 188-189.

(Continued)

*Primary Examiner* — Dao H Nguyen
(74) *Attorney, Agent, or Firm* — Oblon, McClelland, Maier & Neustadt, L.L.P.

(57) ABSTRACT

According to one embodiment, a nonvolatile semiconductor memory device includes a stacked layer structure including first to n-th semiconductor layers (n is a natural number equal to or larger than 2) stacked in a first direction which is perpendicular to a surface of a semiconductor substrate, and an upper insulating layer stacked on the n-th semiconductor layer, the stacked layer structure extending in a second direction which is parallel to the surface of the semiconductor substrate, and first to n-th NAND strings provided on surfaces of the first to n-th semiconductor layers in a third direction which is perpendicular to the first and second directions respectively.

10 Claims, 56 Drawing Sheets

(51) Int. Cl.
*H01L 27/115* (2006.01)
*H01L 29/788* (2006.01)
*H01L 29/792* (2006.01)
*H01L 29/66* (2006.01)

(52) U.S. Cl.
CPC ...... *H01L27/1157* (2013.01); *H01L 27/11551* (2013.01); *H01L 27/11582* (2013.01); *H01L 29/7889* (2013.01); *H01L 27/11556* (2013.01); *H01L 29/66825* (2013.01); *H01L 29/7926* (2013.01)

(56) References Cited

U.S. PATENT DOCUMENTS

| | | | |
|---|---|---|---|
| 8,643,078 B2 * | 2/2014 | Chen | H01L 23/3192 257/315 |
| 8,946,810 B2 * | 2/2015 | Alsmeier | H01L 27/11551 257/314 |
| 8,952,441 B2 * | 2/2015 | Sakuma | H01L 29/68825 257/278 |
| 8,952,443 B2 * | 2/2015 | Chang | H01L 21/28273 257/208 |
| 2007/0018201 A1 | 1/2007 | Specht et al. | |
| 2007/0212889 A1 | 9/2007 | Abatchev et al. | |
| 2007/0252201 A1 | 11/2007 | Kito et al. | |
| 2008/0259687 A1 | 10/2008 | Specht et al. | |
| 2009/0294836 A1 | 12/2009 | Kiyotoshi | |
| 2010/0226195 A1 | 9/2010 | Lue | |
| 2011/0049611 A1 | 3/2011 | Kiyotoshi et al. | |
| 2011/0284946 A1 | 11/2011 | Kiyotoshi | |
| 2012/0068241 A1 | 3/2012 | Sakuma et al. | |
| 2012/0068254 A1 * | 3/2012 | Sakuma | H01L 29/792 257/324 |
| 2012/0139030 A1 | 6/2012 | Sakuma et al. | |
| 2012/0182806 A1 | 7/2012 | Chen et al. | |
| 2012/0267699 A1 | 10/2012 | Kiyotoshi | |
| 2012/0280303 A1 | 11/2012 | Kiyotoshi et al. | |
| 2013/0001652 A1 | 1/2013 | Yoshikawa et al. | |
| 2013/0015519 A1 | 1/2013 | Fujii et al. | |
| 2013/0015520 A1 | 1/2013 | Shosuke et al. | |
| 2013/0307047 A1 | 11/2013 | Sakuma et al. | |

FOREIGN PATENT DOCUMENTS

| | | |
|---|---|---|
| JP | 2009-529784 A | 8/2009 |
| JP | 2009-238874 A | 10/2009 |
| JP | 2009-295694 A | 12/2009 |
| JP | 2011-49395 | 3/2011 |
| JP | 2011-114235 A | 6/2011 |
| JP | 2012-69603 A | 4/2012 |
| JP | 2012-69604 A | 4/2012 |
| JP | 2012-227326 A | 11/2012 |
| JP | 2013-16587 A | 1/2013 |
| JP | 2013-239622 A | 11/2013 |
| TW | 201027724 A1 | 7/2010 |
| TW | 201227934 A1 | 7/2012 |
| WO | WO 2007/103343 A1 | 9/2007 |
| WO | WO 2010/143306 A1 | 12/2010 |
| WO | WO 2011/114502 A1 | 9/2011 |
| WO | WO 2011/114503 A1 | 9/2011 |

OTHER PUBLICATIONS

A. Hubert, et al., "A stacked SONOS technology, up to 4 levels and 6nm crystalline nanowires, with gate-all-around or independent gates (Φ-Flash), suitable for full 3D integration" IEDM, 2009, pp. 637-640.

Hang-Ting Lue, et al., "A Highly Scalable 8-Layer 3D Vertical-Gate (VG) TFT NAND Flash Using Junction-Free Buried Channel BE-SONOS Device" 2010 Symposium on VLSI Technology Digest of Technical Papers, 2010, pp. 131-132.

Office Action mailed Oct. 20, 2015, in Taiwanese Patent Application No. 103123036 (with English Translation).

* cited by examiner

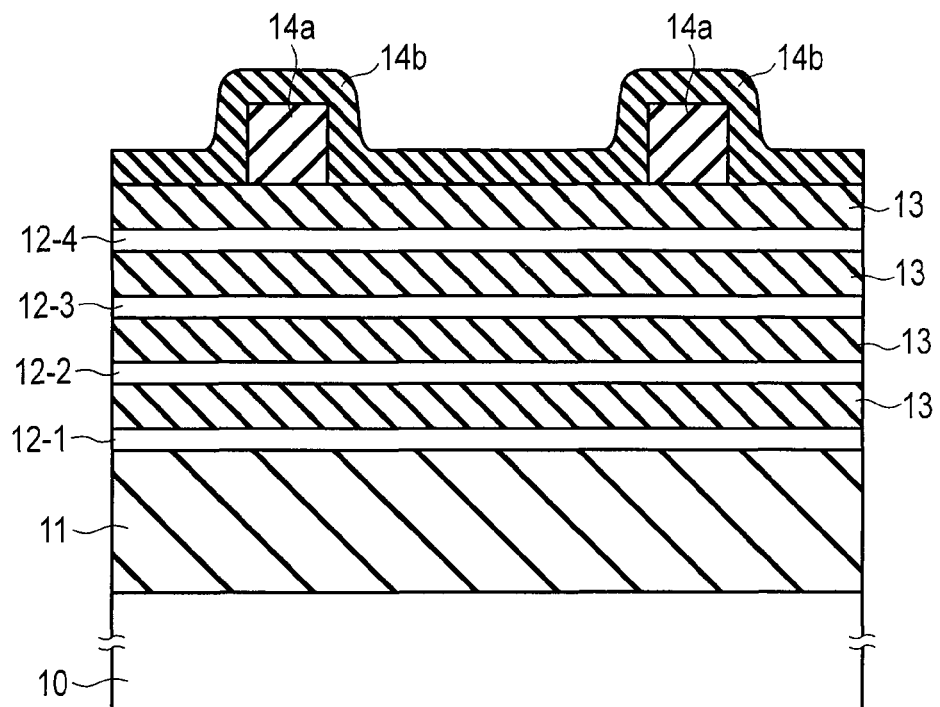
F I G. 7
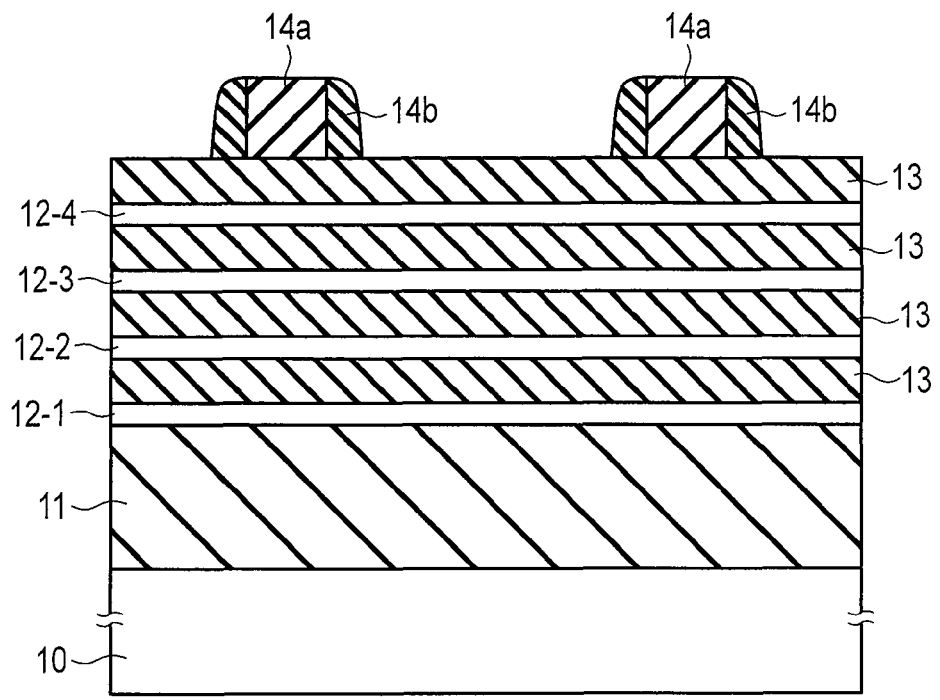
F I G. 8

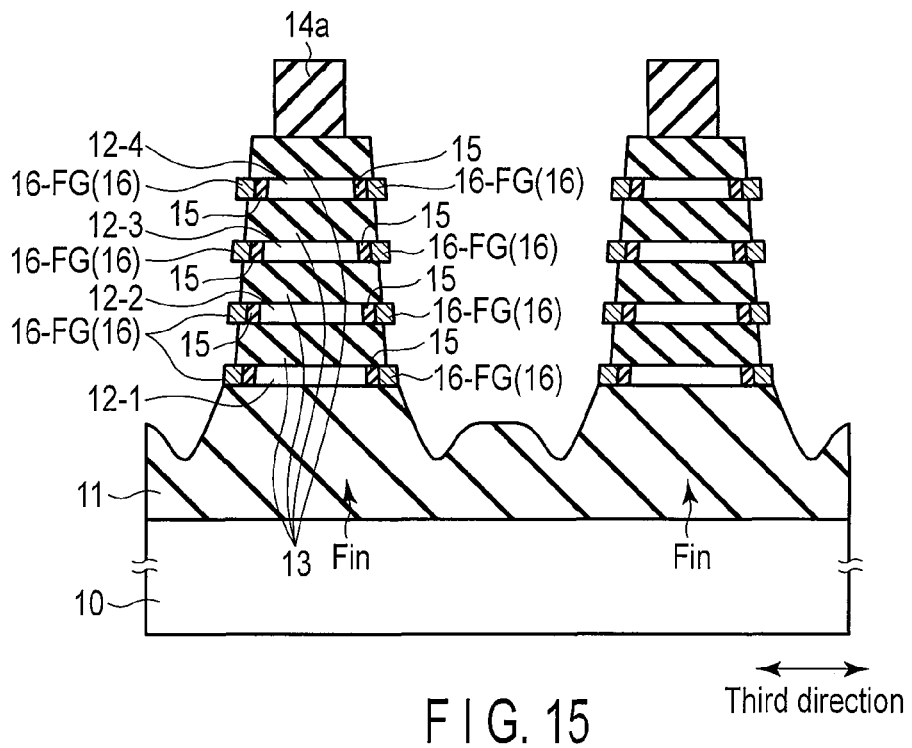
F I G. 15
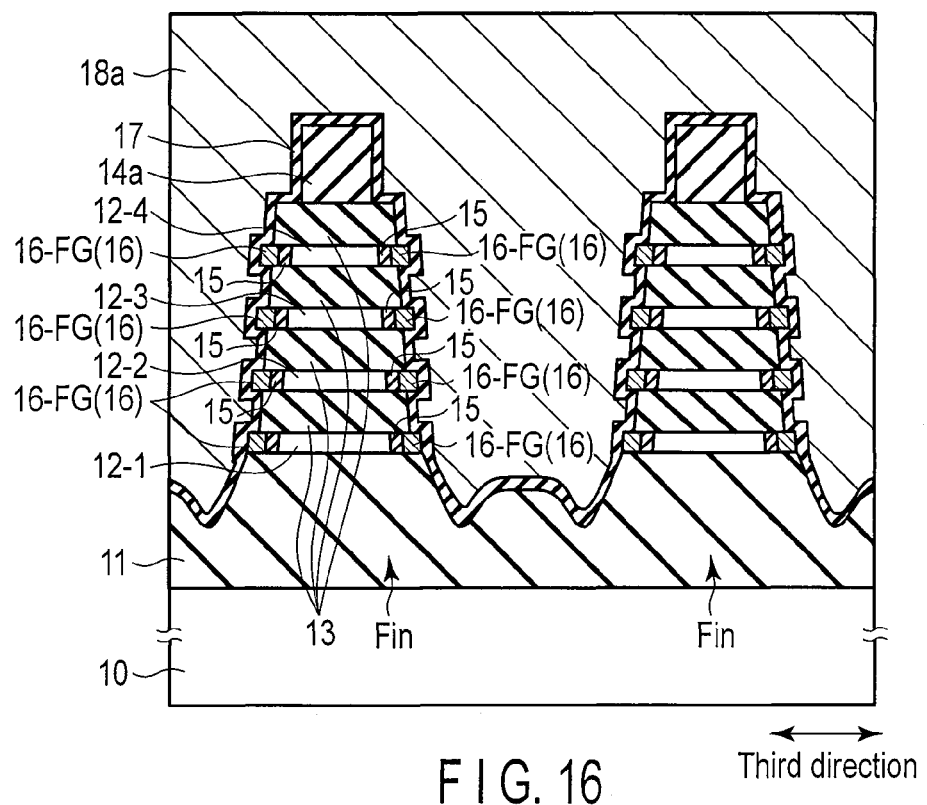
F I G. 16

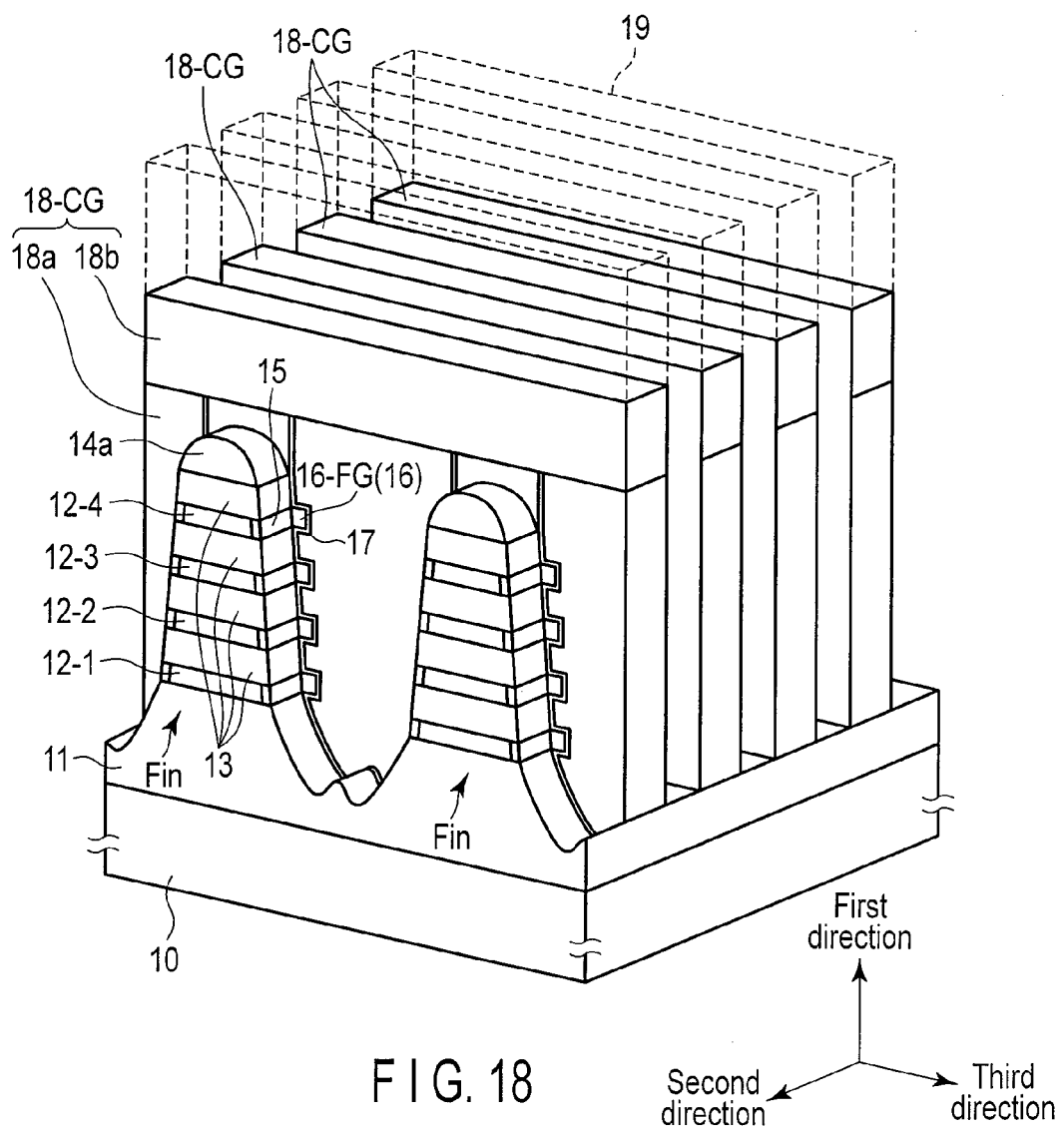
F I G. 18

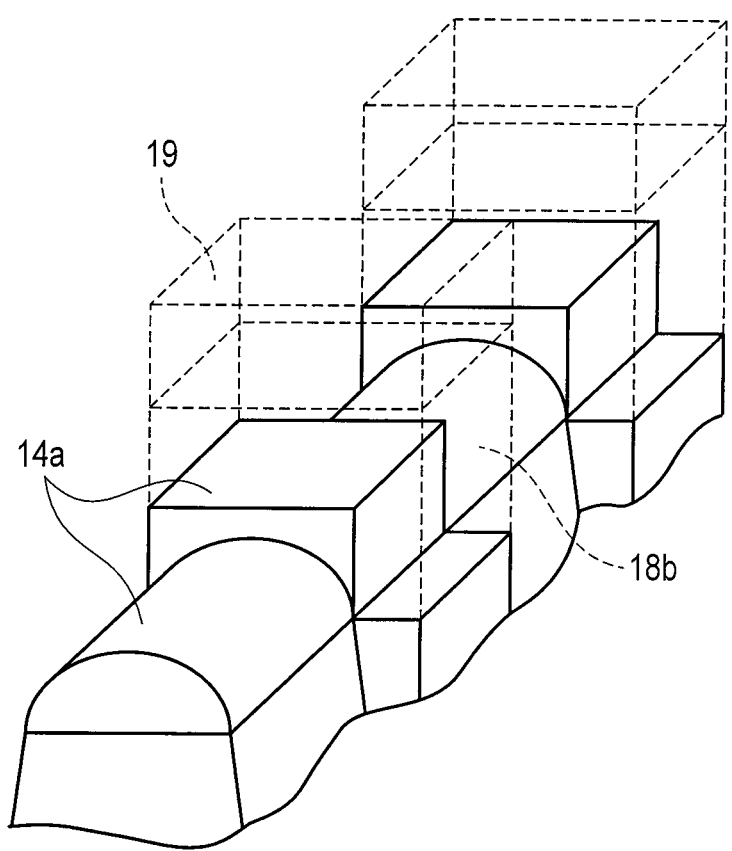
F I G. 20

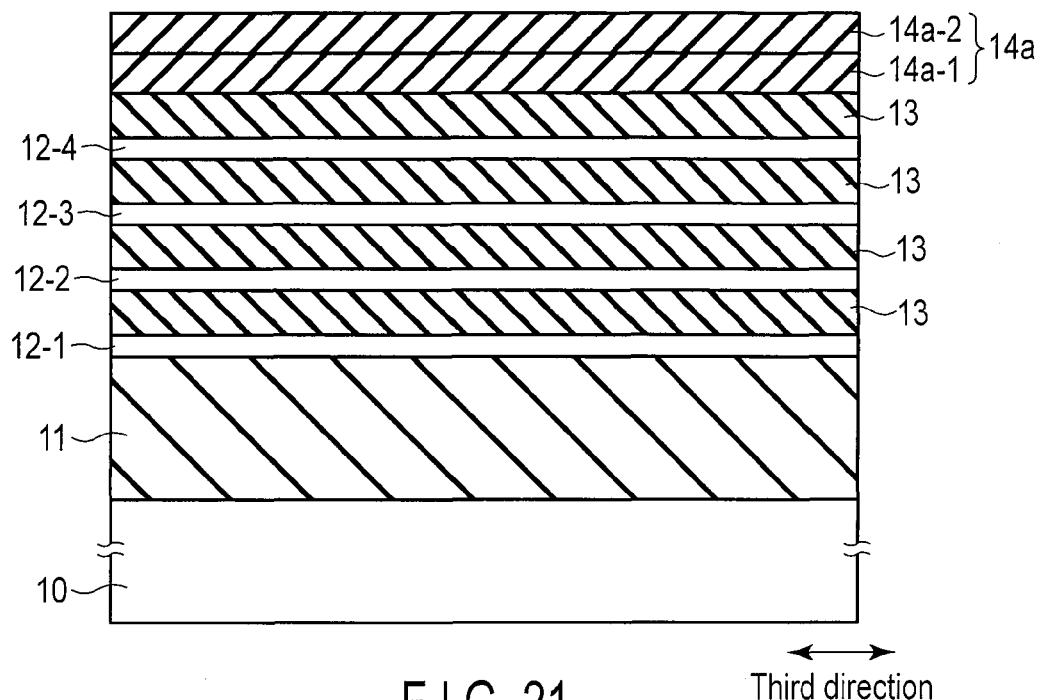
F I G. 21
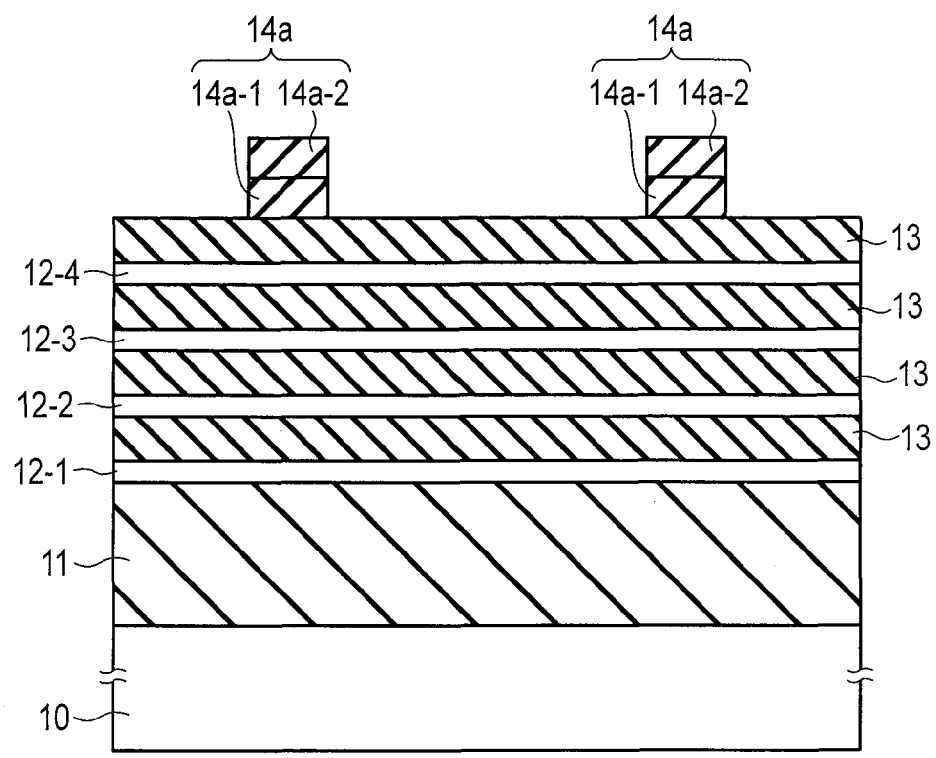
F I G. 22

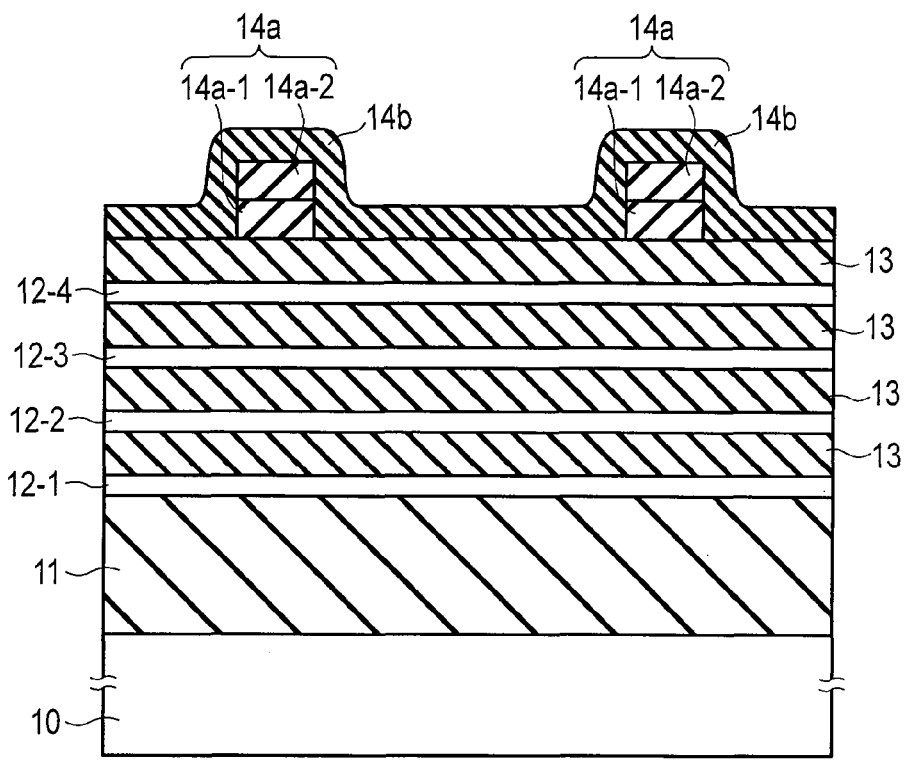
F I G. 23
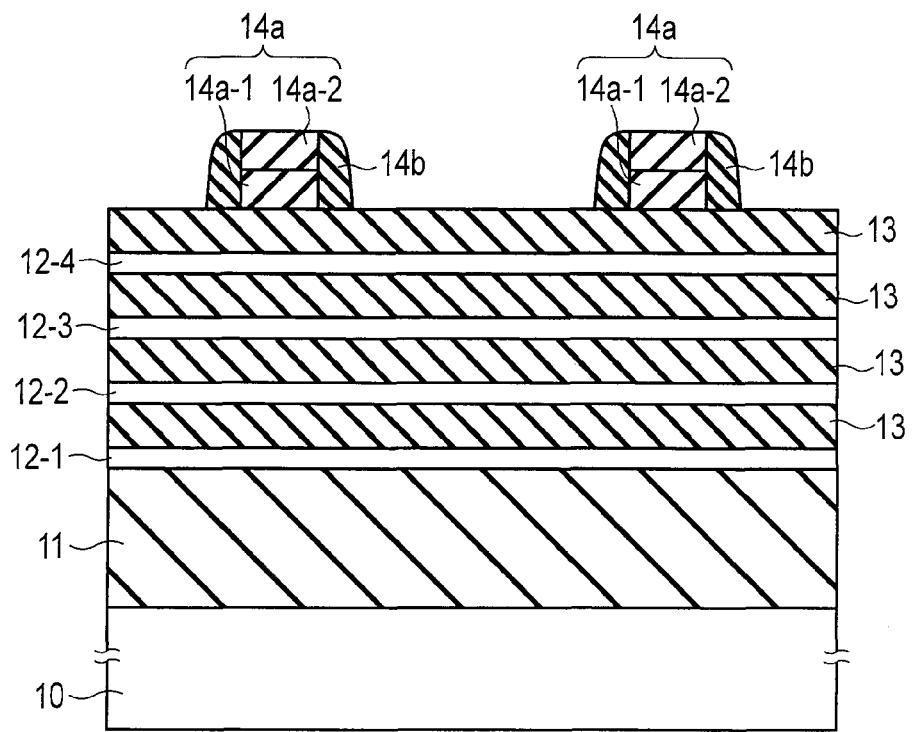
F I G. 24

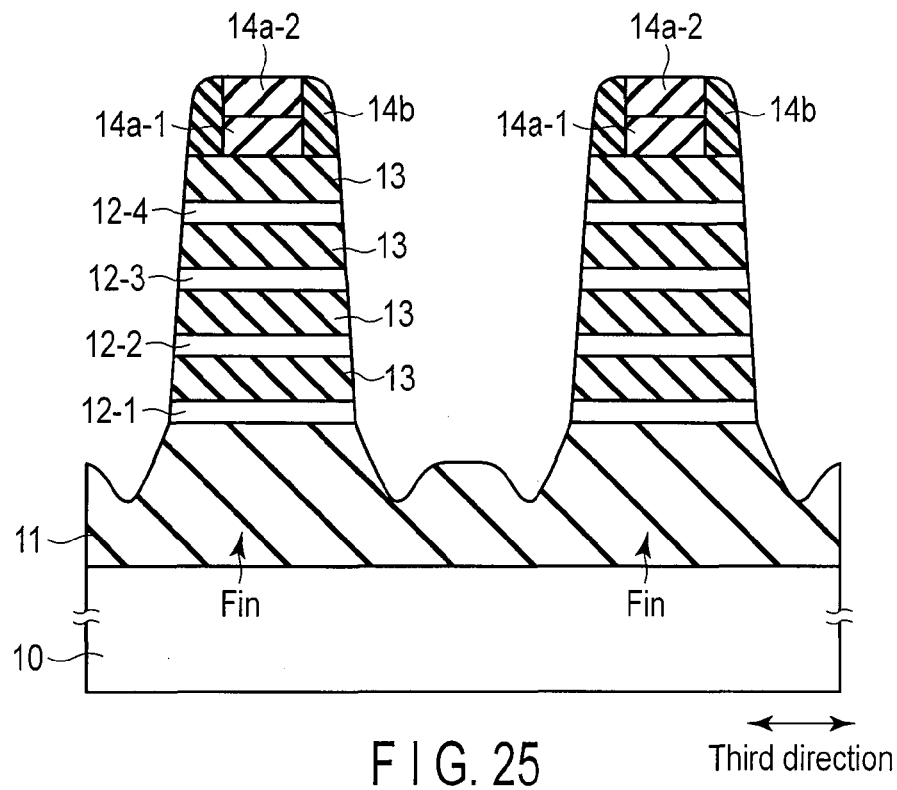
F I G. 25
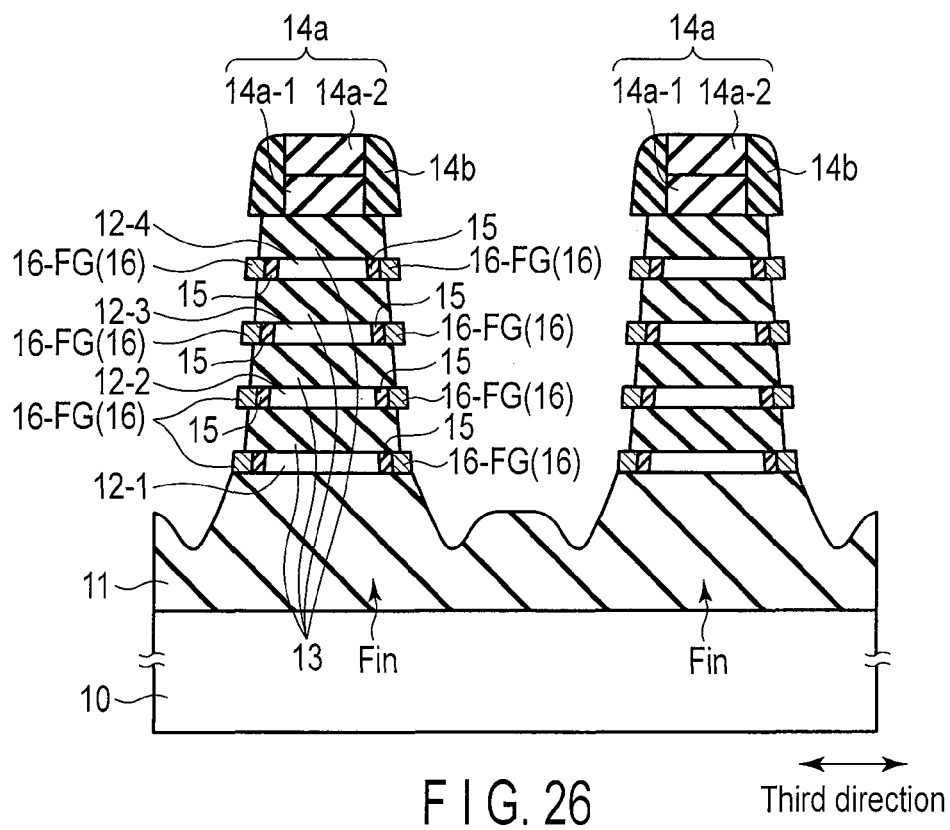
F I G. 26

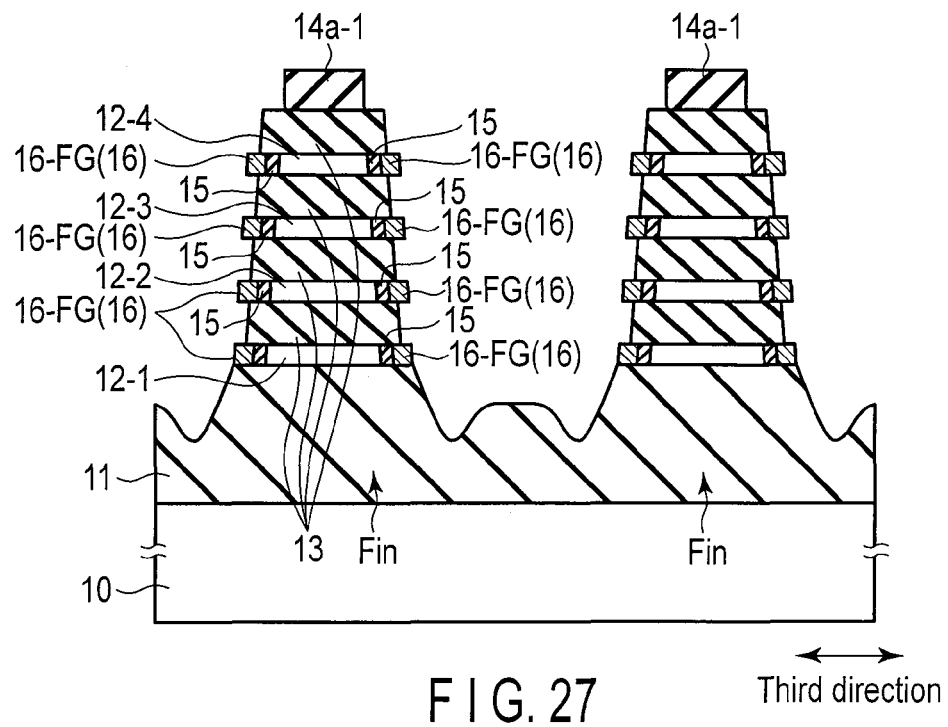
F I G. 27
Third direction
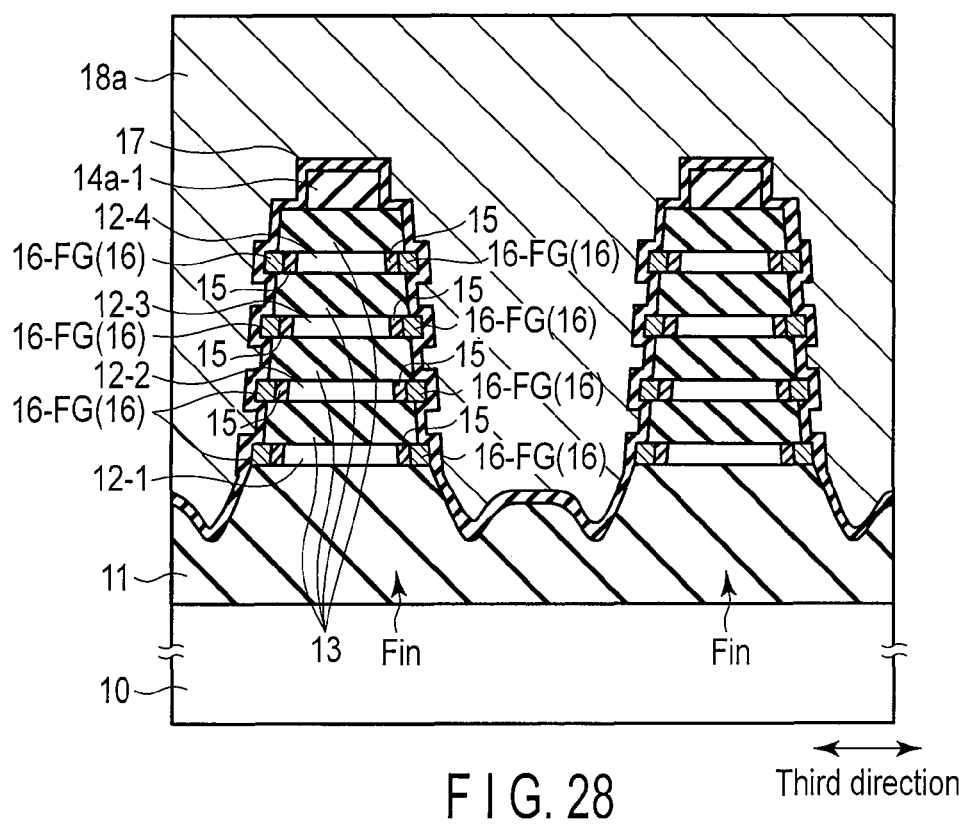
F I G. 28
Third direction

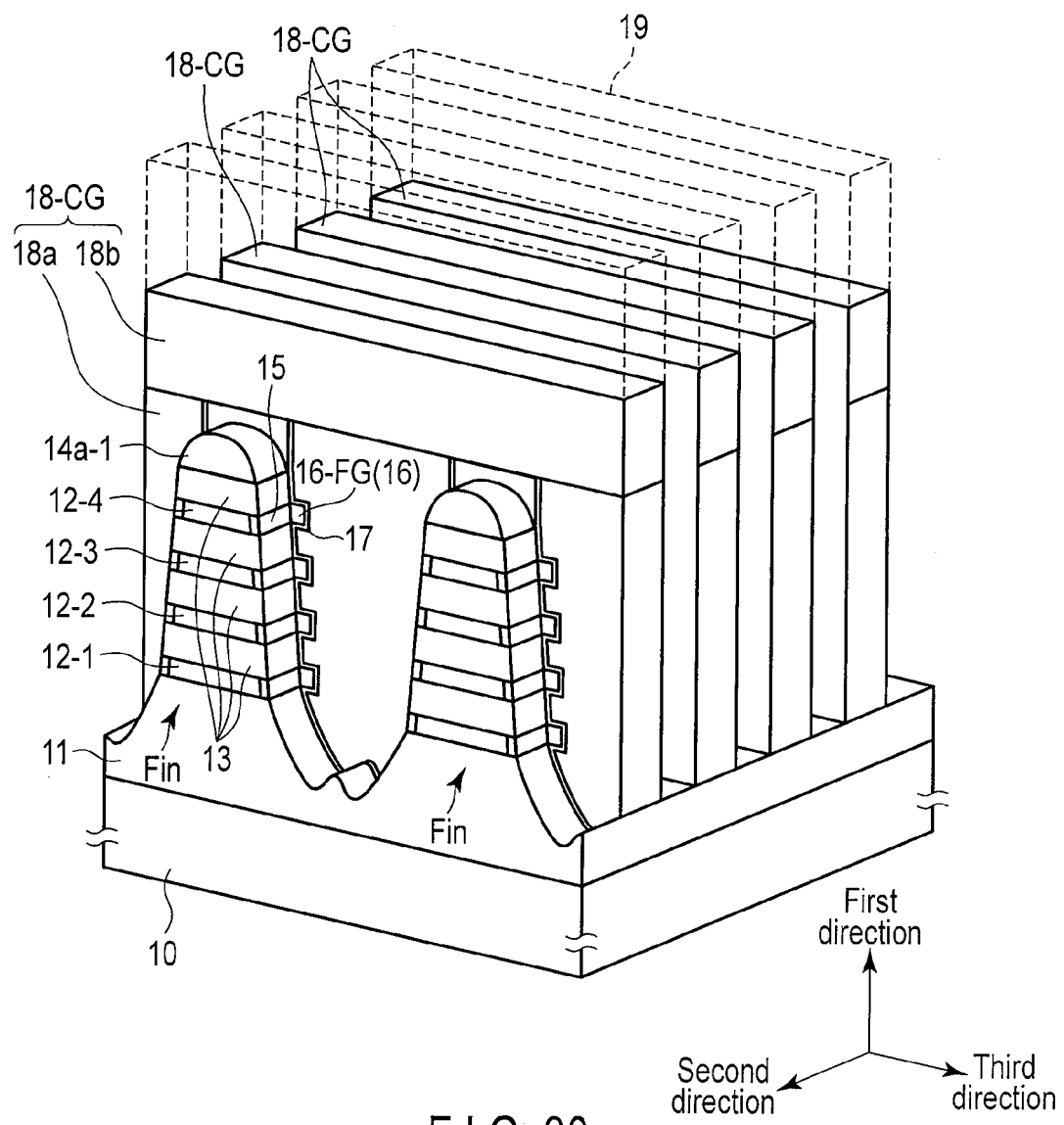
F I G. 30

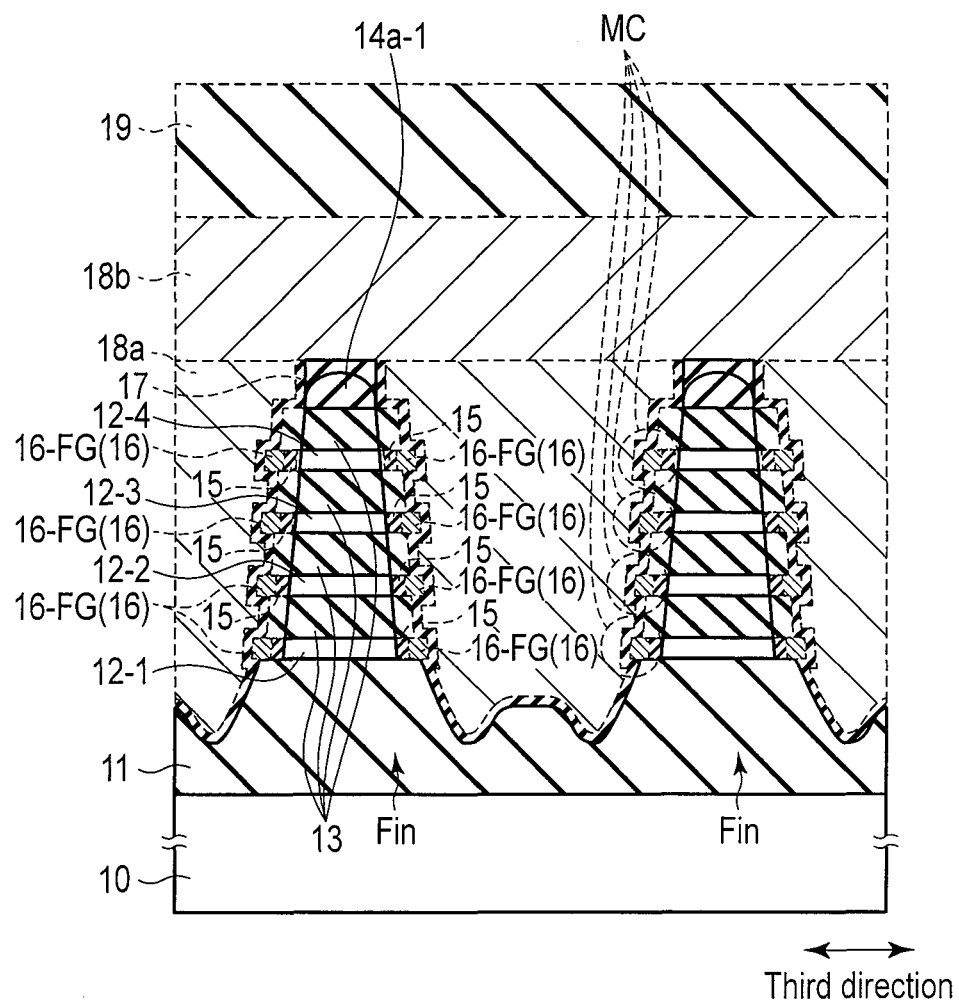
F I G. 31

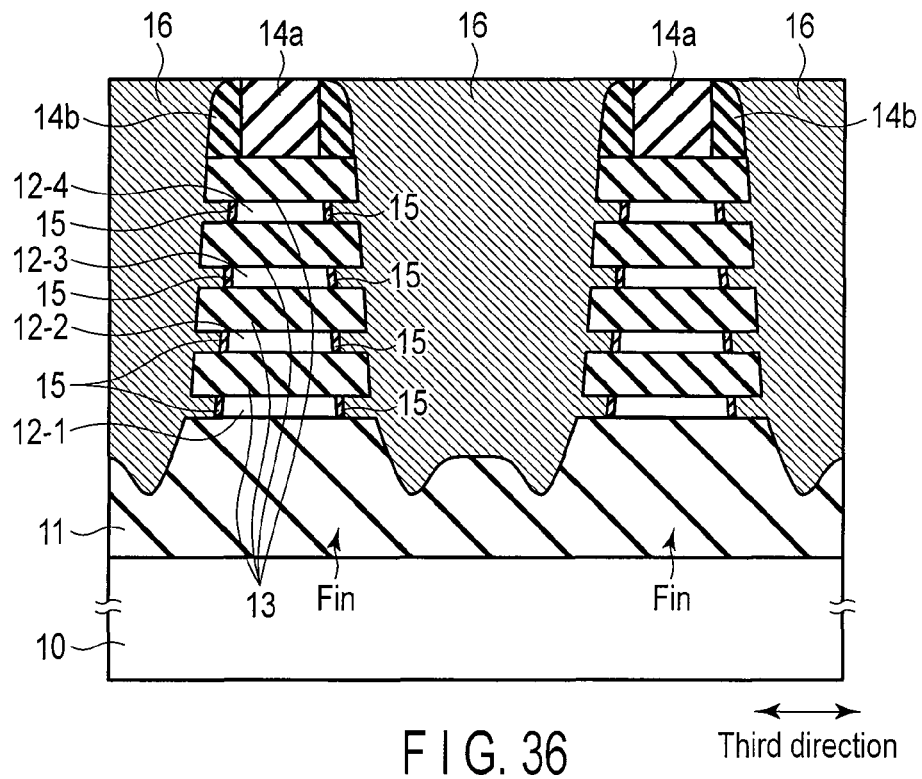
F I G. 36    Third direction
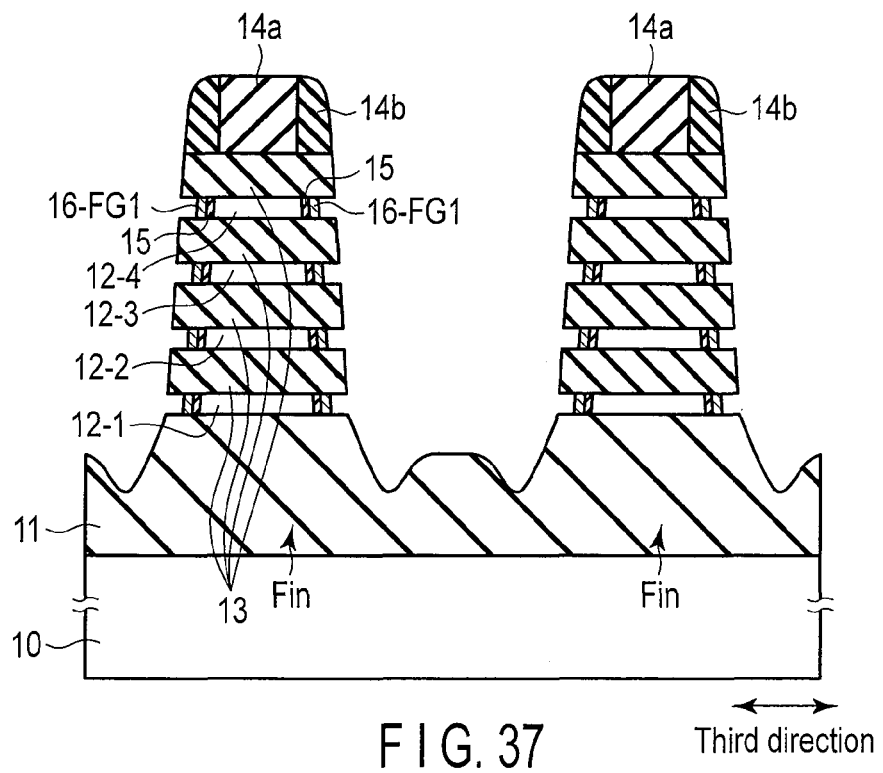
F I G. 37    Third direction

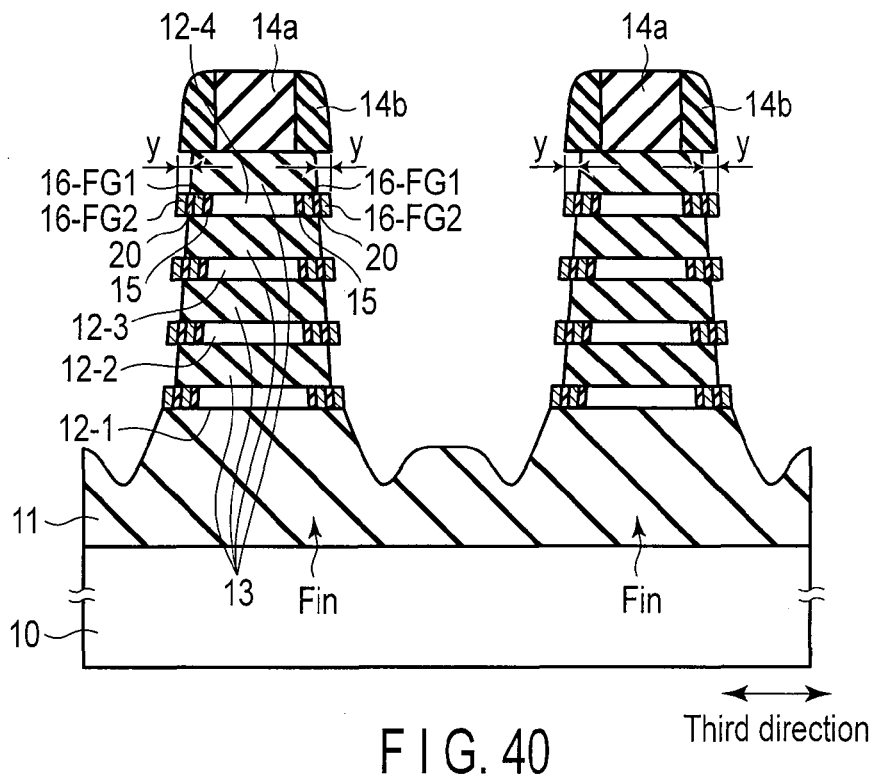
F I G. 40
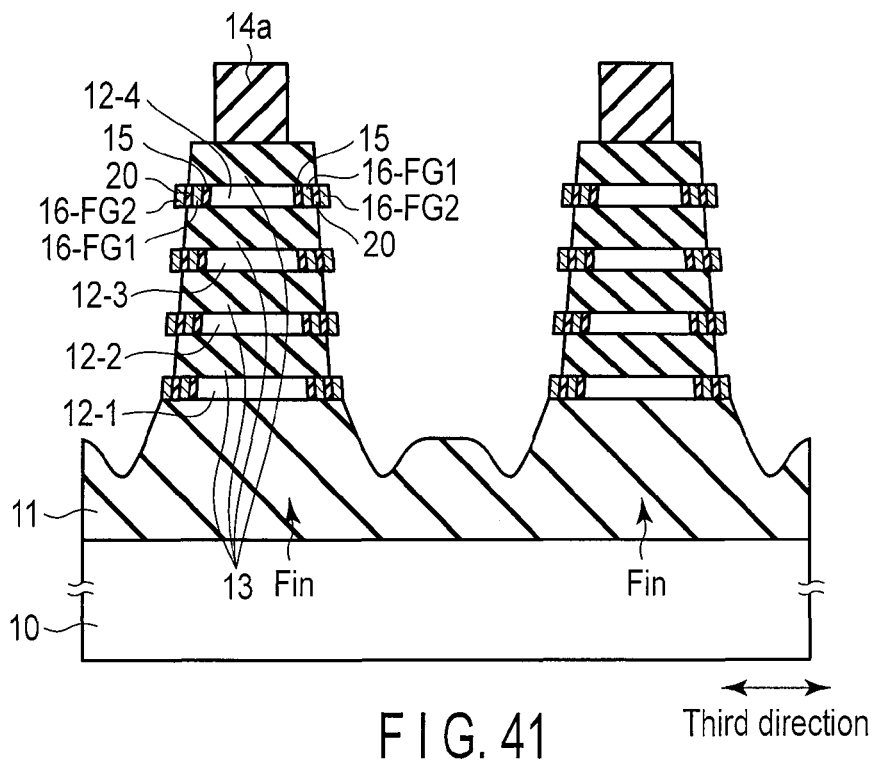
F I G. 41

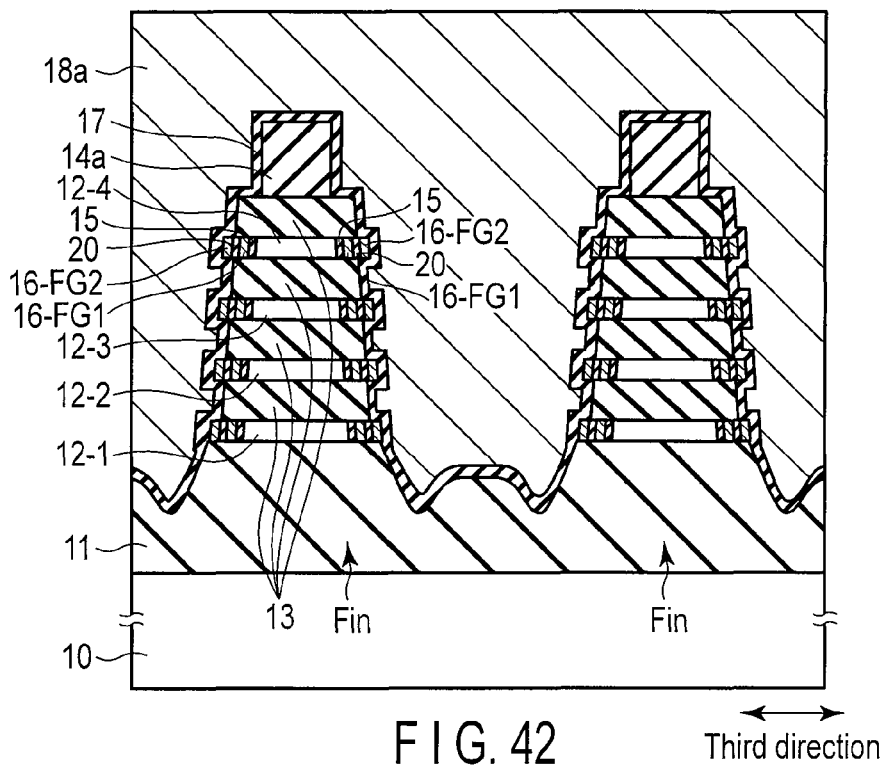
F I G. 42    Third direction
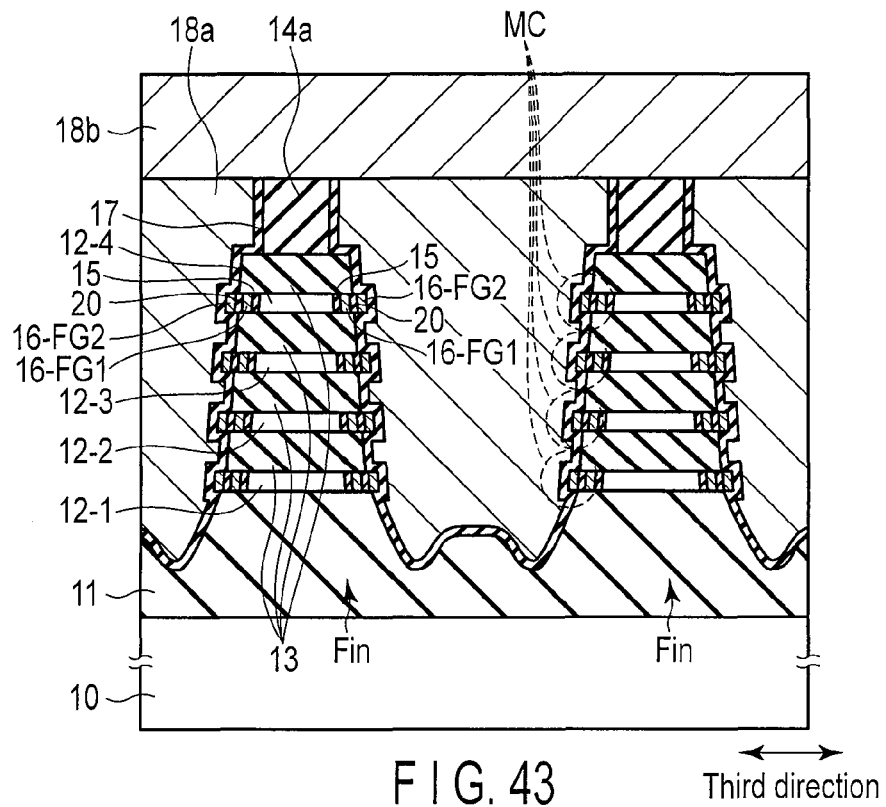
F I G. 43    Third direction

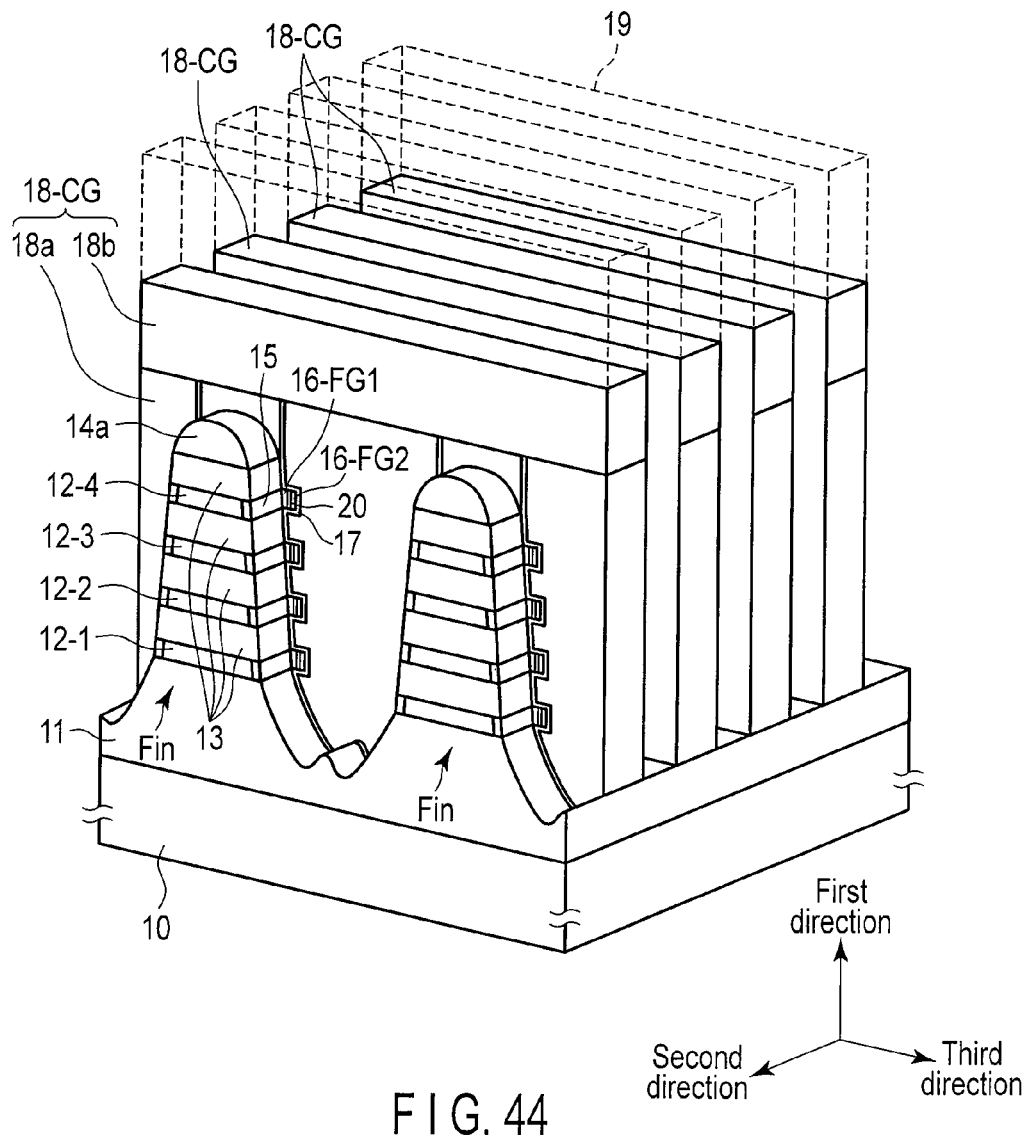
F I G. 44

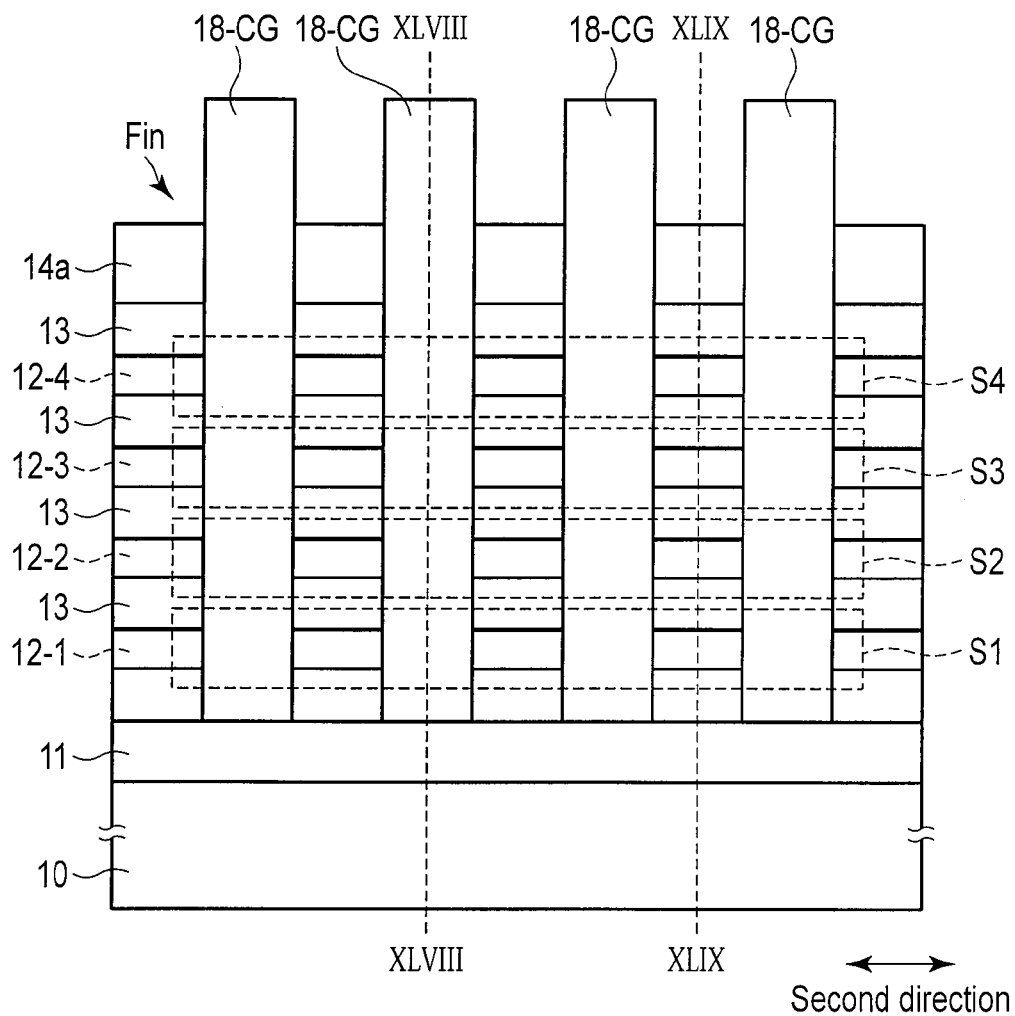
F I G. 47

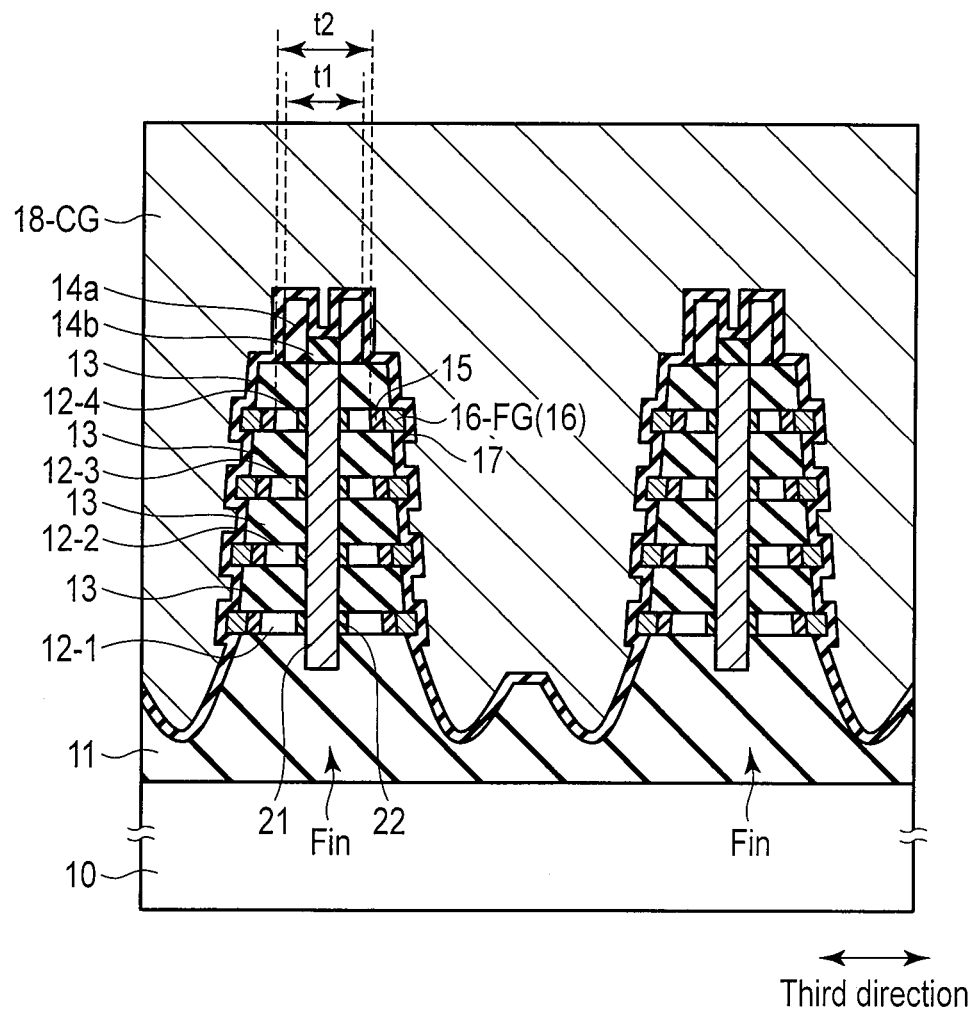
F I G. 48

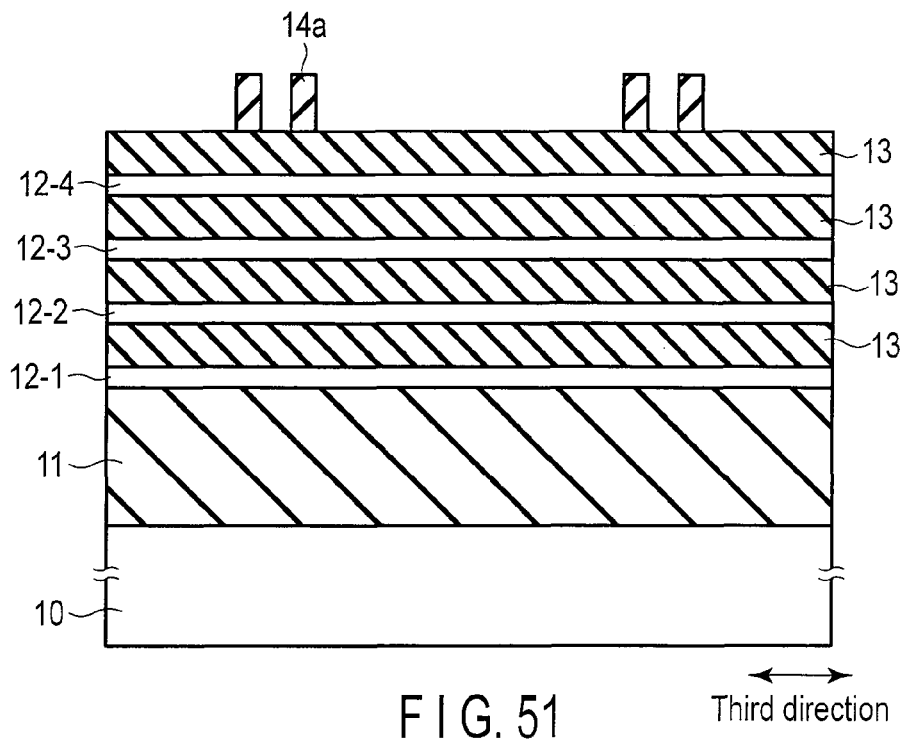
F I G. 51   Third direction
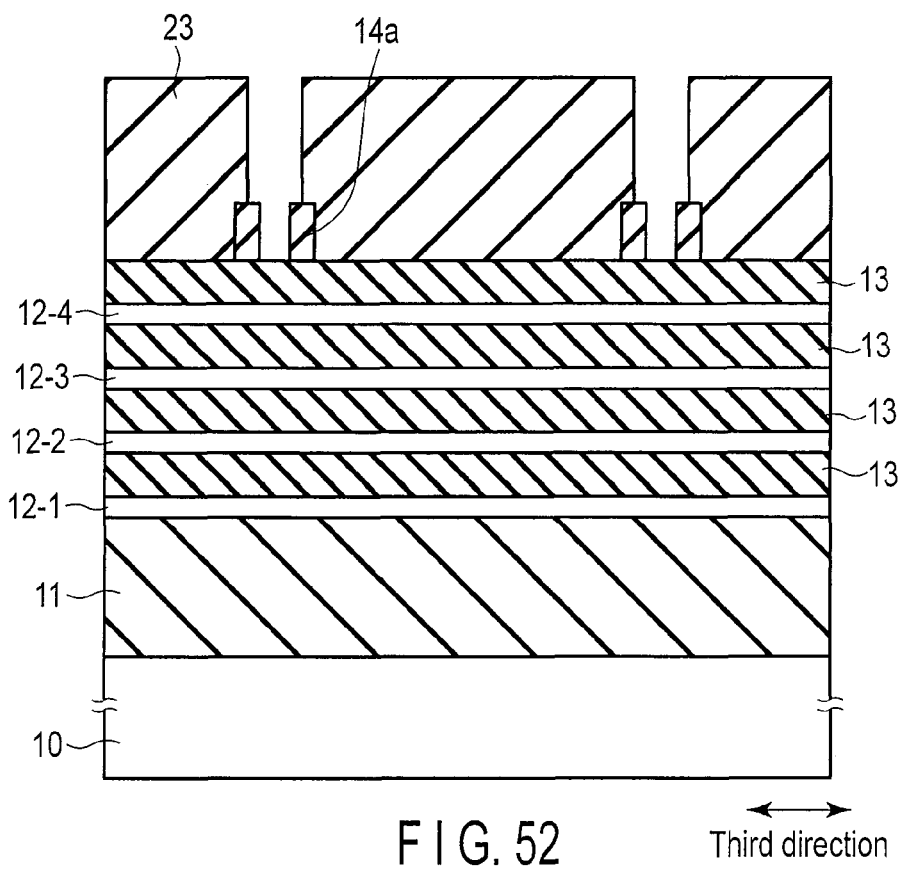
F I G. 52   Third direction

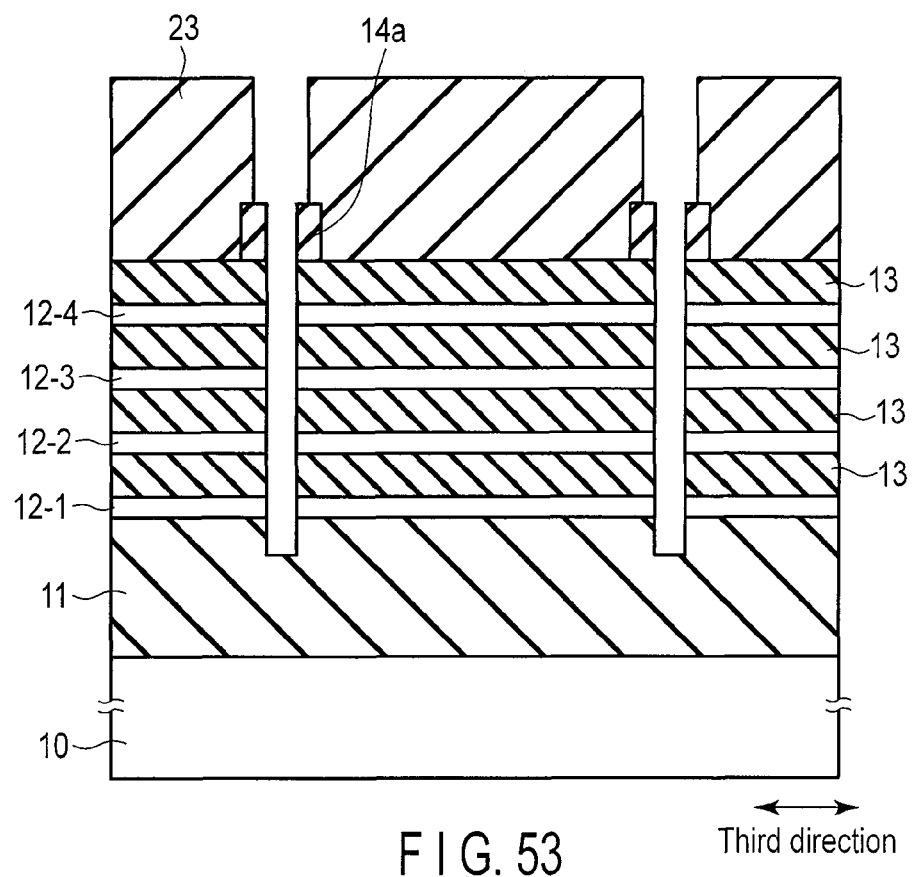
F I G. 53
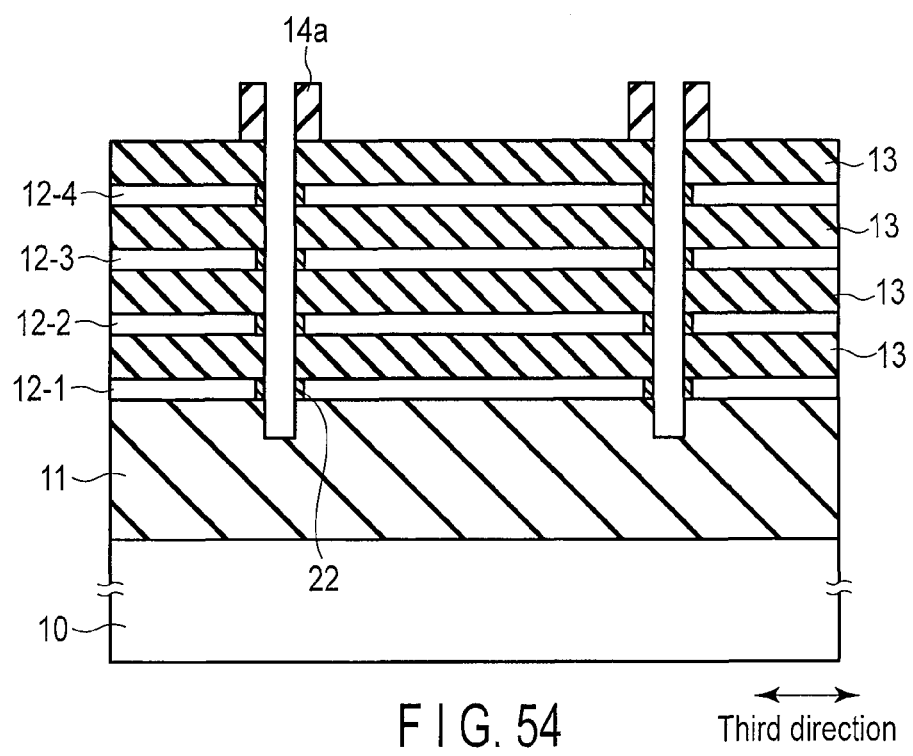
F I G. 54

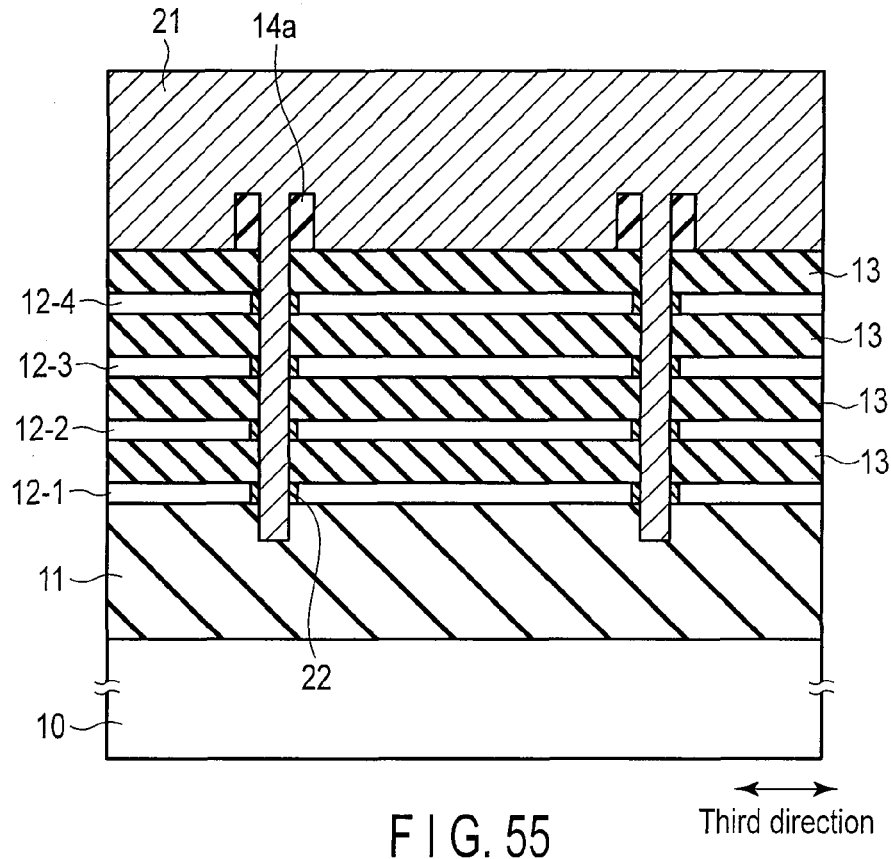
F I G. 55    Third direction
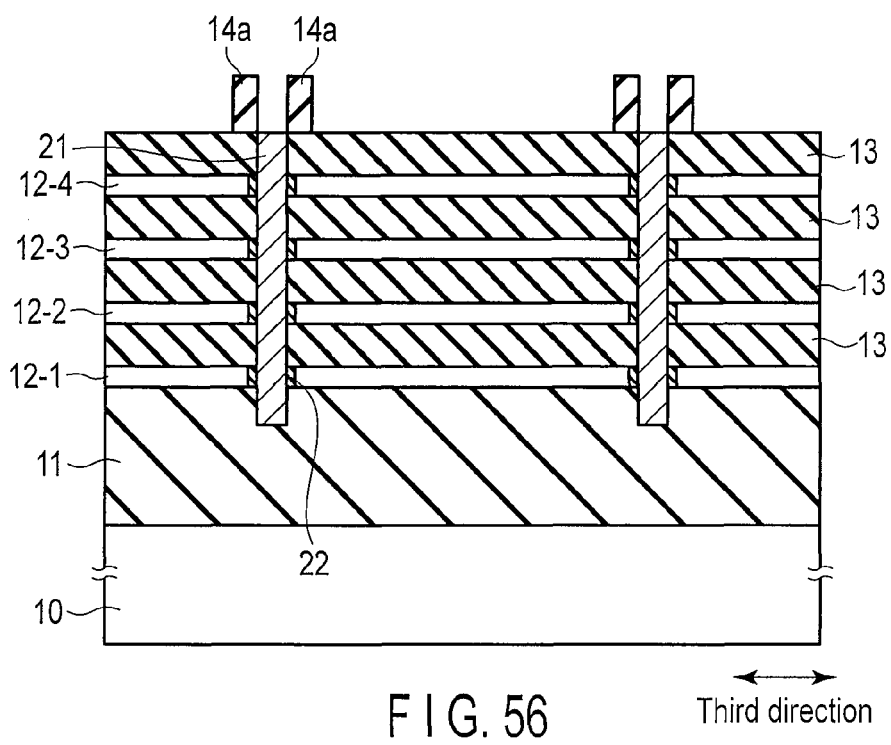
F I G. 56    Third direction

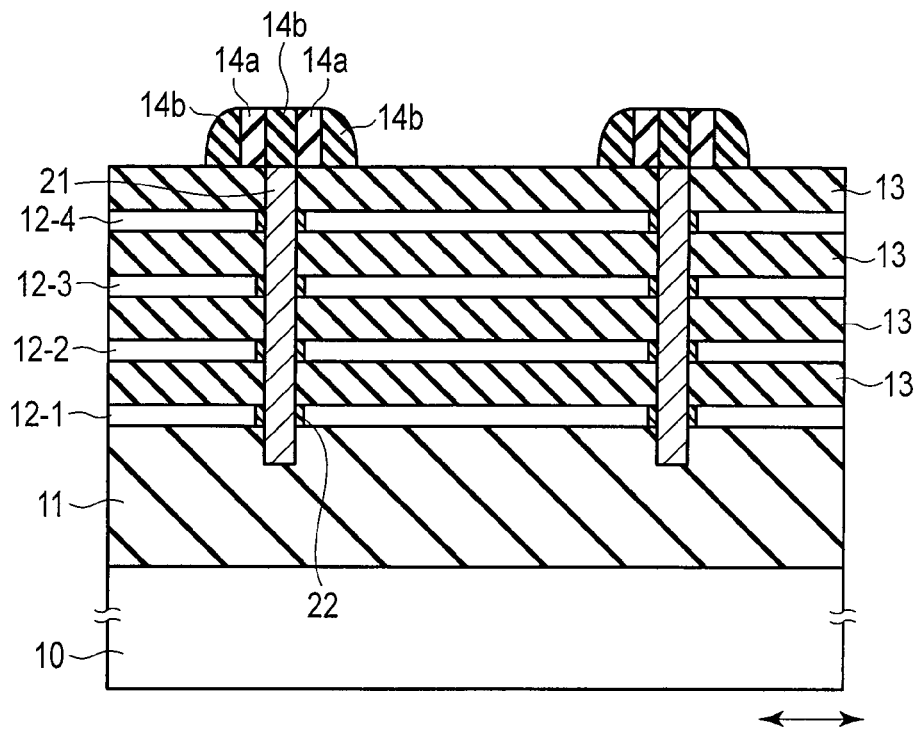
F I G. 57
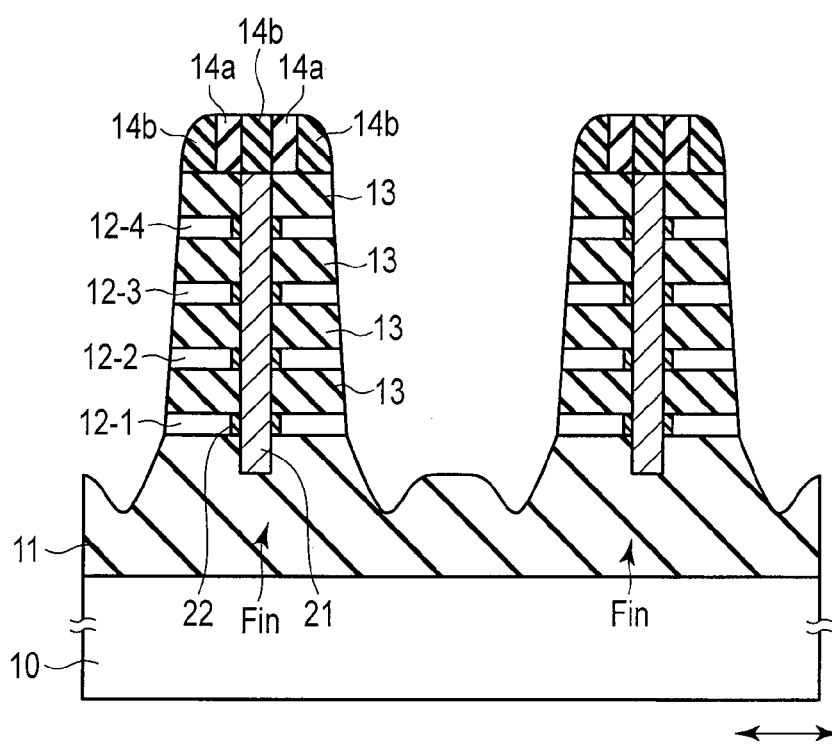
F I G. 58

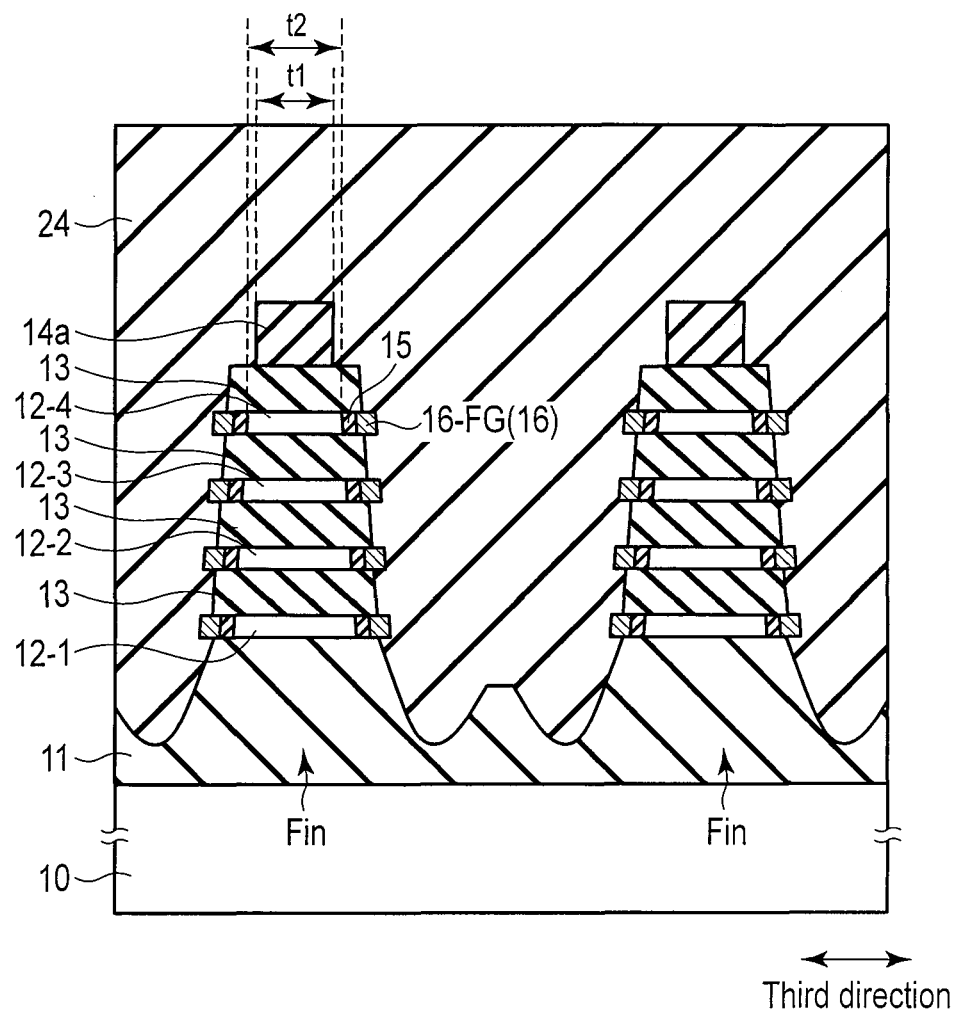
F I G. 62

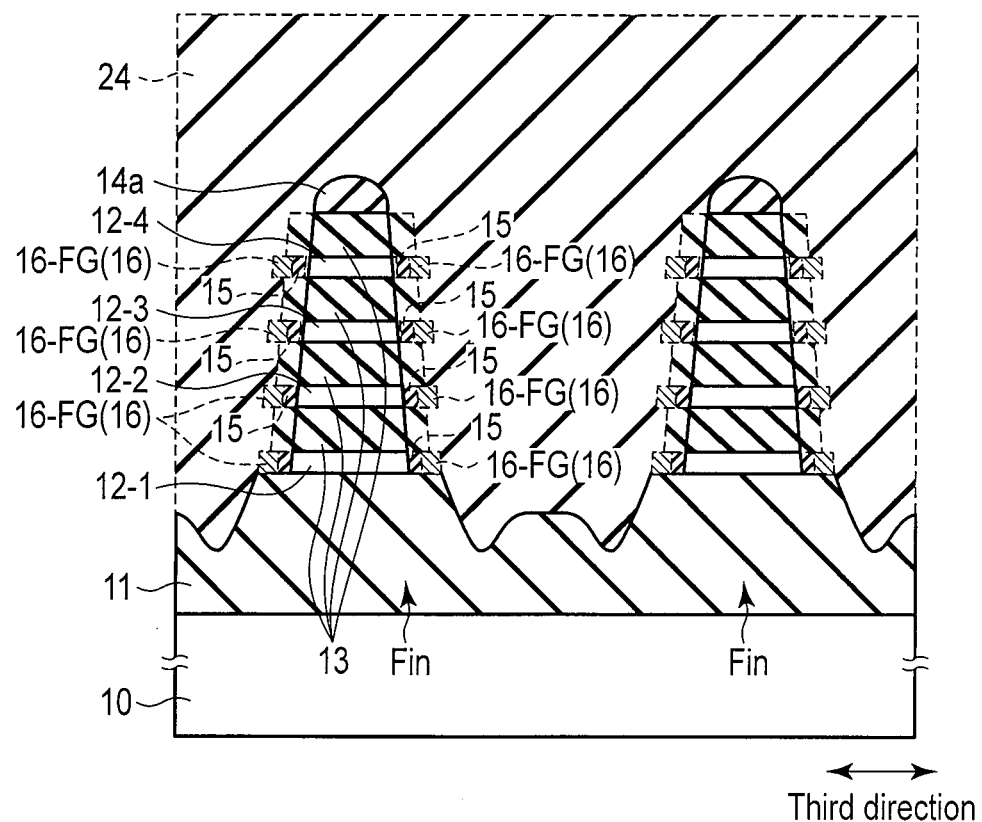
F I G. 67

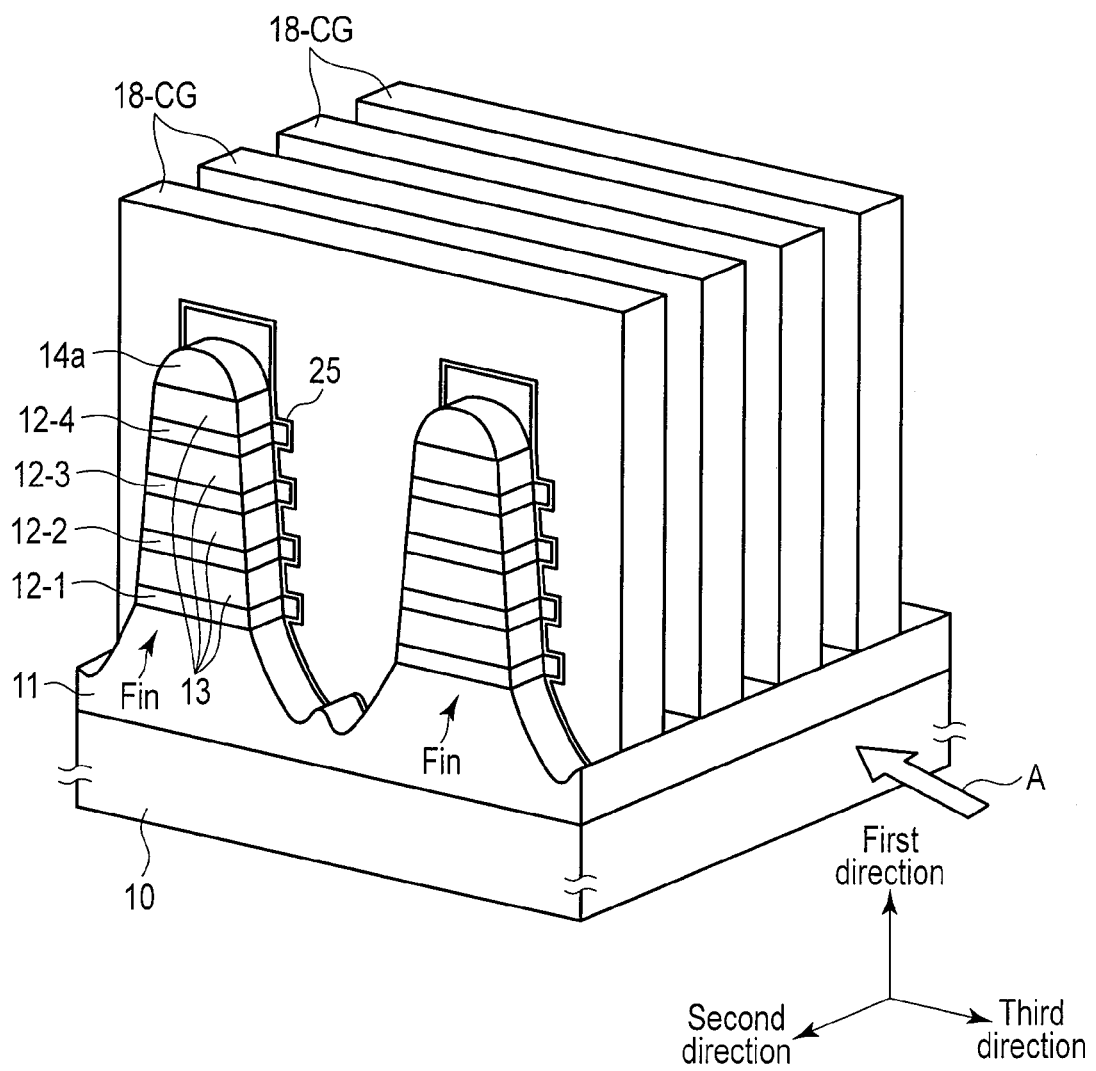
F I G. 69

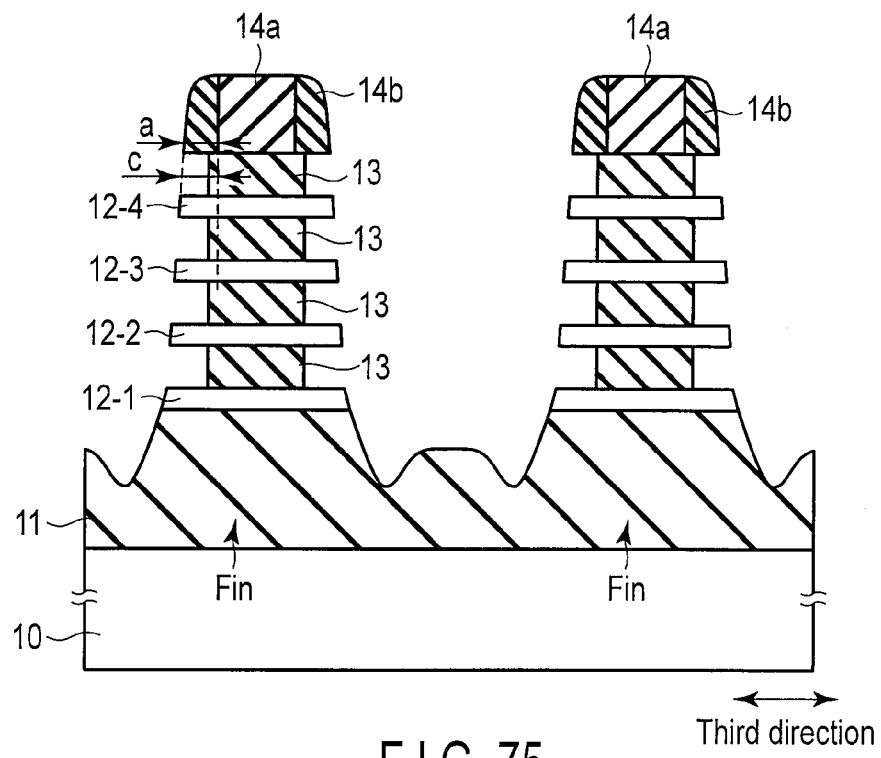
F I G. 75
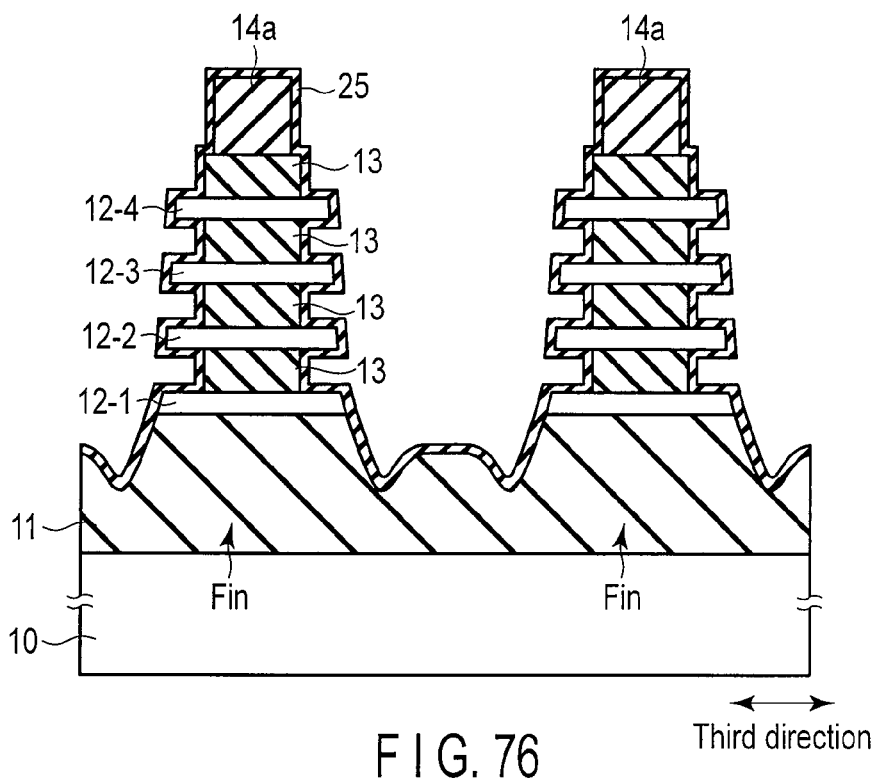
F I G. 76

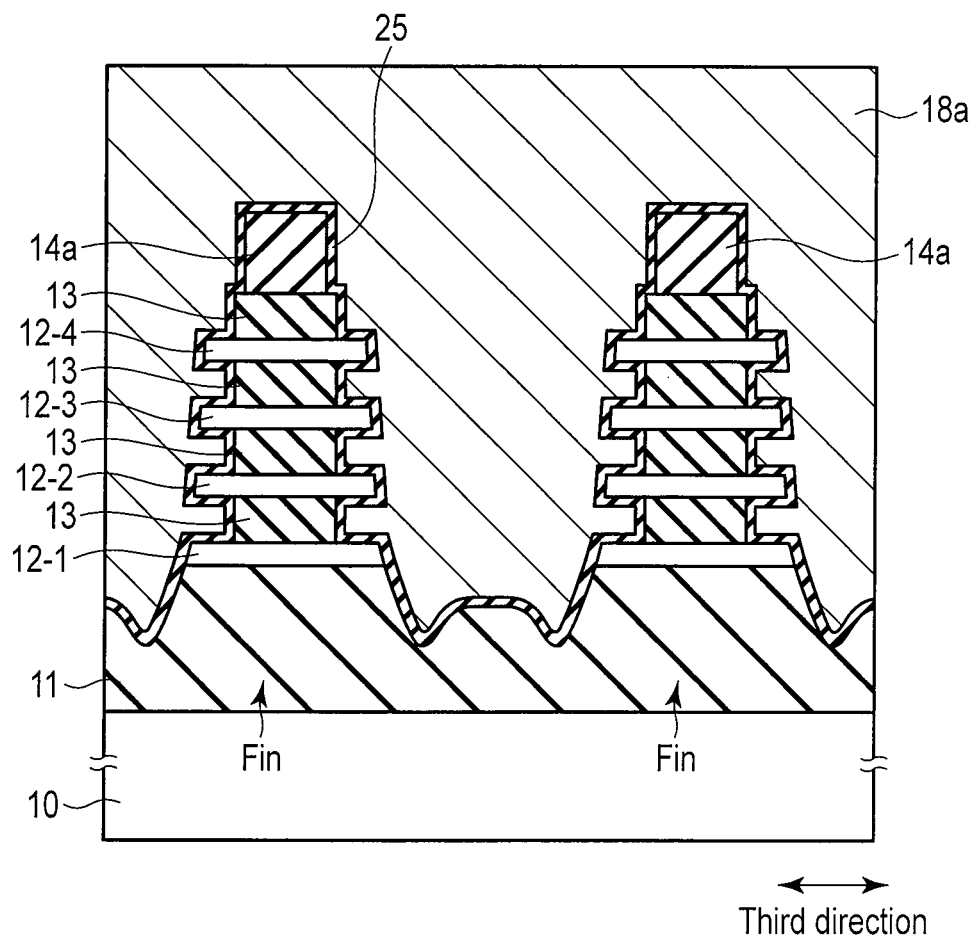
F I G. 77

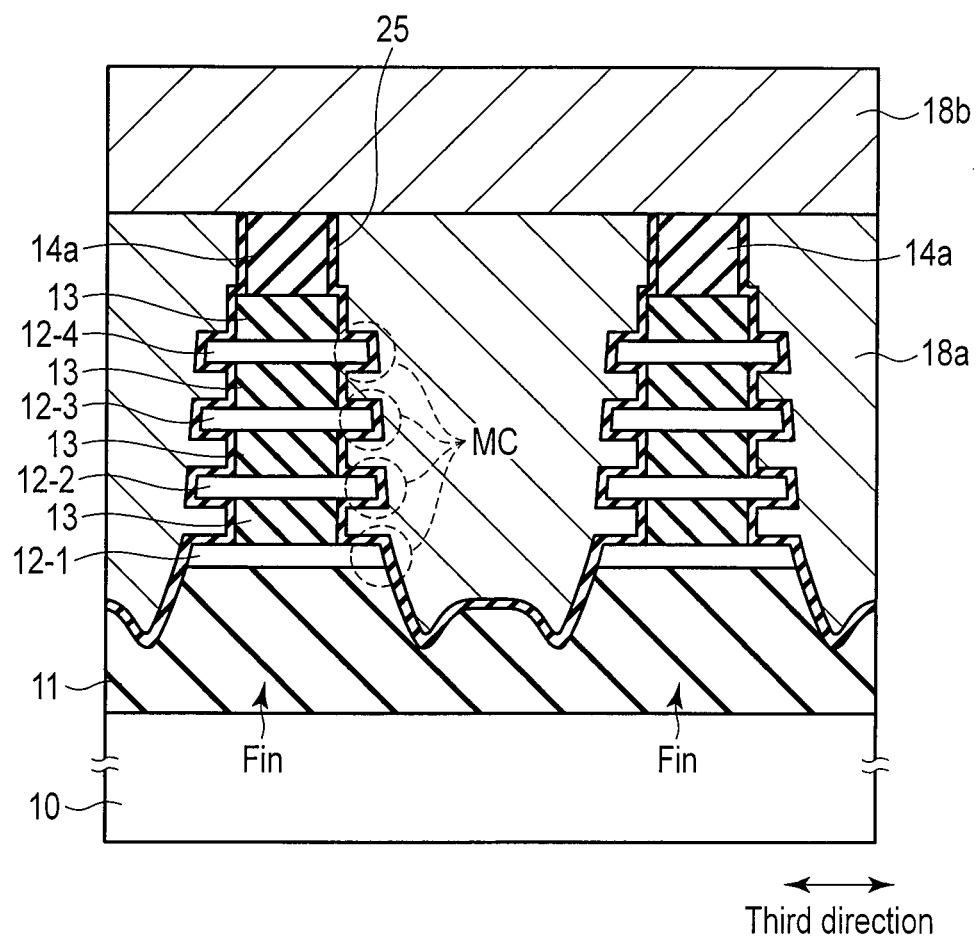
F I G. 78

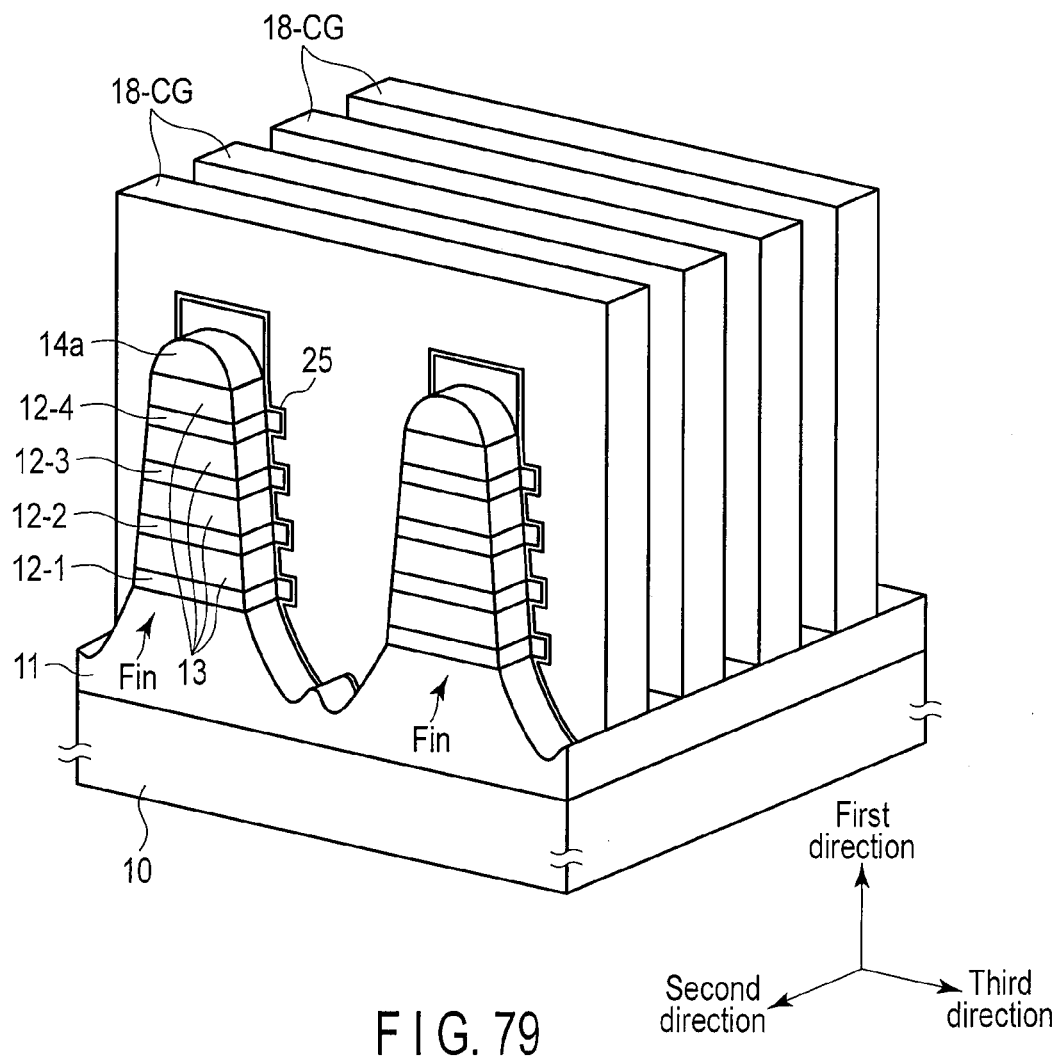
F I G. 79

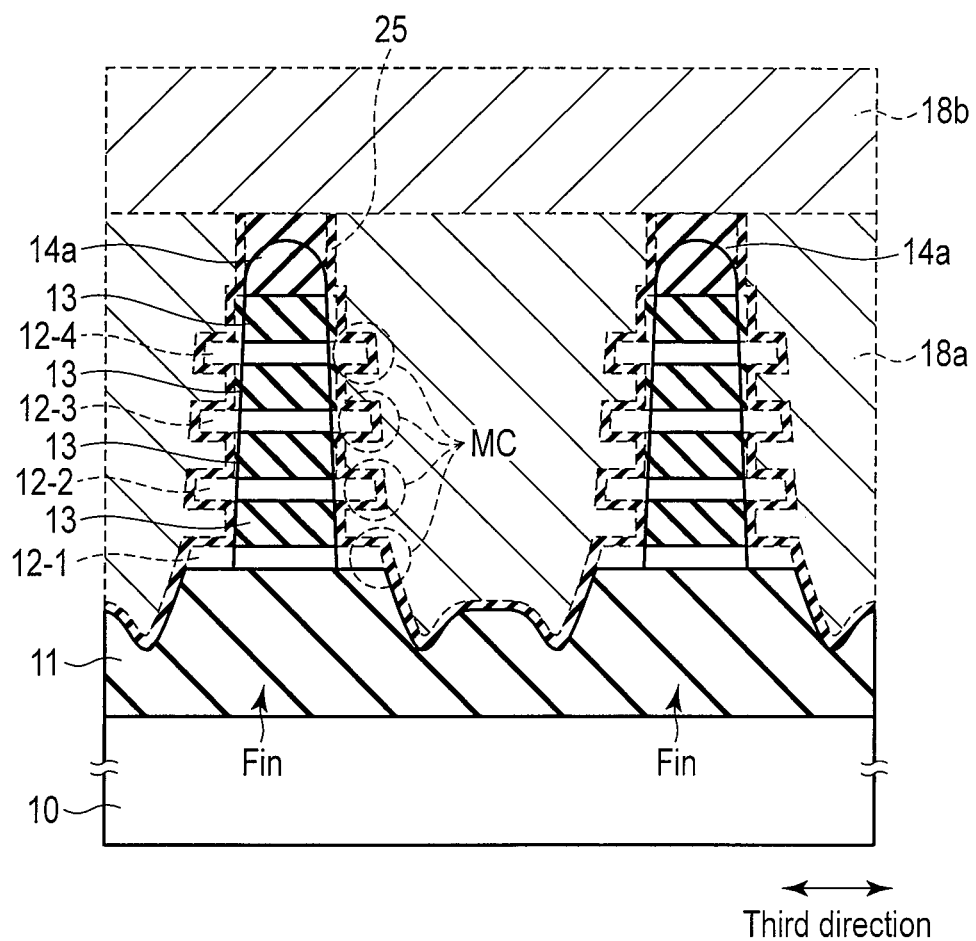
F I G. 80

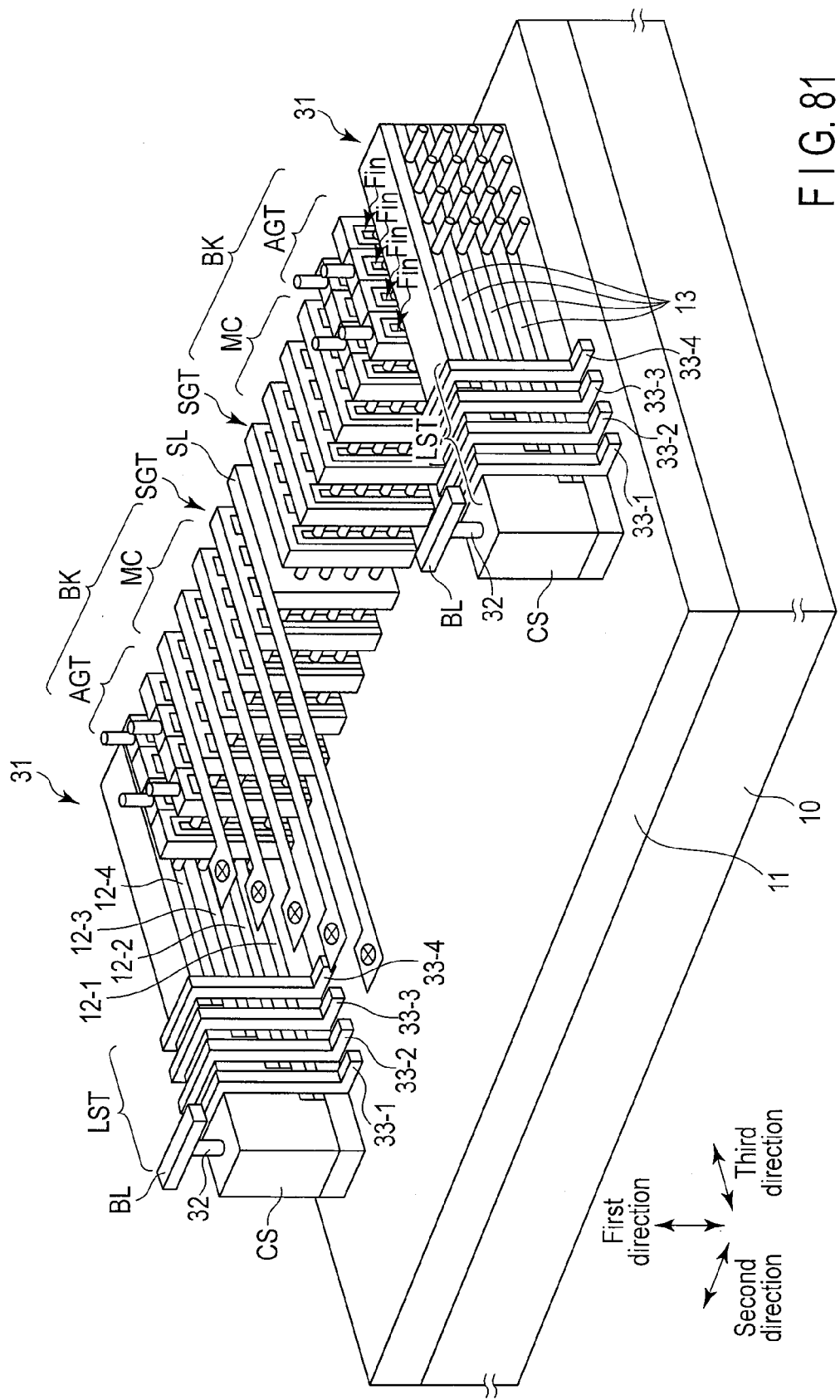
F I G. 81

NONVOLATILE SEMICONDUCTOR MEMORY DEVICE AND METHOD OF MANUFACTURING THE SAME

CROSS-REFERENCE TO RELATED APPLICATIONS

This application is a division of and claims the benefit of priority under 35 U.S.C. §120 from U.S. Ser. No. 14/321,994 filed Jul. 2, 2014, and claims the benefit of priority under 35 U.S.C. §119 from Japanese Patent Application No. 2013-139685 filed Jul. 3, 2013, the entire contents of each of which are incorporated herein by reference.

FIELD

Embodiments described herein relate generally to a nonvolatile semiconductor memory device and a method of manufacturing the same.

BACKGROUND

NAND flash memories are used widely as mass storage memory devices. In recent years, memory devices have been miniaturized for cost reduction and increased capacity per bit, and further miniaturization is a great demand in this technical field. However, before proceeding miniaturization of flash memories, there are many issues to be solved such as development of lithography techniques and inhibition of short channel effect, interdevice interference, and interdevice variations. Thus, a miniaturization technique simply directed to improvement of a plane structure will not be enough to sustainably increase storage density of memory devices in future.

Considering the above, techniques to shift such a conventional two-dimensional (plane) structure to a three-dimensional (solid) structure have been developed in recent years for higher memory cell integration, and various kinds of three-dimensional nonvolatile semiconductor storage devices have been proposed. One of them is a vertical gate (VG) semiconductor memory structure which includes a fin with stacked semiconductor layers (active areas) on each of which a NAND string is arranged.

The VG semiconductor memory structure has a layout substantially similar to that of a two-dimensional NAND including peripheral devices and the like, and contacts corresponding to the semiconductor layers and gate contacts can be formed therein at the same time.

The VG semiconductor memory structure can be classified broadly into two types by its memory cell structure. One is a vertical gate-floating gate (VG-FG) type in which charge storage layers are electrically floating, and the other is a vertical gate-metal/oxide/nitride/oxide/silicon (VG-MONOS) type in which charge storage layers trap the charge.

In the VG-FG type, the charge storage layer must be provided independently memory cell by memory cell for proper function of the memory device. In the VG-MONOS type, the charge storage layer must be separated memory cell by memory cell, especially, in the direction of extension of the NAND string (extension of the fin) for improved performance of the memory device.

Considering these points, the separation of the charge storage layer in the direction of extension of the NAND string is performed at the same time when the control gate is patterned into lines and spaces using a hard mask preliminarily formed on the fin as a mask.

However, the hard mask is also used to process the fin. Thus, the width of the hard mask must be shrunk to an optimal value necessary for self-aligned separation of the charge storage layer after the fin is processed but before the control gate is patterned into lines and spaces.

Such a hard mask shrink is performed by isotropic etching and conventionally, there has been a problem that the initial thickness of the hard mask must be large enough before the etching. The hard mask whose thickness is large enough becomes a part of the fin (the uppermost layer) and enlarges the height of the fin. Thus, the aspect ratio of a trench between adjacent fins is enlarged and consequently, the degree of difficulty in forming memory cells on each semiconductor layer increases.

Furthermore, the controllability is not good in the hard mask shrink by isotropic etching. In that case, a process margin in separating the charge storage layer, that is, the amount of shrink must be preset relatively large. Due to this process margin, the width of the fin between the control gates becomes partly very narrow. To prevent this, the initial width of the fins must be set wide (which is disadvantageous to the miniaturization purpose). They are problems in this technical field, too.

BRIEF DESCRIPTION OF THE DRAWINGS

FIGS. 5 to 20 are cross-sectional views indicating a first example of manufacturing method of the structure of FIGS. 1 to 4;
FIGS. 21 to 31 are cross-sectional views indicating a second example of manufacturing method of the structure of FIGS. 1 to 4;
FIGS. 36 to 45 are cross-sectional views indicating a manufacturing method of the structure of FIGS. 32 to 35;
FIG. 47 is a side view seen along arrow A in FIG. 46;
FIG. 48 is a cross-sectional view taken along line XLVIII-XLVIII in FIG. 47;
FIGS. 50 to 58 are cross-sectional views indicating a manufacturing method of the structure of FIGS. 46 to 49;
FIG. 62 is a cross-sectional view taken along line LXII-LXII in FIG. 61;
FIGS. 64 to 68 are cross-sectional views showing a manufacturing method of the structure of FIGS. 59 to 63;
FIG. 69 is a perspective view showing a fifth embodiment.

FIGS. 74 to 80 are cross-sectional views indicating a manufacturing method of the structure of FIGS. 69 to 72; and FIG. 81 is a perspective view showing VLB as an application example.

DETAILED DESCRIPTION

Figure 1:
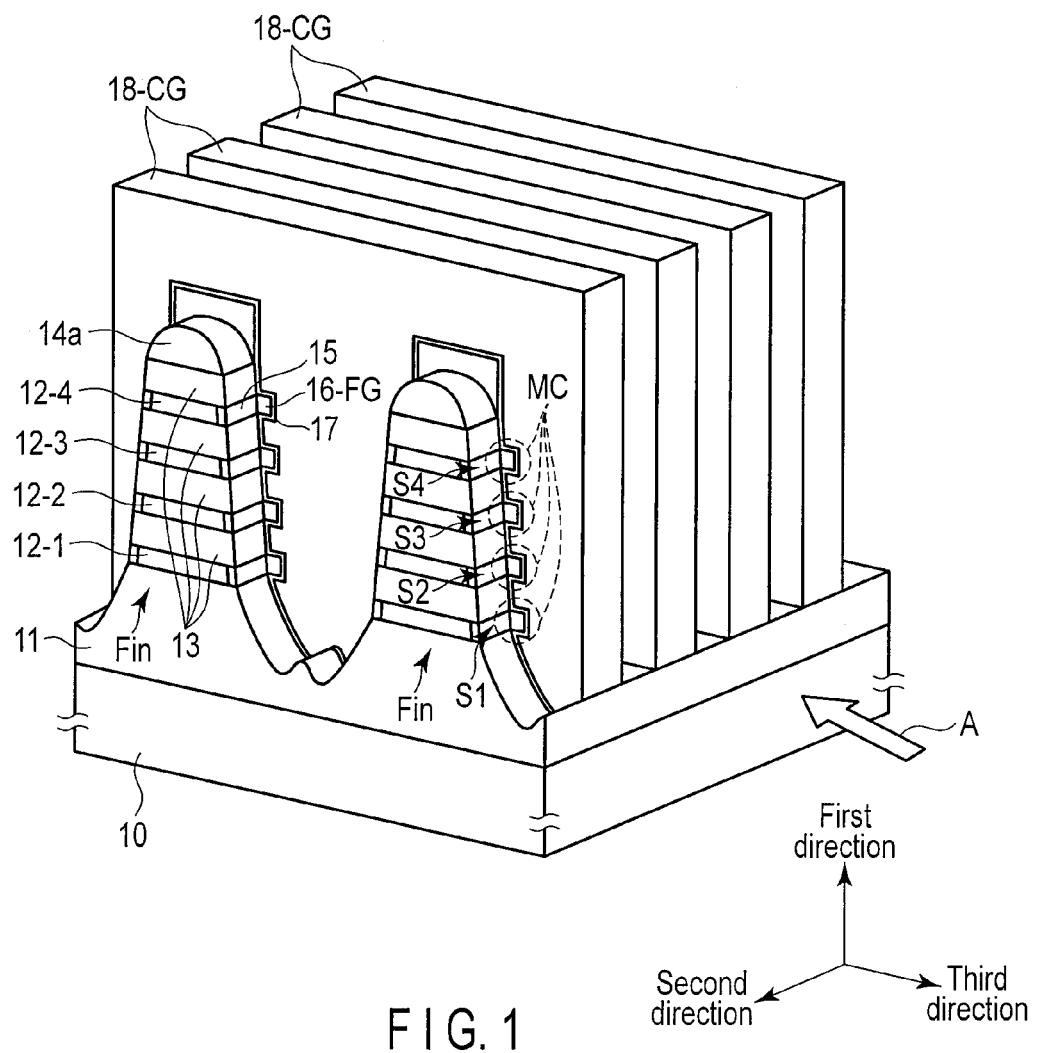
FIG. 1 is a perspective view showing a first embodiment.

In general, according to one embodiment, a nonvolatile semiconductor memory device comprises: a semiconductor substrate; a stacked layer structure including first to n-th semiconductor layers (n is a natural number equal to or larger than 2) stacked in a first direction which is perpendicular to a surface of the semiconductor substrate, and an upper insulating layer stacked on the n-th semiconductor layer, the stacked layer structure extending in a second direction which is parallel to the surface of the semiconductor substrate; and first to n-th NAND strings provided on surfaces of the first to n-th semiconductor layers in a third direction which is perpendicular to the first and second directions respectively. Each of the first to n-th NAND strings includes memory cells connected in series, and each of the memory cells includes a charge storage layer and a control gate electrode. The charge storage layers of the memory cells are separated from one another. The upper insulating layer includes oxide or nitride of an element selected from a group of Al, Hf, Ta, Ti, and W.

Hereinafter, embodiments are described with reference to the accompanying drawings.

Note that structural elements used in the entire embodiments are referred to by the same reference numbers and explanation considered redundant is omitted. Furthermore, each drawing is a schematic view only used for reference to explain and understand the invention; that is, the shape, size, and ratio therein may differ from those of an actual device since these design matters are arbitrarily changeable based on the following descriptions and publically-known techniques.

SUMMARY

The following embodiments are directed to a three-dimensional nonvolatile semiconductor memory device comprising a fin structure including a plurality of semiconductor layers (active areas) stacked on the semiconductor substrate.

The memory cell of the nonvolatile semiconductor memory device is formed in, for example, a gate structure in which a first insulating layer (tunnel oxidation layer), charge storage layer, second insulating layer, and control gate electrode are stacked in the order stated on a side surface of semiconductor layers in the fin structure.

As an example of a vertical gate type three-dimensional layered memory, there is a vertical gate ladder-bit cost scalable memory (VLB) and it is a candidate for the nonvolatile semiconductor memory device of the embodiments.

As mentioned above, the VLB can be broadly classified into two types; one is a VG-FG type in which a charge storage layer is electrically floating, and the other is a VG-MONOS type in which a charge storage layer traps the charge. The following embodiments are applied to both of these two types.

In such a three-dimensional nonvolatile semiconductor memory device, a charge storage layer must be separated memory cell by memory cell in the direction of extension of the NAND string (memory string), that is, the extension of the fin structure for improving the performance. The separation is, for example, performed at the same time when the control gate is patterned into lines and spaces using a hard mask preliminarily formed on the fin as a mask.

The following embodiments suggest a technique to form a side mask wall layer on side walls of a hard mask layer and pattern the fin structure by the isotropy etching using the hard mask layer and side wall mask layer as a mask. Then, the side wall mask layer is removed selectively to form the hard mask layer whose width is optimal for the self-alignment separation of a charge storage layer.

If the side wall mask layer is removed selectively after the fin structure is formed but before the control gate electrode is patterned into the lines and spaces, the hard mask layer shrink (isotropy etching) required conventionally in this technique can be skipped.

Thus, the initial thickness of the hard mask layer used for the fin structure patterning and the charge storage layer separation can be reduced, and the hard mask layer for the charge storage layer separation can be formed with high accuracy.

Note that materials used for the hard mask layer are determined to meet the following requirements: 1. they are functional as masks for patterning the fin structure; 2. they have etching selection ratio with respect to the side wall mask layer to selectively remove the side wall mask layer; and 3. they are functional as masks for separating the charge storage layer (for etching the control gate electrodes, semiconductor layers and insulating layers in the fin structure).

The following embodiments suggest that such suitable materials are oxidants and nitrides of elements selected from a group consisting of Al, Hf, Ta, Ti, and W.

Based on such a procedure, the three-dimensional nonvolatile semiconductor memory device suitable for miniaturization can be achieved.

First Embodiment

The first embodiment is directed to a case where the memory cell structure is a floating gate type.

Structure

Figure 2:
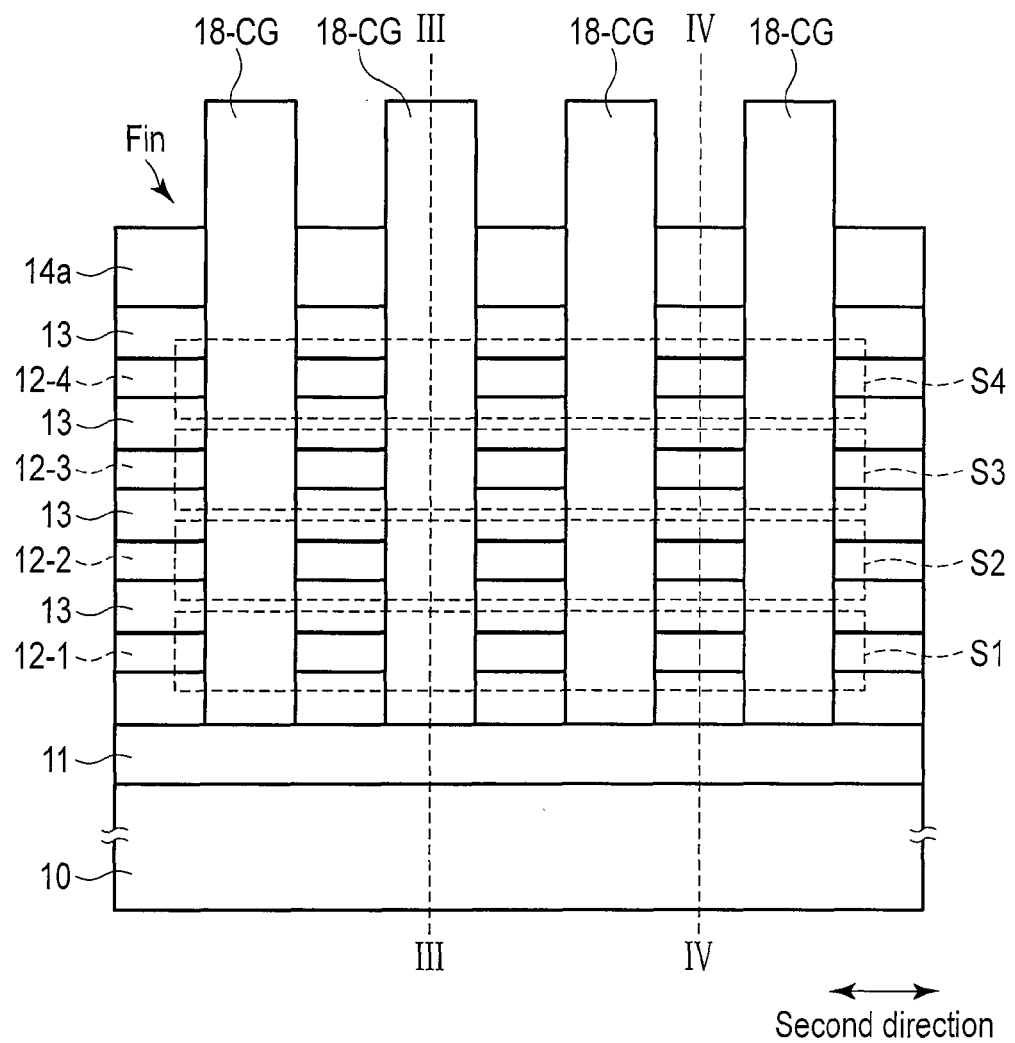
FIG. 2 is a side view seen along arrow A in FIG. 1.
Figure 3:
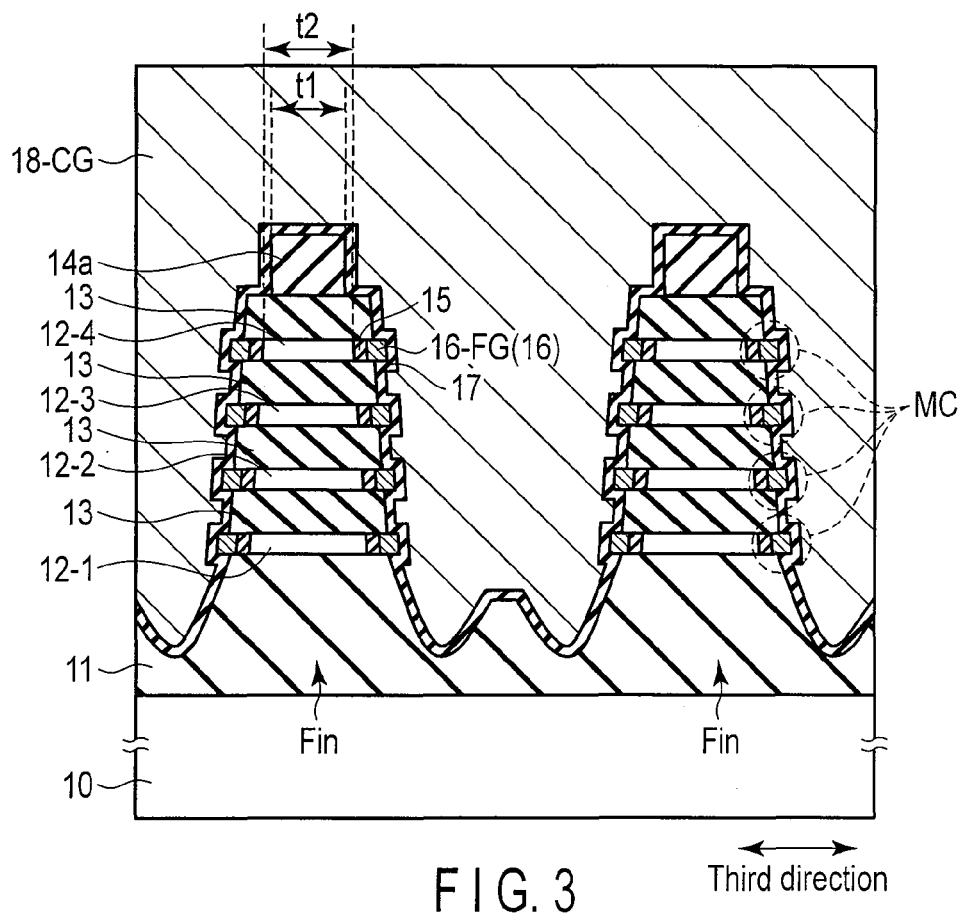
FIG. 3 is a cross-sectional view taken along line III-III in FIG. 2.
Figure 4:
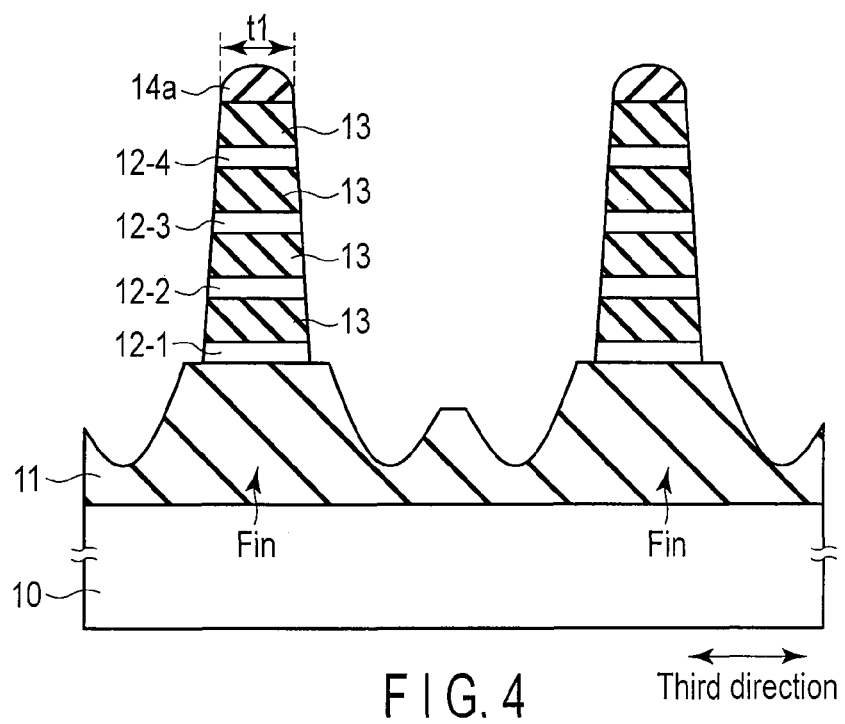
FIG. 4 is a cross-sectional view taken along line IV-IV in FIG. 2.

FIG. 1 shows the structure of the VG-FG type VLB. FIG. 2 is a side view showing the structure in FIG. 1 seen along arrow A. FIG. 3 is a cross-sectional view taken along line III-III in FIG. 2. FIG. 4 is a cross-sectional view taken along line IV-IV in FIG. 2.

In this embodiment, the main part of the memory cell array of the VG-FG type VLB is explained. The entirety of the memory cell array of the VG-FG type VLB is described in the application examples section below.

Semiconductor substrate 10 is, for example, a silicon substrate. Insulating layer 11 is, for example, a silicon oxide layer referred to as buried oxide (BOX) and used as a device separation insulating layer.

On insulating layer 11, first, second, third, and fourth semiconductor layers (active areas) 12-1, 12-2, 12-3, and 12-4 are insulated from one another and stacked in a first direction which is perpendicular to the surface of semiconductor substrate 10 while extending in a second direction parallel to the surface of semiconductor substrate 10.

In the present embodiment, four semiconductor layers are stacked on the insulating layer; however, the structure is not limited thereto and the stack may be of simply two or more semiconductor layers. Since the memory volume increases as the number of stacked semiconductor layers increases, the larger is preferable.

The insulation between first, second, third, and fourth semiconductor layers 12-1, 12-2, 12-3, and 12-4 is performed by insulating layers (for example, silicon oxide layers) 13.

Upon insulating layer 13 on fourth semiconductor layer 12-4 which is disposed uppermost among the four semiconductor layers, insulating layer (upper insulating layer) 14a is formed as a hard mask layer. In the present embodiment, insulating layer 14a contains an oxide or a nitride of elements selected from a group consisting of Al, Hf, Ta, Ti, and W. For example, insulating layer 14a contains aluminum nitride (AlN).

A fin structure (layered structure) is composed of first, second, third, and fourth semiconductor layers 12-1, 12-2, 12-3, and 12-4, and insulating layers 13 and 14a. First, second, third, and fourth semiconductor layers 12-1, 12-2, 12-3, and 12-4 should preferably be monocrystalline but may be polycrystalline or amorphous instead.

First, second, third, and fourth NAND strings (memory strings) S1, S2, S3, and S4 use first, second, third, and fourth semiconductor layers 12-1, 12-2, 12-3, and 12-4, respectively, as a channel. First, second, third, and fourth NAND strings S1, S2, S3, and S4 each include memory cells MC connected in series in the second direction.

Memory cells MC in first, second, third, and fourth NAND strings S1, S2, S3, and S4 each include gate insulating layer (tunnel oxidation layer) 15, floating gate electrode 16-FG, interelectrode insulating layer 17, and control gate electrode 18-CG on the surfaces of first, second, third, and fourth semiconductor layers 12-1, 12-2, 12-3, and 12-4 in a third direction which is perpendicular to the first and second directions.

Floating gate electrode 16-FG includes a first conductive layer (for example, conductive polysilicon layer) which is independent from any memory cell MC in first, second, third, and fourth NAND strings S1, S2, S3, and S4.

Furthermore, in the present embodiment, the width of first, second, third, and fourth semiconductor layers 12-1, 12-2, 12-3, and 12-4 in the third direction is narrower than that of insulating layers 13 in the third direction, and floating gate electrodes 16-FG of memory cells MC are stored in recesses between insulating layers 13.

Control gate electrode 18-CG includes a second conductive layer (for example, a conductive polysilicon layer) which extends in the first direction along the surface of first, second, third, and fourth semiconductor layers 12-1, 12-2, 12-3, and 12-4 in the third direction and is shared with first, second, third, and fourth NAND strings S1, S2, S3, and S4.

Control gate electrode 18-CG covers the surfaces of floating gate electrode 16-FG in both the first and third directions to increase the coupling ratio of memory cell MC.

Furthermore, control gate electrode 18-CG completely fills a space between two fin structures Fin adjacent in the third direction (filling is confined within the space between memory cells MC of two adjacent fin structures Fin). Control gate electrode 18-CG, as a whole, extends in the third direction when being viewed from the above of semiconductor substrate 10.

Here, in the present embodiment, as described in the following manufacturing method section, insulating layer 14a used as a hard mask has width t1 in the third direction which is equal to or narrower than width t2 of fourth semiconductor layer 12-4 in the third direction within the area covered with control gate electrode 18-CG to separate floating gate electrode 16-FG of the memory cells MC connected in series in first, second, third, and fourth NAND strings S1, S2, S3, and S4.

Due to the separation process of floating gate electrode 16-FG of memory cells MC, the cross-sectional shape of insulating layer 14a in the third direction changes. The cross-sectional shape has sharp corners (as in FIG. 3) in the area covered with control gate electrode 18-CG while having round corners (as in FIG. 4) in the area not covered with control gate electrode 18-CG.

Note that the above structure of the present embodiment includes four NAND strings corresponding to four semiconductor layers; however, the structure is not limited thereto and functions as well if it only includes two or more NAND strings corresponding to two or more semiconductor layers.

Furthermore, in the present embodiment, gate insulating layer 15 is removed in the area not covered with control gate electrode 18-CG (as in FIG. 4); however, gate insulating layer 15 may remain in this area on condition that floating gate electrode 16-FG is removed from the area.

With the above structure, a manufacturing method which can skip shrinking (isotropy etching) of insulating layer 14a as a hardmask layer can be achieved. The details will be described below. The initial thickness of insulating layer 14a can be reduced and the width of insulating layer 14a in the third direction can be formed with high accuracy.

Materials

Materials used for the above VG-FG type VLB may be selected arbitrarily from those suitable for respective generations of semiconductor memories. Hereinafter, the materials used the most are explained for instance.

Semiconductor substrate 10 is, for example, a monocrystalline silicon substrate.

Furthermore, insulating layer 11 is, for example, a silicon oxide layer. On condition that the part of insulating layer 11 touching first semiconductor layer 12-1 is an oxidant layer, insulating layer 11 may have a multilayer structure including different insulating layers.

Each of first, second, third, and fourth semiconductor layers 12-1, 12-2, 12-3, and 12-4 is, for example, a silicon (Si) layer. First, second, third, and fourth semiconductor layers 12-1, 12-2, 12-3, and 12-4 should preferably be monocrystalline, but they are not limited thereto and may be amorphous or polycrystalline.

Uppermost insulating layer (hard mask layer) 14a of fin structure Fin contains an oxidant or nitride of the elements selected from a group consisting of Al, Hf, Ta, Ti, and W. For example, insulating layer 14a should preferably be aluminum nitride (AlN).

Gate insulating layer (tunnel oxidant layer) 15 of memory cell MC is, for example, a silicon oxide layer. Gate insulating layer 15 may be formed of silicon oxynitride or a layer of silicon oxide and silicon nitride. Furthermore, gate insulating layer 15 may contain silicon nano particles, metal ions, and the like.

Floating gate electrode 16-FG may be formed of a material such as polysilicon (nondoped or impurities added), amorphous silicon (nondoped or impurities added), and metal. Floating gate electrode 16-FG may be structured as a layer including different materials.

Floating gate electrode 16-FG may contain silicon nano particles, metal ions, and the like.

Interelectrode insulating layer 17 of memory cell MC contains such materials used for both improving the coupling ratio and preventing leak current in writing/erasing processes.

Interelectrode insulating layer 17 is formed of a material selected from a groups consisting of silicon oxide ($SiO_2$), silicon oxynitride (SiON), aluminum oxide ($Al_2O_3$), aluminum oxynitride (AlON), hafnium ($HfO_2$), hafnium aluminate ($HfAlO_3$), hafnium nitride (HfON), hafnium nitride aluminate (HfAlON), hafnium silicate (HfSiO), hafnium nitride silicate (HfSiON), lanthanum oxide (La$_2$O$_3$), lanthanum alminate (LaAlO$_3$), and lanthanum almisilicate (LaAlSiO).

Interelectrode insulating layer 17 may be formed of the above material with modified composite ratio, or the above material mixed with silicon nano particles and metal ions.

Control gate electrode 18-CG contains one metal silicide layer such as a conductive polysilicon layer or a nickel silicide (NiSi) layer.

Control gate electrode 18-CG may be formed of a metal compound such as tantalum nitride (TaN), tantalum carbide (TaC), and titanium nitride (TiN), or of an element showing metallic electroconductivity such as Ni, V, Cr, Mn, Y, Mo, Ru, Rh, Hf, Ta, W, Ir, Co, Ti, Er, Pt, Pd, Zr, Gd, Dy, Ho, and Er, or of a silicide of such elements.

Note that the interlayer insulating layer covering the structures shown in FIGS. 1 to 4 should preferably be formed of a material whose dielectric constant is substantially the same as that of the silicon oxide layer which has relative dielectric constant 3.9. The interlayer insulating layer is, for example, TEOS; however, it is not limited thereto and may be a silicon oxide layer manufactured by, for example, firing a polysilazane solvent by thermal processing.

Floating gate electrode 16-FG and control gate electrode 18-CG may be formed of any material as long as the following processes can be adopted.

First Example of Manufacturing Method

FIGS. 5 to 20 show the first example of the manufacturing method of the VG-FG type VLB in FIGS. 1 to 4.

Figure 5:
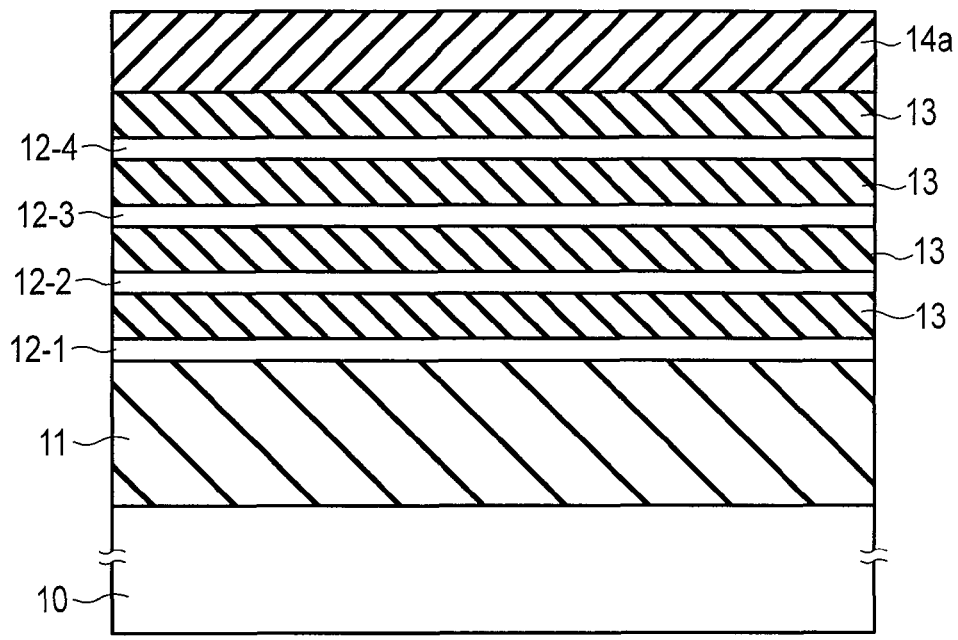

Initially, as shown in FIG. 5, a p type or n type silicon substrate whose plane orientation (100) and relative resistance 10 to 20 Ωcm is prepared as semiconductor substrate 10, for example. On semiconductor substrate 10, insulating layers 11 and 13 as silicon oxide layers and first, second, third, and fourth semiconductor layers 12-1, 12-2, 12-3, and 12-4 as polycrystalline silicon layers are formed alternately. Then, insulating layer 14*a* as a hard mask layer (for example, aluminum nitride layer) is formed on insulating layers 13.

Figure 6:
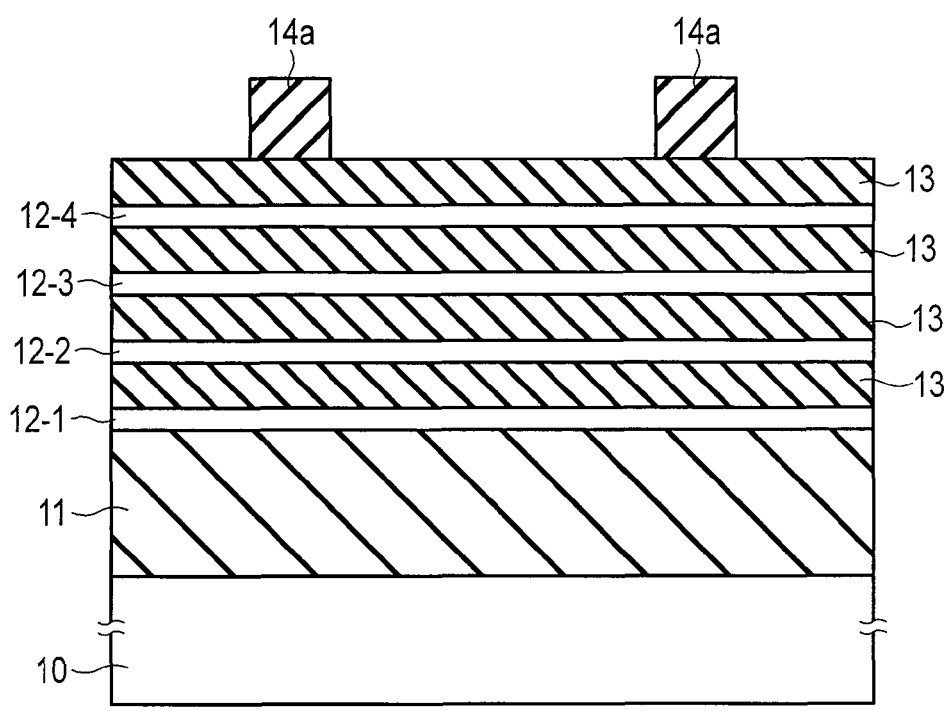

Now, as shown in FIG. 6, a resist pattern is formed on insulating layer 14*a* by a photo engraving process (PEP). Then, insulating layer 14*a* is patterned by reactive ion etching (RIE) using the resist pattern as a mask. The width of insulating layer 14*a* in the third direction is set to a value suitable for the separation process of the floating gate electrode described below. After that, the resist pattern is removed.

Then, as shown in FIG. 7, insulating layer 14*b* covering insulating layer 14*a* is formed on insulating layers 13. Insulating layer 14*b* is, for example, a silicon oxide layer, silicon nitride layer, resist layer containing carbon, or the like. In this example, insulating layer 14*b* is a silicon nitride layer.

Then, insulating layer 14*b* is etched by anisotropy etching to maintain insulating layer 14*b* only on the side walls of insulating layer 14*a* as a hard mask layer. As a result of that, the structure in FIG. 8 can be obtained. For the sake of clarification, insulating layer 14*b* formed on the side walls of insulating layer 14*a* is hereinafter referred to as side wall mask layer 14*b* while insulating layer 14*a* is hereinafter referred to as hard mask layer 14*a*.

Figure 9:
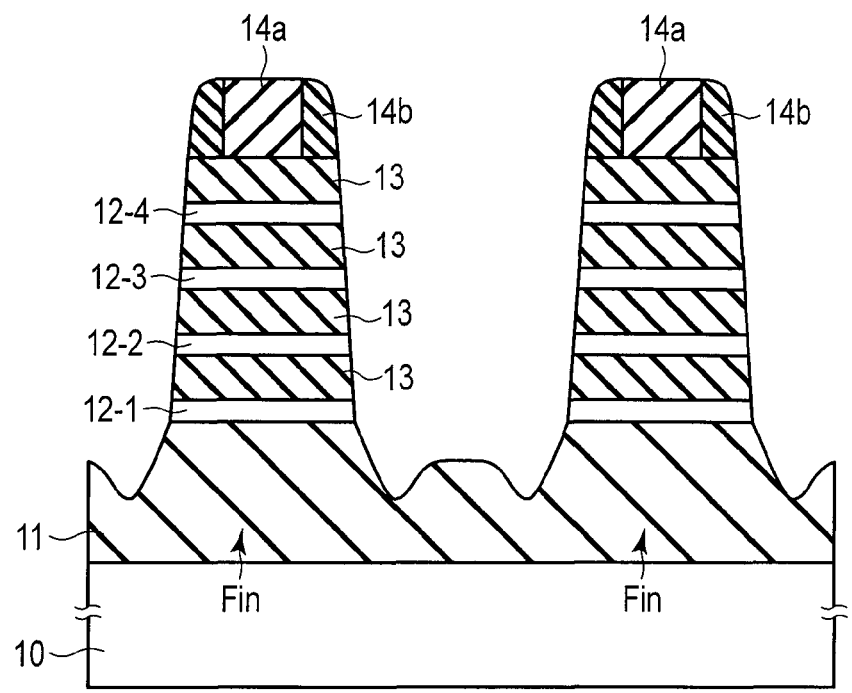

Next, as shown in FIG. 9, insulating layer 13, fourth semiconductor layer 12-4, insulating layer 13, third semiconductor layer 12-3, insulating layer 13, second semiconductor layer 12-2, insulating layer 13, and first semiconductor layer 12-1 are etched in the order stated by anisotropy etching using hard mask layer 14*a* and side wall mask layer 14*b* as masks. At that time, a part of insulating layer 11 used as a device separation insulating layer is also etched.

Consequently, fin structure Fin is formed.

Figure 10:
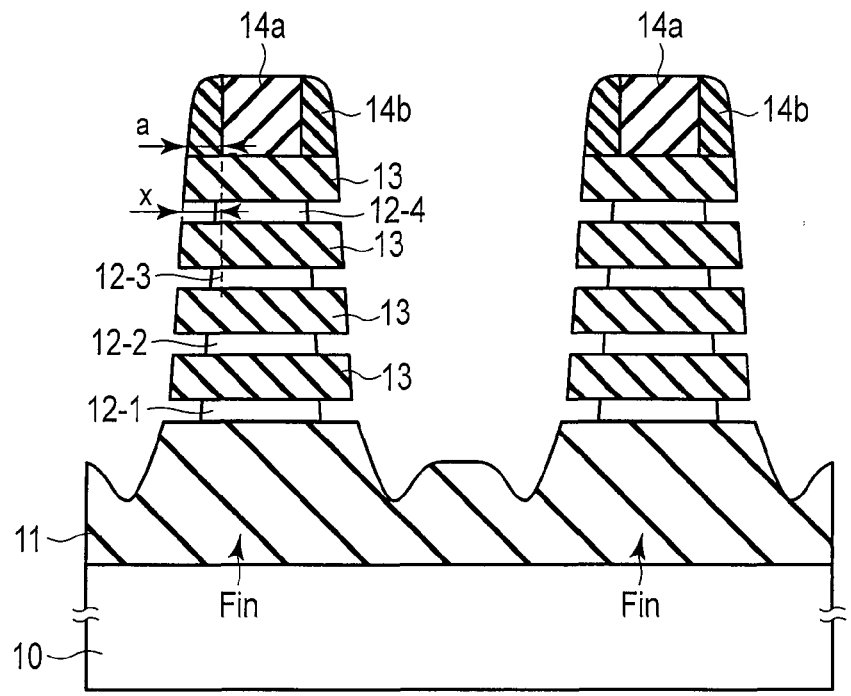

Then, as shown in FIG. 10, in first, second, third, and fourth semiconductor layers 12-1, 12-2, 12-3, and 12-4 in fin structure Fin, the surfaces extending in the third direction are recess-etched by, for example, wet etching using choline, chemical dry etching (CDE), or dry etching using chlorine gas. Consequently, recesses are formed in the surfaces of fin structure Fin in the third direction.

That is, by this etching, surfaces of the first, second, third, and fourth semiconductor layers 12-1, 12-2, 12-3, and 12-4 in the third direction are set back inside the surface of the insulating layer 13 in the third direction. As a result of that, the width of first, second, third, and fourth semiconductor layers 12-1, 12-2, 12-3, and 12-4 in the third direction is shrunk.

Here, amount x of shrink (etching width) of first, second, third, and fourth semiconductor layers 12-1, 12-2, 12-3, and 12-4 must be equal to or less than width a of the side wall mask layer in the third direction. This is because, as described below, floating gate electrodes of memory cells are separated securely in the area not covered with the control gate electrodes.

Figure 11:
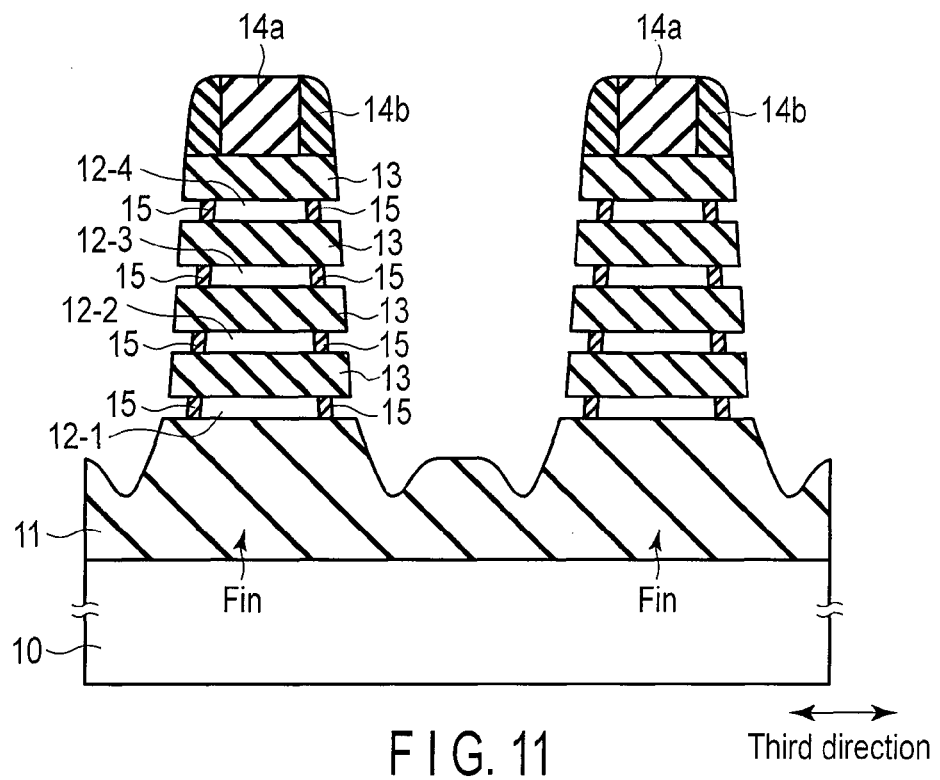

Next, as shown in FIG. 11, gate insulating layers (for example, silicon oxide layers) 15 are formed on the recesses of the fin structure Fin in the third direction, that is, on the surfaces of first, second, third, and fourth semiconductor layers 12-1, 12-2, 12-3, and 12-4 in the third direction by, for example, a slot plane antenna (SPA) plasma generating technique.

Gate insulating layer 15 is used as a tunnel oxidation layer of the memory cell.

Figure 12:
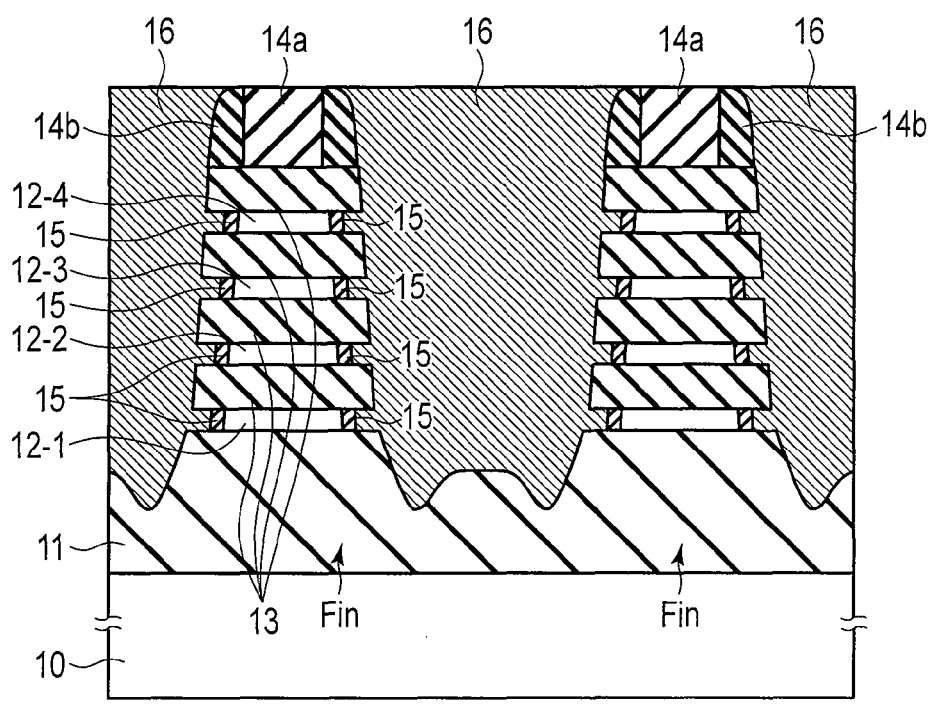

Next, as shown in FIG. 12, the entire surface of fin structure Fin is covered with first conductive layer 16 used as a polycrystalline silicon layer by, for example, a CVD method. First conductive layer 16 completely fills the space between two fin structures Fin adjacent to each other in the third direction.

Furthermore, the upper surface of first conductive layer 16 is flattened out by, for example, chemical mechanical polishing (CMP). At that time, the upper surface of insulating layer 14*a* may be used as the endpoint for the CMP.

Note that the CMP is performed in consideration of a selection transistor formed together with the memory cell. Since this example is mainly directed to a technique for separating floating gate electrodes of the memory cell, the selection transistor is omitted. Therefore, the CMP may be omitted as well.

Figure 13:
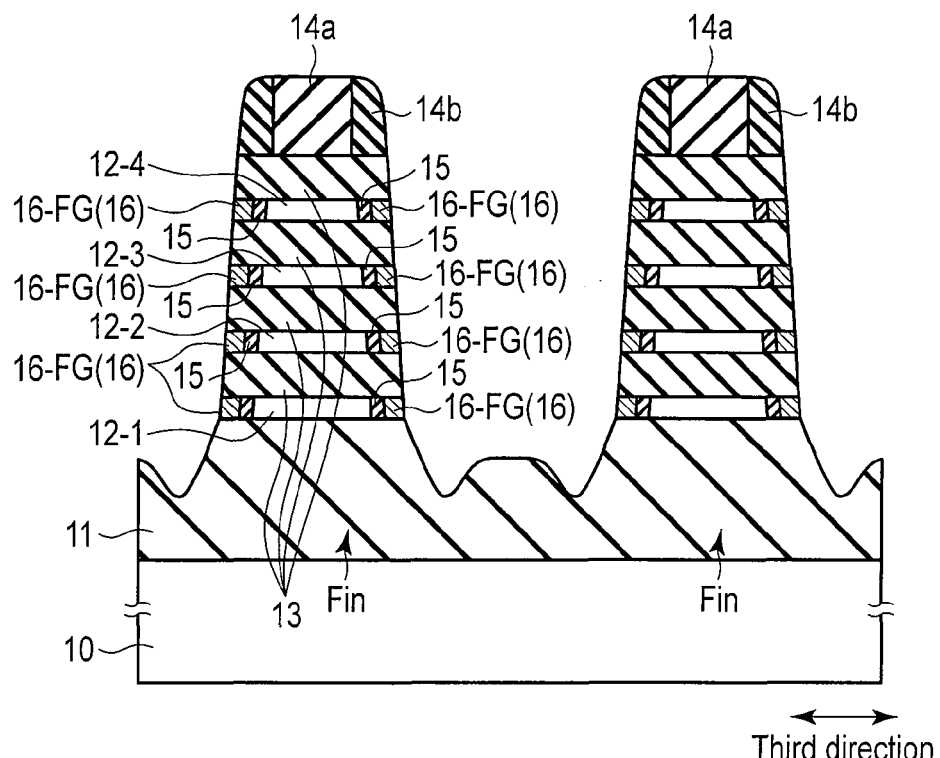

Then, first conductive layer 16 is etched by the RIE to form floating gate electrodes 16-FG in the recesses of fin structure Fin as shown in FIG. 13. That is, floating gate electrodes 16-FG are, in the self-alignment manner, separated from each other in upward-downward direction (the first direction) by insulating layers 13.

Note that, within the recesses of the fin structure Fin, floating gate electrodes 16-FG are still extending in the second direction which is drawn perpendicularly to FIG. 13. Thus, floating gate electrodes 16-FG are connected to each other when they are considered as one semiconductor layer (one NAND string).

Figure 14:
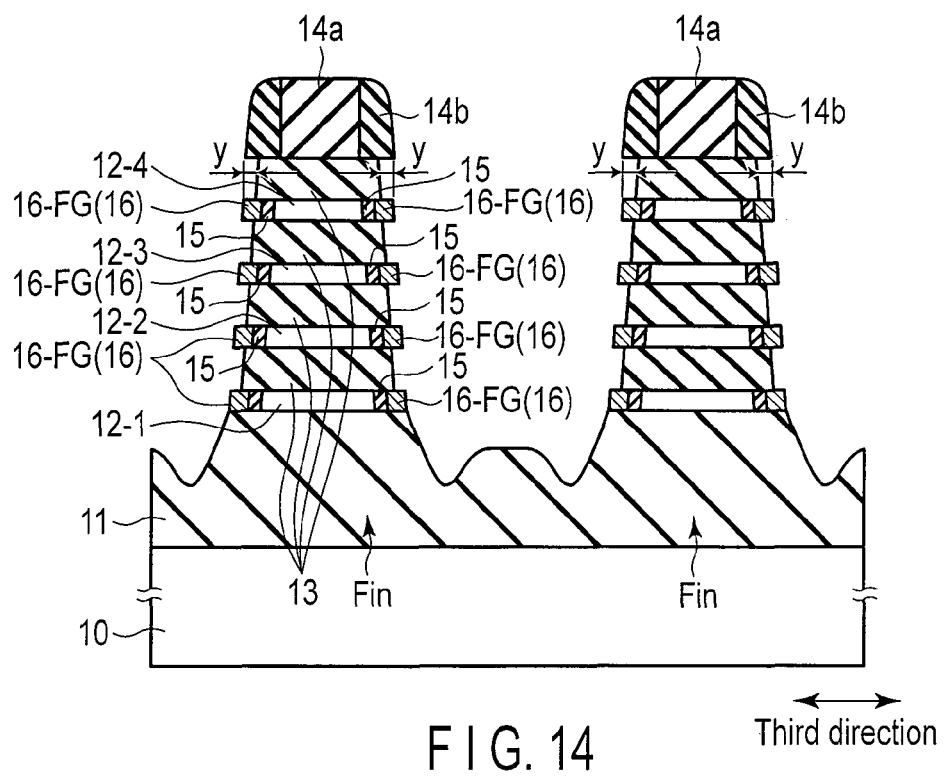

Then, as shown in FIG. 14, the surfaces of insulating layers 13 in the third direction are recess-etched by, for example, wet etching or isotropy dry etching using HF/NH$_3$ gas.

Here, amount y of shrink (etching width) of insulating layers 13 should preferably be set to such a value that the surfaces of insulating layers 13 in the third direction come between two surfaces of floating gate electrodes 16-FG in the third direction (between the surface at gate insulating layer 15 side and the surface opposite to gate insulating layer 15).

Such a value setting is preferable since the control gate electrodes formed later can cover three surfaces of the floating gate electrodes while maintaining a certain distance from the edges of first, second, third, and fourth semiconductor layers 12-1, 12-2, 12-3, and 12-4.

If the control gate electrode covers three surfaces of the floating gate electrode, a facing area between the control gate electrode and the floating gate electrode is increased, and consequently, coupling ratio of the memory cell can be improved.

Furthermore, if the amount y of shrink of insulating layers 13 reaches inside the surfaces of floating gate electrode 16-FG at gate insulating layer 15 side, gate insulating layers 15 are sometimes etched together with insulating layers 13. This is because both insulating layer 13 and gate insulating layer 15 are silicon oxide layers in many cases.

For such a reason, the amount y of shrink of insulating layer 13 should preferably be set to such a value that the surface of insulating layer 13 in the third direction come outside the surface of floating gate electrode 16-FG at gate insulating layer 15 side.

Next, as shown in FIG. 15, side wall mask layer 14b is removed selectively by, for example, isotropy etching. As a result of that, hard mask layer 14a having a predetermined width suitable for separating floating gate electrode 16-FG remains alone on insulating layers 13.

That is, by the above step, an advantage obtained by conventional hard mask layer shrinking techniques can be achieved the same. Furthermore, since the shrinking step of hard mask layer (an integrated mask) performed conventionally can be skipped, the initial thickness of hard mask layer 14a can be reduced and the width thereof can be set with high accuracy.

Furthermore, by the above step, floating gate electrode 16-FG in a single NAND string (one layer extending in the second direction) can be separated securely memory cell by memory cell during patterning the control gate as described below.

Next, as shown in FIG. 16, interelectrode insulating layer (for example, $SiO_2/Si_3N_4/SiO_2$) 17 used for covering the entire surface of fin structure Fin is prepared by, for example, a CVD method. Then, second conductive layer (for example, a polysilicon layer) 18a used for covering fin structure Fin and completely filling the space between fin structures Fin.

Figure 17:
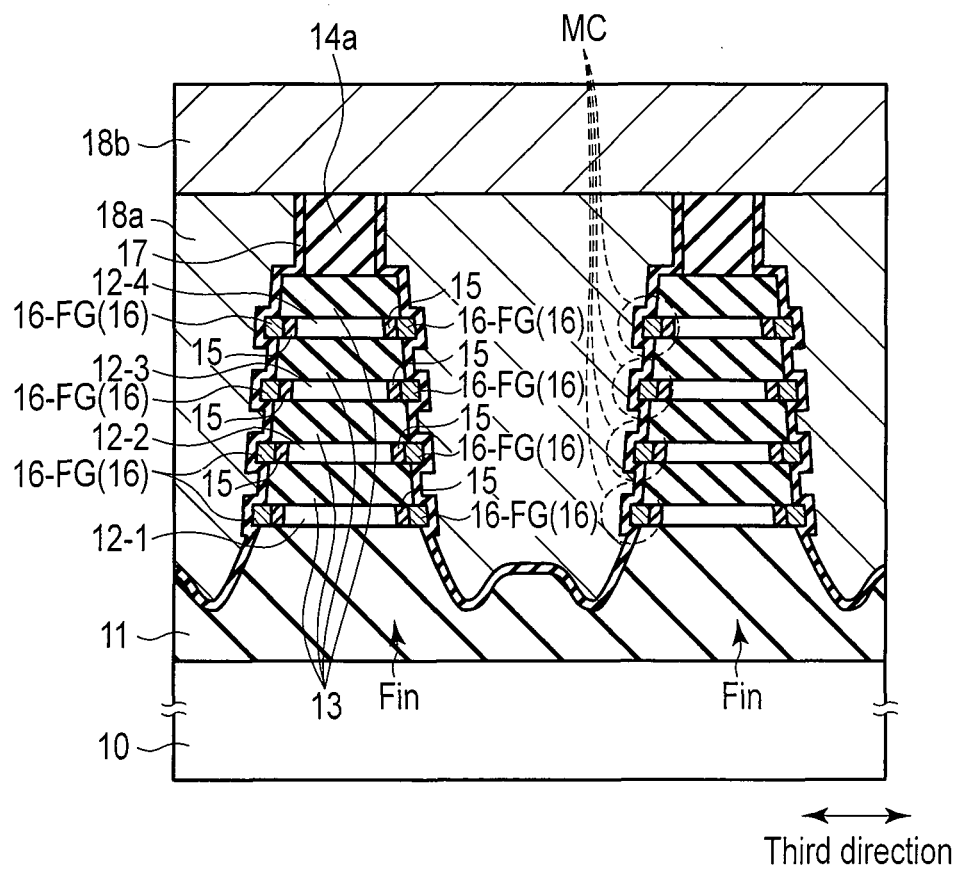

Here, as shown in FIG. 17, the upper surface of second conductive layer 18a and a part of interelectrode insulating layer 17 are polished by the CMP. At that time, the upper surface of hard mask layer 14a may be used as the endpoint for the CMP.

Then, second conductive layer (for example, a metal layer) 18b is formed on second conductive layer 18a by, for example, the CVD.

Furthermore, if need be, the upper surface of second conductive layer 18b (the surface in the first direction) may be flattened out by the CMP. In that case, the CMP should preferably be performed after forming the insulating layer such as a silicon oxide layer on second conductive layer 18b.

Figure 19:
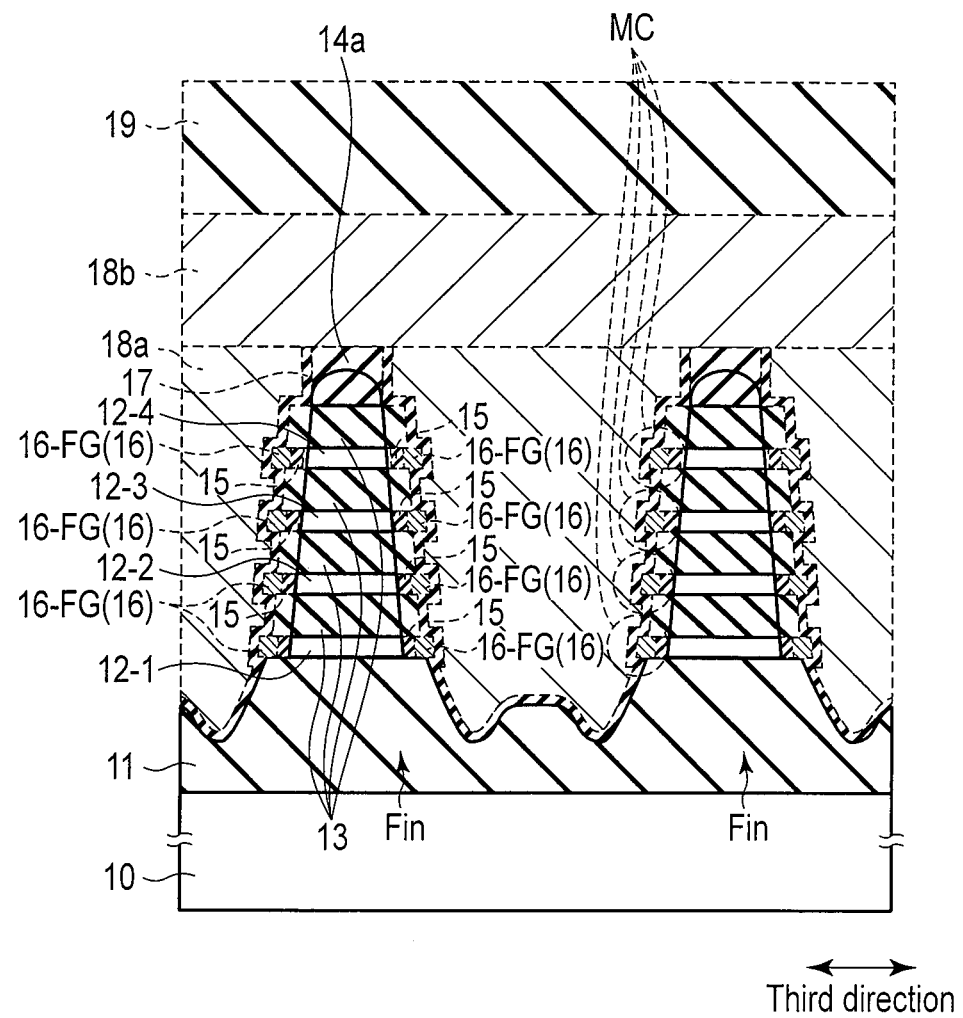

Next, as shown in FIGS. 18 and 19, resist patterns 19 are formed on second conductive layers 18b by the PEP. Control gate electrodes 18-CG are patterned using resist patterns 19 as masks.

Resist patterns 19 used for patterning include line and space patterns extending in the third direction. Thus, first and second conductive layers 16 and 18 and interelectrode insulating layer 17 within the area not covered with resist patterns 19 are removed completely.

At the same time, floating gate electrodes 16-FG within the area not covered with resist patterns 19 are removed as well. That is, in a single NAND string, floating gate electrodes 16-FG composing a single layer extending in the second direction are separated from each other memory cell by memory cell by this step.

Note that, even in the area not covered with resist patterns 19, first, second, third, and fourth semiconductor layers 12-1, 12-2, 12-3, and 12-4 and insulating layers 11 and 13 which are covered with hard mask layers 14a are not removed.

Furthermore, during the patterning process of control gate electrodes 18-CG, hard mask layers 14a within the area not covered with resist patterns 19 are etched to a certain extent while functioning as masks. As a result of that, the cross-sectional shape of hard mask layers 14a has round portions within the area not covered as shown in FIGS. 18 and 19.

Consequently, as shown in FIG. 20, hard mask layers 14a have the cross-sectional shape in the third direction which shapes corner portions in the area covered with resist patterns 19 and control gate electrodes 18b and shapes round portions in the area not covered with resist patterns 19 and control gate electrodes 18b.

When the cross-sectional shape of hard mask layer 14a in the third direction shapes corner portions in the area covered with resist patterns 19 and control gate electrodes 18b, the accuracy of separating floating gate electrode 16-FG memory cell by memory cell can be improved.

When the cross-sectional shape of hard mask layer 14a in the third direction shapes round portions in the area not covered with resist patterns 19 and control gate electrodes 18b, facility to fill a space between word lines (control gate electrodes 18-CG) with an interlayer insulating layer can be improved as described below.

After that, resist patterns 19 are removed.

Lastly, although this is not shown, the space between control gate electrodes 18-CG having line and space patterns is filled with an interlayer insulating layer (for example, a silicon oxide layer) by, for example, the CVD.

The VG-FG type VLB in FIGS. 1 to 4 is manufactured by the above-described processes.

Note that, due to the condition that insulating layers 11, 13, and 15 are silicon oxide layers in the above example, side wall mask layers 14b are silicon nitride layers; however, they are not limited thereto and, if insulating layers 11, 13, and 15 are silicon nitride layers, side wall mask layers 14b may be silicon oxide layers.

Furthermore, if side wall mask layers 14b are resist layer containing carbon (c), a step of selectively removing side wall mask layers 14b can be performed by ashing. If effect of etching (size reduction) to hard mask layers 14a is unacceptable when side wall mask layers 14b are removed, resist layers containing carbon are used as side wall mask layers 14b to suppress the size variations in hard mask layers 14a when side wall mask layers 14b are removed.

On the other hand, ashing requires heat which may damage hard mask layer 14a. If there is a possibility that heat may severely damages hard mask layer 14a, side wall mask layer 14b should preferably be removed by, for example, isotropy etching as in the above-described process.

Second Example of Manufacturing Method

FIGS. 21 to 31 show the second example of the manufacturing method of the VG-FG type VLB in FIGS. 1 to 4.

The second example features a layered structure of hard mask layer 14a composed of a first layer 14a-1 and a second layer 14a-2. The layered structure allows a selection of mask materials between etching conditions such as, for example, a condition at the time of forming the fin structure and a condition at the time of separating floating gate electrodes.

Initially, as shown in FIG. 21, insulating layers 11 and 13, first, second, third, and fourth semiconductor layers 12-1, 12-2, 12-3, and 12-4, and first and second layers 14a-1 and 14a-2 as hard mask layer 14a are formed on semiconductor substrate 10. Materials used therein are, for example, those used in the first example except for materials of hard mask layer 14a.

In hard mask layer 14a, first layer 14a-1 as a lower layer contains an oxide or nitride of element selected from a group consisting of Al, Hf, Ta, Ti, and W. The first layer 14a-1 is, for example, an aluminum nitride layer.

In hard mask layer 14a, second layer 14a-2 as an upper layer may be formed of an oxide or nitride of an element selected from a group consisting of Al, Hf, Ta, Ti, and W, or may be formed of a material containing the same element used in the side wall mask layer described below. Second layer 14a-2 is, for example, a titanium nitride layer.

Furthermore, second layer 14a-2 may be any one of silicon oxide layer, silicon nitride layer, and resist layer containing carbon, for example.

Now, as shown in FIG. 22, a resist pattern is formed on insulating layer 14a by the PEP. Then, insulating layer 14a is patterned by the RIE using the resist pattern as a mask. The width of insulating layer 14a in the third direction is set to a value suitable for the separation process of the floating gate electrode described below. After that, the resist pattern is removed.

Then, as shown in FIG. 23, insulating layer 14b covering insulating layer 14a is formed on insulating layers 13. Insulating layer 14b is, for example, a silicon nitride layer as described above. Note that insulating layer 14b may be a silicon oxide layer or a resist layer containing carbon instead.

Then, insulating layer 14b is etched by anisotropy etching to maintain insulating layer 14b only on the side walls of insulating layer 14a. As a result of that, side wall mask layer 14b is formed as shown in FIG. 24.

Next, as shown in FIG. 25, insulating layer 13, fourth semiconductor layer 12-4, insulating layer 13, third semiconductor layer 12-3, insulating layer 13, second semiconductor layer 12-2, insulating layer 13, and first semiconductor layer 12-1 are etched in the order stated by anisotropy etching using second layer 14a-2 of hard mask layer 14a and side wall mask layer 14b as masks. At that time, a part of insulating layer 11 as the device separation insulating layer is also etched.

Consequently, fin structure Fin is formed.

Note that, in this example, second layer 14a-2 of hard mask layer 14a may be formed of a material which is fully functional as a mask in the etching conditions used in forming fin structure Fin. For example of such a material, a titanium nitride layer may be used.

Then, as shown in FIG. 26, first, second, third, and fourth semiconductor layers 12-1, 12-2, 12-3, and 12-4 are recess-etched, gate insulating layers (for example, silicon oxide layers) 15 are formed, floating gate electrodes 16-FG are formed, and insulating layers 13 are recess-etched, sequentially.

The steps and conditions used therein are the same as those of the above-described first example (refer to FIGS. 10 to 14). Thus, the detailed descriptions are omitted.

Note that, at this point of time, floating gate electrodes 16-FG are separated from each other in upward-downward direction (the first direction) by insulating layers 13 in the self-alignment manner; however, they are still connected to each other in the second direction which is drawn perpendicularly to FIG. 26, that is, when they are considered as one semiconductor layer (one NAND string).

Next, as shown in FIG. 27, second layer 14a-2 of hard mask layer 14a and side wall mask layer 14b are removed selectively by, for example, isotropy etching. As a result, first layer 14a-1 of hard mask layer 14a having a predetermined width suitable for separating floating gate electrode 16-FG remains alone on insulating layers 13.

Note that second layer 14a-2 of hard mask layer 14a and side wall mask layer 14b may be removed at the same time with the same etching condition or may be removed separately with different etching conditions.

Furthermore, in this step, only side wall mask layer 14b may be removed selectively and second layer 14a-2 of hard mask layer 14a may be left untouched.

Next, as shown in FIG. 28, interelectrode insulating layer (for example, $SiO_2/Si_3N_4/SiO_2$) 17 used for covering the entire surface of fin structure Fin is prepared by, for example, a CVD method. Then, second conductive layer (for example, a polysilicon layer) 18a used for covering fin structure Fin and completely filling the space between fin structures Fin.

Figure 29:
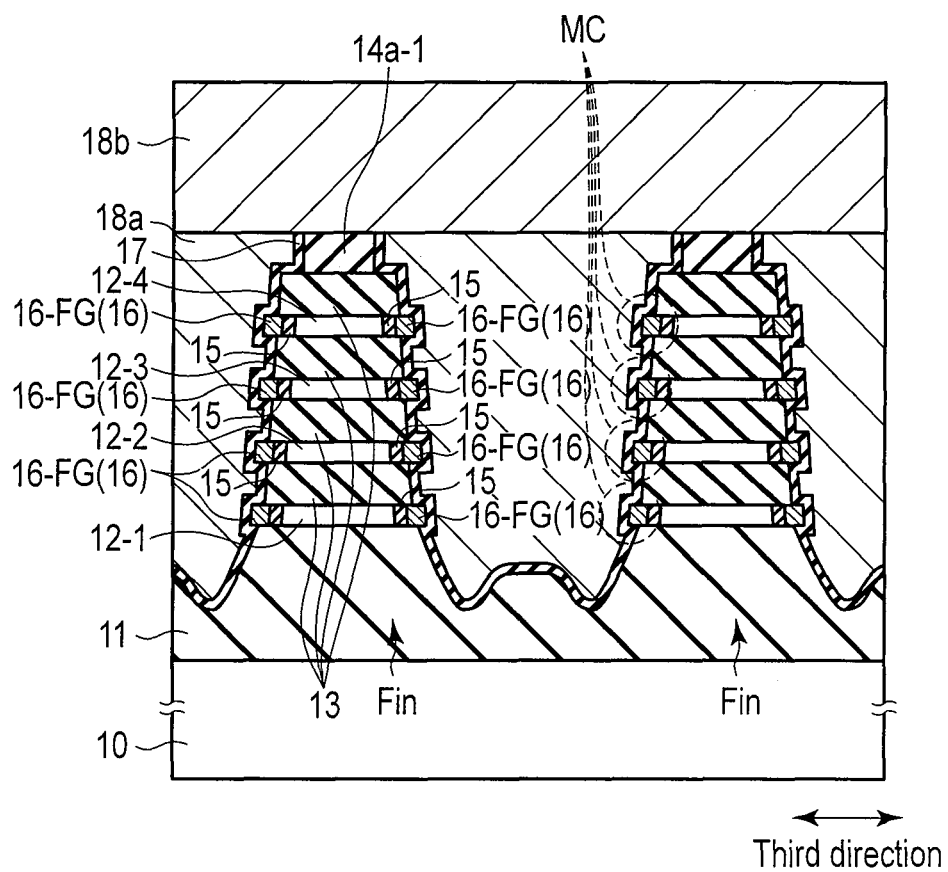

Here, as shown in FIG. 29, the upper surface of second conductive layer 18a and a part of interelectrode insulating layer 17 are polished by the CMP. At that time, the upper surface of first layer 14a-1 as a hard mask layer may be used as the endpoint for the CMP.

Then, a second conductive layer (for example, a metal layer) 18b is a second conductive layer 18a by, for example, the CVD.

Furthermore, if need be, the upper surface of second conductive layer 18b (the surface in the first direction) may be flattened out by the CMP. In that case, the CMP should preferably be performed after forming an insulating layer such as a silicon oxide layer on second conductive layer 18b.

Next, as shown in FIGS. 30 and 31, resist patterns 19 are formed on second conductive layers 18b by the PEP. Control gate electrodes 18-CG are patterned using resist patterns 19 as masks.

Resist patterns 19 used for patterning include line and space patterns extending in the third direction. Thus, first and second conductive layers 16 and 18 and interelectrode insulating layer 17 within the area not covered with resist patterns 19 are removed completely.

At the same time, floating gate electrodes 16-FG within the area not covered with resist patterns 19 are removed as well. That is, in a single NAND string, floating gate electrodes 16-FG composing a single layer extending in the second direction are separated from each other memory cell by memory cell by this step.

Note that, even in the area not covered with resist patterns 19, first, second, third, and fourth semiconductor layers 12-1, 12-2, 12-3, and 12-4 and insulating layers 11 and 13 which are covered with first layer 14a-1 as a hard mask layer are not removed.

Furthermore, during the patterning process of control gate electrodes 18-CG, first layer (hard mask layer) 14a-1 in the area not covered with resist patterns 19 are etched to a certain extent while functioning as a mask. As a result of that, the cross-sectional shape of hard mask layer 14a has round portions within the area not covered as shown in FIGS. 30 and 31.

After that, resist patterns 19 are removed.

Lastly, although this is not shown, the space between control gate electrodes 18-CG having line and space patterns is filled with an interlayer insulating layer (for example, a silicon oxide layer) by, for example, the CVD.

The VG-FG type VLB in FIGS. 1 to 4 is manufactured by the above-described processes.

Note that, as mentioned in the first example section, materials and steps may be modified similarly in this example. For example, if side wall mask layer 14*b* is a resist layer containing carbon (c), a step for selectively removing side wall mask layer 14*b* can be performed by asking.

Second Embodiment

The second embodiment is directed to a modified example of the first embodiment.

As compared to the first embodiment, the feature of this example is in a double floating gate structure of a charge storage layer, which includes two floating gate electrodes (conductive layers). The double floating gate structure performs advantages such as an increased charge amount in a charge storage layer and improved controllability of the charge amount.

Note that an under layer floating gate electrode may be replaced with a charge trap layer (an insulating layer). Such a structure is referred to as a hybrid cell structure. Furthermore, the number of the charge storage layers is not limited to two and may be three or more.

Structure

Figure 32:
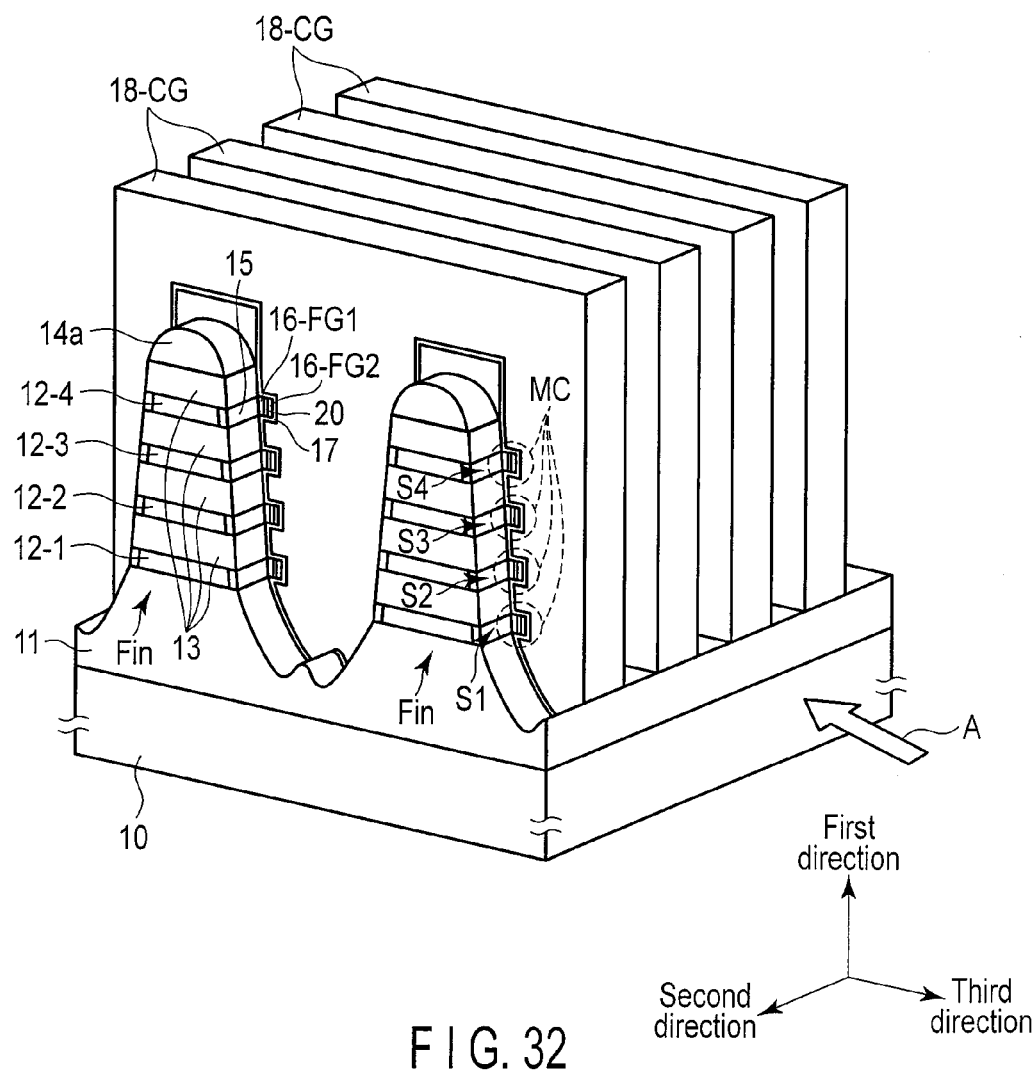
FIG. 32 is a perspective view showing a second embodiment.
Figure 33:
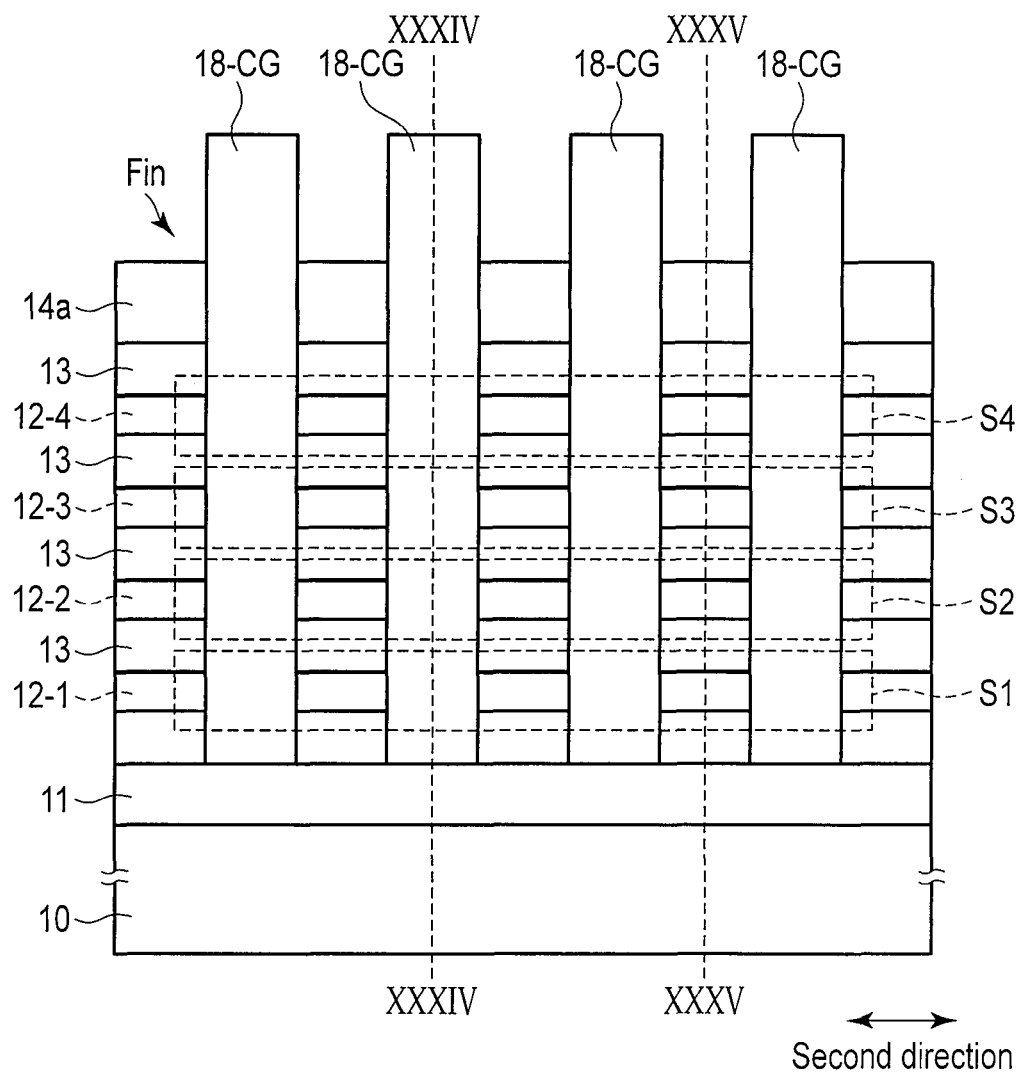
FIG. 33 is a side view seen along arrow A in FIG. 32.
Figure 34:
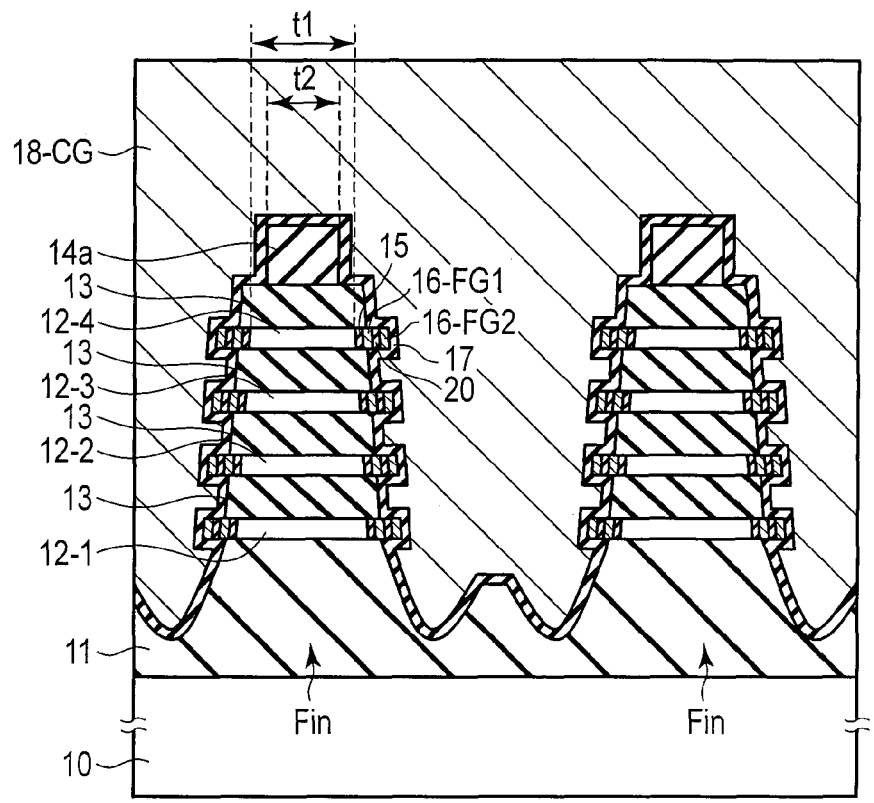
FIG. 34 is a cross-sectional view taken along line XXXIV-XXXIV in FIG. 33.
Figure 35:
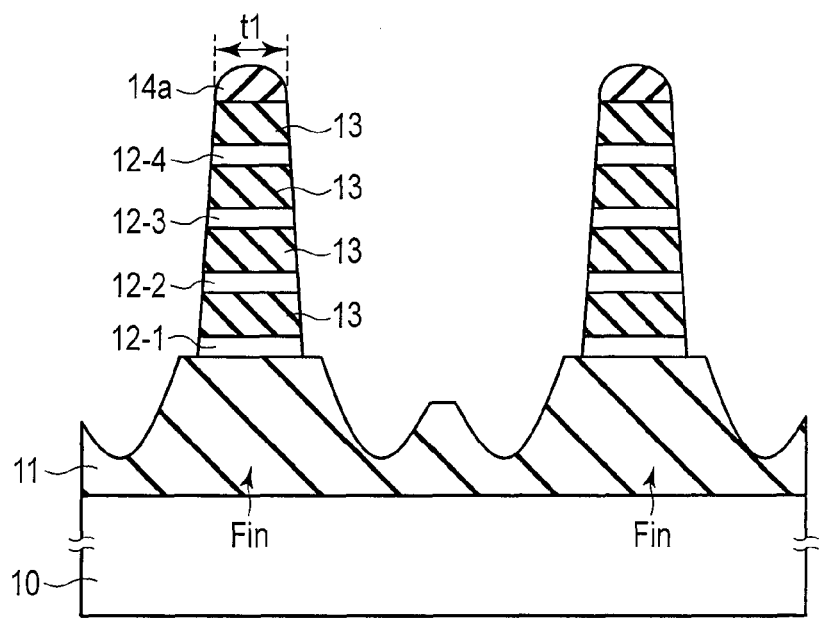
FIG. 35 is a cross-sectional view taken along line XXXV-XXXV in FIG. 33.

FIG. 32 shows the structure of the VG-FG type VLB. FIG. 33 is a side view showing the structure in FIG. 32 seen along arrow A. FIG. 34 is a cross-sectional view taken along line XXXIV-XXXIV in FIG. 33. FIG. 35 is a cross-sectional view taken along line XXXV-XXXV in FIG. 33.

In this embodiment, technical points different from the above-described first embodiment (the VG-FG type VLB in FIGS. 1 to 4) are explained. That is, elements corresponding to those explained in the first embodiment section are referred to by the same reference numbers and explanation considered redundant is omitted.

On insulating layer 11, first, second, third, and fourth semiconductor layers (active areas) 12-1, 12-2, 12-3, and 12-4 are disposed. First, second, third, and fourth semiconductor layers 12-1, 12-2, 12-3, and 12-4 are insulated from one another by insulating layers 13. Insulating layer 14*a* used as a hard mask layer is disposed upon insulating layer 13 on fourth semiconductor layer 12-4 which is disposed uppermost among the four semiconductor layers.

First, second, third, and fourth NAND strings (memory strings) S1, S2, S3, and S4 use first, second, third, and fourth semiconductor layers 12-1, 12-2, 12-3, and 12-4, respectively, as a channel. First, second, third, and fourth NAND strings S1, S2, S3, and S4 each include memory cells MC connected in series in the second direction.

Memory cells MC in first, second, third, and fourth NAND strings S1, S2, S3, and S4 each include gate insulating layer (tunnel oxidation layer) 15, first floating gate electrode 16-FG1, interelectrode insulating layer 20, second floating gate electrode 16-FG2, interelectrode insulating layer 17, and control gate electrode 18-CG on the surfaces of first, second, third, and fourth semiconductor layers 12-1, 12-2, 12-3, and 12-4 in a third direction which is perpendicular to the first and second directions.

First floating gate electrode 16-FG1 includes a first conductive layer (for example, a conductive polysilicon layer) and second floating electrode 16-FG2 includes a second conductive layer (for example, a conductive polysilicon layer).

The first and second conductive layers of first and second floating gate electrodes 16-FG1 and 16-FG2 are independent from any memory cell MC in first, second, third, and fourth NAND strings S1, S2, S3, and S4.

Furthermore, in the present embodiment, the width of first, second, third, and fourth semiconductor layers 12-1, 12-2, 12-3, and 12-4 in the third direction is narrower than that of insulating layers 13 in the third direction, and floating gate electrodes 16-FG1 and 16-FG2 of memory cells MC are stored in recesses between insulating layers 13.

Control gate electrode 18-CG includes a third conductive layer (for example, a conductive polysilicon layer) which extends in the first direction along the surface of first, second, third, and fourth semiconductor layers 12-1, 12-2, 12-3, and 12-4 in the third direction and is shared with first, second, third, and fourth NAND strings S1, S2, S3, and S4.

Here, in the present embodiment, as described in the first embodiment section, insulating layer 14*a* used as a hard mask has width t1 in the third direction which is equal to or narrower than width t2 of fourth semiconductor layer 12-4 in the third direction within the area covered with control gate electrode 18-CG to separate floating gate electrodes 16-FG1 and 16-FG2 of memory cells MC connected in series in first, second, third, and fourth NAND strings S1, S2, S3, and S4.

Due to the separation process of floating gate electrodes 16-FG1 and 16-FG2 of memory cells MC, the cross-sectional shape of insulating layer 14*a* in the third direction changes. The cross-sectional shape has sharp corners (as in FIG. 34) in the area covered with control gate electrode 18-CG while having round corners (as in FIG. 35) in the area not covered with control gate electrode 18-CG.

With the above structure, a manufacturing method which can skip a shrinking step (isotropy etching) of insulating layer 14*a* as a hard mask layer can be achieved. The details will be described below. The initial thickness of insulating layer 14*a* can be reduced and the width of insulating layer 14*a* in the third direction can be formed with high accuracy.

Materials

As in the first embodiment, materials used for the above VG-FG type VLB may be selected arbitrarily from those suitable for respective generations of semiconductor memories. Since the examples of such materials have already been explained in detail in the first embodiment section, repetition is avoided here.

Note that interelectrode insulating layer 20 is different from interelectrode insulating layer 17 in material respect, and should preferably be formed of a material allowing charge transfer between first and second floating gate electrodes 16-FG1 and 16-FG2. For example, interelectrode insulating layer 20 functions as a tunnel insulating layer (for example, a silicon oxide layer) as with the case of gate insulating layer 15.

Example of Manufacturing Method

FIGS. 36 to 45 show the example of the manufacturing method of the VG-FG type VLB in FIGS. 32 to 35.

Initially, as shown in FIG. 36, gate insulating layers (tunnel insulating layers) 15 are formed on the surfaces of first, second, third, and fourth semiconductor layers 12-1, 12-2, 12-3, and 12-4 in the third direction in fin structure Fin in line with the processes described in the first example of the manufacturing method section (with reference to FIGS. 5 to 11) of the first embodiment.

Here, the structural elements formed in line with the processes shown in FIGS. 5 to 11 are referred to by the same reference numbers in FIG. 36.

Next, as shown in FIG. 12, the entire surface of fin structure Fin is covered with first conductive layer 16 used as a polycrystalline silicon layer by, for example, a CVD method. First conductive layer 16 completely fills the space between two fin structures Fin adjacent to each other in the third direction.

Furthermore, the upper surface of first conductive layer 16 is flattened out by, for example, CMP. At that time, the upper surface of insulating layer 14a may be used as the endpoint for the CMP.

Note that the CMP is performed in consideration of a selection transistor formed together with the memory cell. For the same reason stated in the first embodiment section, the CMP may be omitted.

Then, first floating gate electrodes 16-FG1 are formed in recesses in fin structure Fin by performing RIE for first conductive layer 16 as shown in FIG. 37. That is, first floating gate electrodes 16-FG1 are separated from each other in upward-downward direction (the first direction) by insulating layers 13 in the self-alignment manner.

Figure 38:
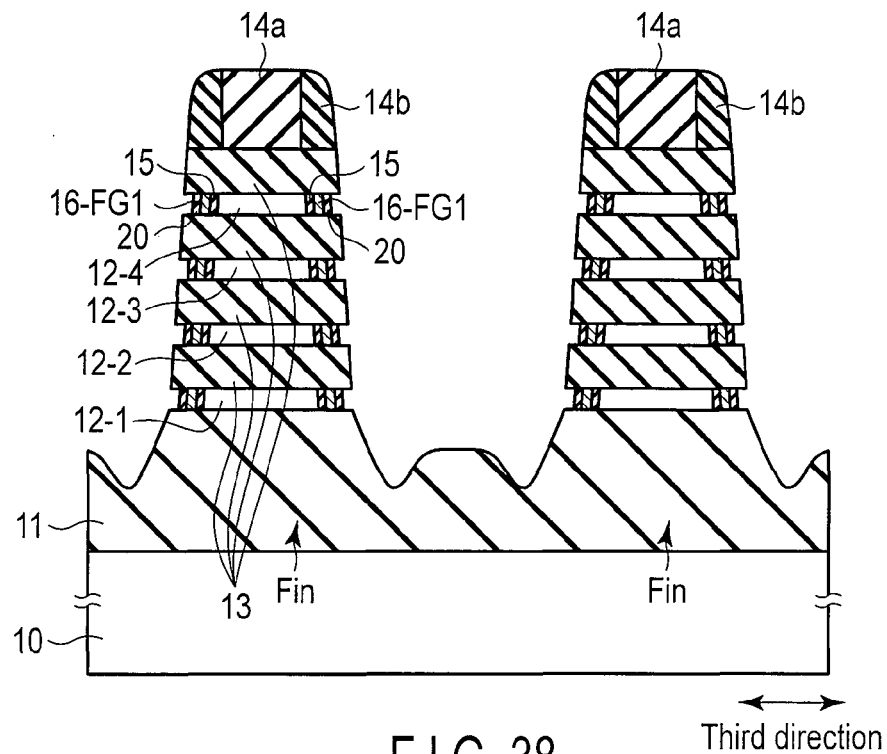

Next, as shown in FIG. 38, interelectrode insulating layers (tunnel insulating layers) 20 are formed on first floating gate electrodes 16-FG1, that is, surfaces of first floating gate electrodes 16-FG1 by the SPA plasma generating technique.

Figure 39:
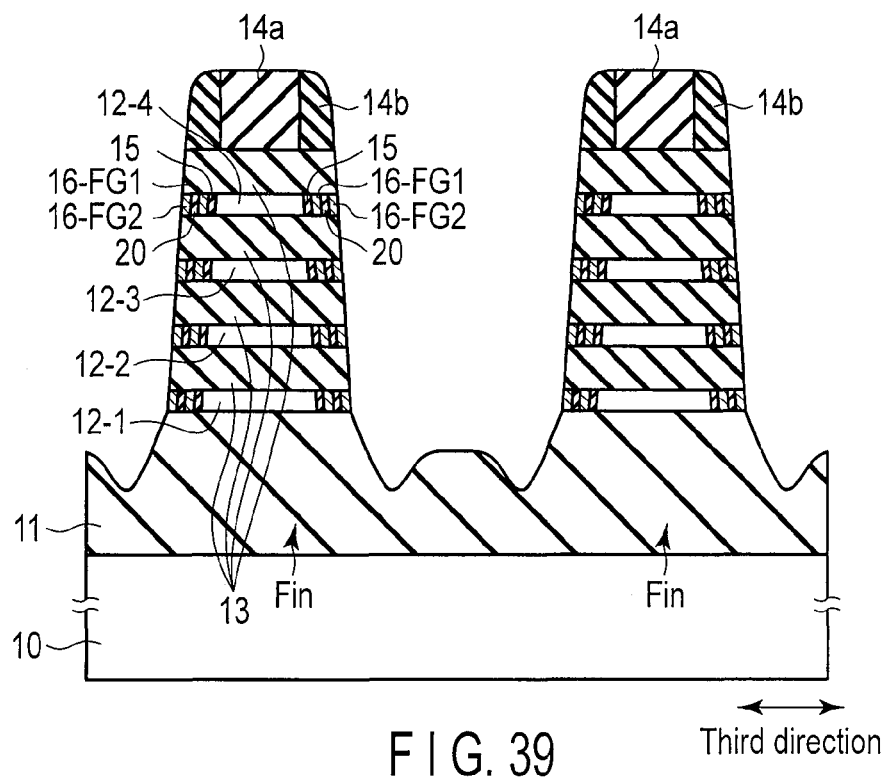

Then, as shown in FIG. 39, second floating gate electrodes 16-FG2 are formed in line with the process used to form first floating gate electrodes 16-FG1 as in FIG. 36. Second floating gate electrodes 16-FG2 are, as with first floating gate electrodes 16-FG1, separated from each other in upward-downward direction (the first direction) by insulating layers 13 in the self-alignment manner.

Note that, at this point of time, in the recesses of fin structure Fin, first and second floating gate electrodes 16-FG1 and 16-FG2 extend in the second direction which is drawn perpendicularly to FIG. 39 and they are still connected to each other when they are considered as one semiconductor layer (one NAND string).

Then, as shown in FIG. 40, the surfaces of insulating layers 13 in the third direction are recess-etched by, for example, wet etching or isotropy dry etching using $HF/NH_3$ gas.

Here, amount y of shrink (etching width) of insulating layers 13 should preferably be set to such a value that the surfaces of insulating layers 13 in the third direction come outside the surface at the gate insulating layer 15 side out of the two surfaces of floating gate electrodes 16-FG1 in the third direction.

Next, as shown in FIG. 41, side wall mask layer 14b is removed selectively by, for example, isotropy etching. As a result, hard mask layer 14a having a predetermined width suitable for separating first and second floating gate electrodes 16-FG1 and 16-FG2 remains alone on insulating layers 13.

That is, by the above step, the same advantage obtained by conventional hard mask layer shrinking techniques can be achieved. Furthermore, since the shrinking step of a hard mask layer (an integrated mask) performed conventionally can be skipped, the initial thickness of hard mask layer 14a can be reduced and the width thereof can be set with high accuracy.

Furthermore, by the above step, first and second floating gate electrodes 16-FG1 and 16-FG2 in a single NAND string (one layer extending in the second direction) can be separated securely memory cell by memory cell during patterning of the control gate as described below.

Next, as shown in FIG. 42, interelectrode insulating layer 17 used for covering the entire surface of fin structure Fin is prepared by, for example, the CVD method. Then, second conductive layer 18a used for covering fin structure Fin and completely filling the space between fin structures Fin.

Here, as shown in FIG. 43, the upper surface of second conductive layer 18a and a part of interelectrode insulating layer 17 are polished by the CMP. At that time, the upper surface of hard mask layer 14a may be used as the endpoint for the CMP.

Then, second conductive layer (for example, a metal layer) 18b is formed on second conductive layer 18a by, for example, the CVD.

Furthermore, if need be, the upper surface of second conductive layer 18b (the surface in the first direction) may be flattened out by the CMP. In that case, the CMP should preferably be performed after forming the insulating layer such as a silicon oxide layer on second conductive layer 18b.

Figure 45:
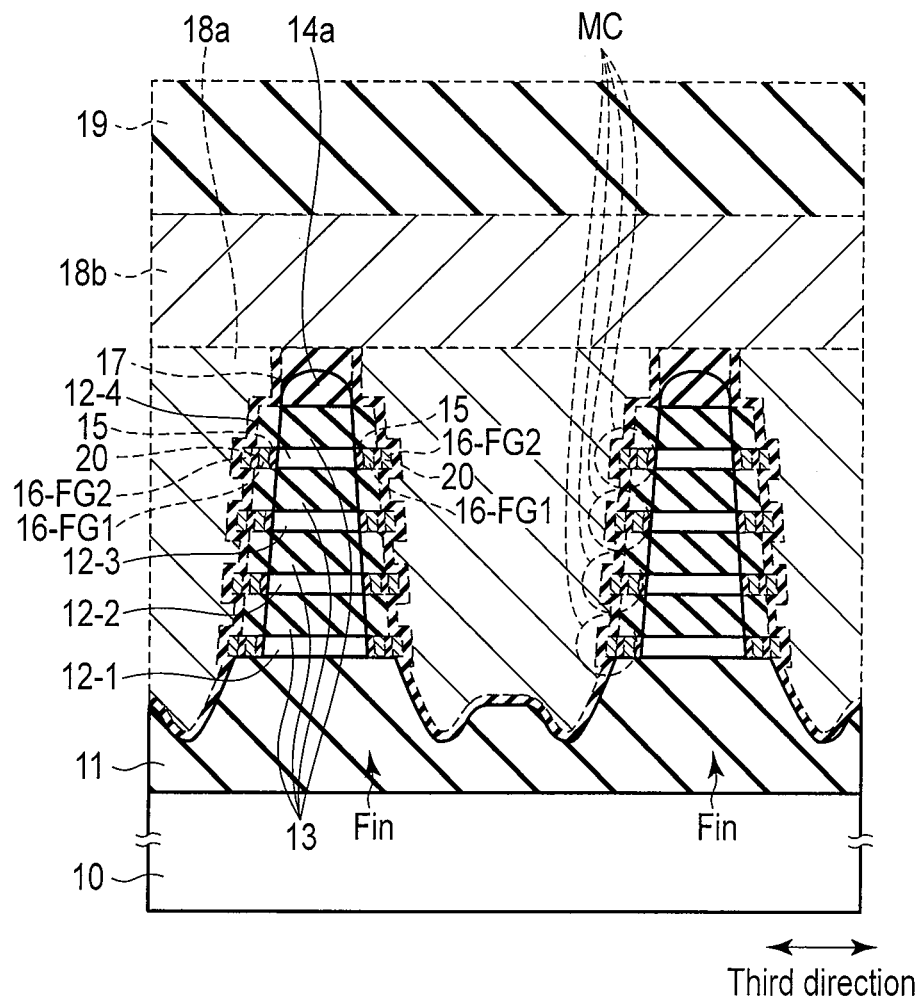

Next, as shown in FIGS. 44 and 45, resist patterns 19 are formed on second conductive layers 18b by the PEP. Control gate electrodes 18-CG are patterned using resist patterns 19 as masks.

Resist patterns 19 used for patterning include line and space patterns extending in the third direction. Thus, first and second conductive layers 16 and 18 and interelectrode insulating layer 17 within the area not covered with resist patterns 19 are removed completely.

At the same time, first and second floating gate electrodes 16-FG1 and 16-FG2 within the area not covered with resist patterns 19 are removed as well. That is, in a single NAND string, first and second floating gate electrodes 16-FG1 and 16-FG2 composing a single layer extending in the second direction are separated from each other memory cell by memory cell by this step.

Note that, even in the area not covered with resist patterns 19, first, second, third, and fourth semiconductor layers 12-1, 12-2, 12-3, and 12-4 and insulating layers 11 and 13 which are covered with hard mask layers 14a are not removed.

Furthermore, during the patterning process of control gate electrodes 18-CG, hard mask layers 14a within the area not covered with resist patterns 19 are etched to a certain extent while functioning as masks. As a result of that, the cross-sectional shape of hard mask layers 14a has round portions within the area not covered as shown in FIGS. 44 and 45.

Thus, when the cross-sectional shape of hard mask layer 14a in the third direction shapes corner portions in the area covered with resist patterns 19 and control gate electrodes 18b, the accuracy of separating floating gate electrodes 16-FG1 and 16-FG2 memory cell by memory cell can be improved.

When the cross-sectional shape of hard mask layer 14a in the third direction shapes round portions in the area not covered with resist patterns 19 and control gate electrodes 18b, facility to fill a space between word lines (control gate electrodes 18-CG) with an interlayer insulating layer can be improved as described below.

After that, resist patterns 19 are removed.

Lastly, although this is not shown, the space between control gate electrodes 18-CG having line and space patterns is filled with an interlayer insulating layer (for example, a silicon oxide layer) by, for example, the CVD.

The VG-FG type VLB in FIGS. 32 to 35 is manufactured by the above-described processes.

Third Embodiment

The feature of this example is in an electrode passing through first, second, third, and fourth semiconductor layers (layered channel active areas) in a fin structure. The electrode improves efficiency of a data erase operation for memory cells (extracting a charge from floating gate electrodes).

Note that the present embodiment can be used in combination with the first and second embodiments and every embodiment described hereinafter.

Structure

Figure 46:
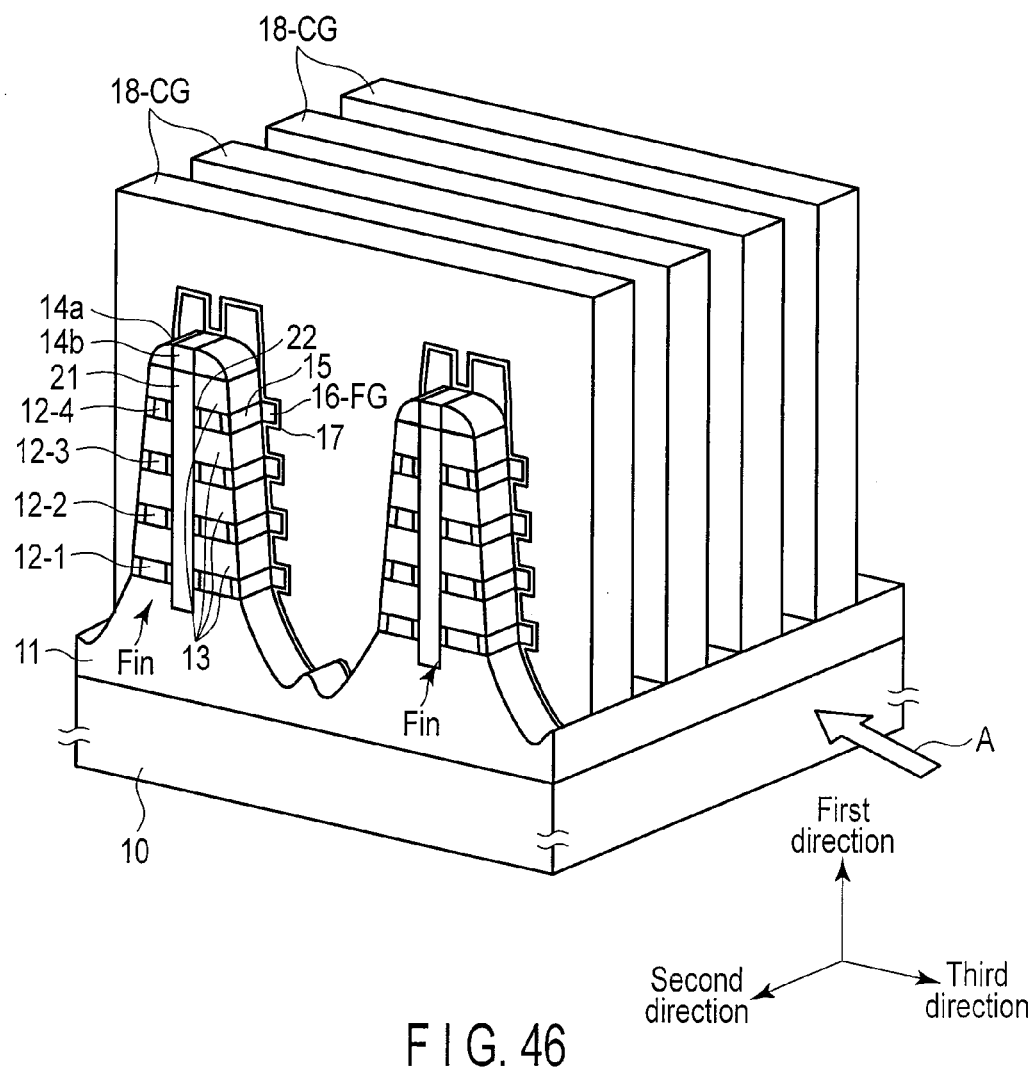
FIG. 46 is a perspective view showing a third embodiment.
Figure 49:
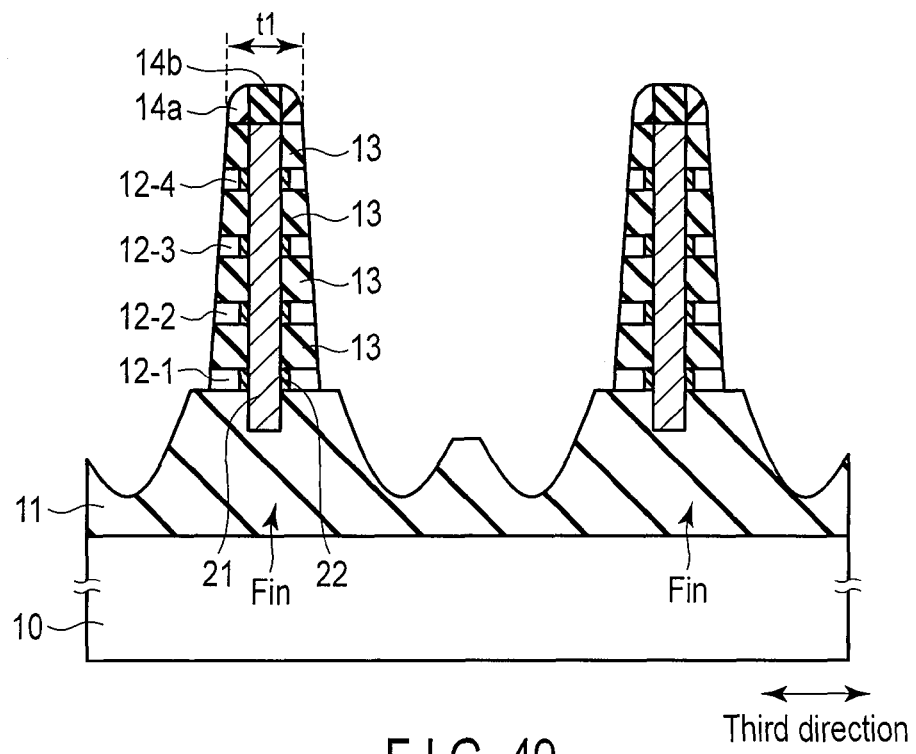
FIG. 49 is a cross-sectional view taken along line XLIX-XLIX in FIG. 47.
Figure 50:
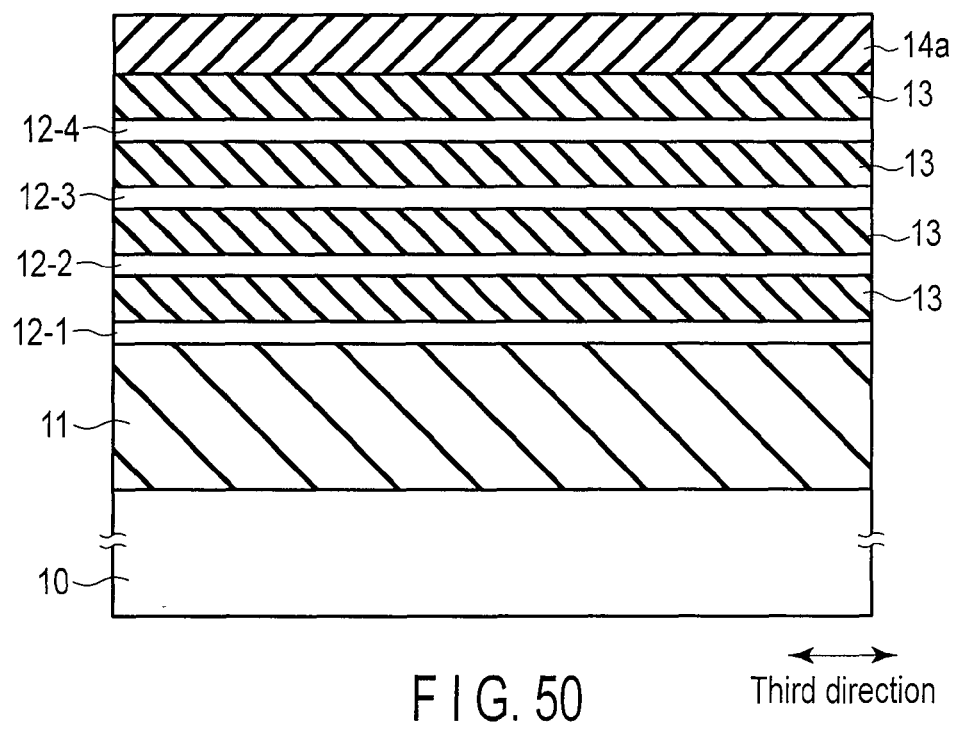

FIG. 46 shows the structure of the VG-FG type VLB. FIG. 47 is a side view showing the structure in FIG. 46 seen along arrow A. FIG. 48 is a cross-sectional view taken along line XLVIII-XLVIII in FIG. 47. FIG. 49 is a cross-sectional view taken along line XLIX-XLIX in FIG. 47.

This embodiment is based on the structure of the above-described first embodiment (the VG-FG type VLB in FIGS. 1 to 4) and technical points different from the structure are explained. That is, elements corresponding to those explained in the first embodiment section are referred to by the same reference numbers and explanation considered redundant is omitted.

On insulating layer 11, first, second, third, and fourth semiconductor layers (active areas) 12-1, 12-2, 12-3, and 12-4 are disposed. First, second, third, and fourth semiconductor layers 12-1, 12-2, 12-3, and 12-4 are insulated from one another by insulating layers 13. Insulating layers 14a and 14b used as hard mask layers are disposed upon insulating layer 13 on fourth semiconductor layer 12-4 which is disposed uppermost among the four semiconductor layers.

Insulating layer 14a contains an oxide or a nitride of an element selected from a group consisting of Al, Hf, Ta, Ti, and W. For example, insulating layer 14a contains aluminum nitride (AlN). Insulating layer 14b may optionally be a silicon oxide layer, silicon nitride layer, or resist layer containing carbon. For example, insulating layer 14b contains a silicon nitride layer.

That is, a material used for insulating layer 14a is different from that used for insulating layer 14b, and in other words, a material used for insulating layer 14a has an etching selection ratio with respect to insulating layer 14b.

In a fin structure Fin, a slit passes through insulating layer 14a used as a hard mask, and first, second, third, fourth semiconductor layers 12-1, 12-2, 12-3, and 12-4 in the first direction.

Insulating layers (for example, silicon oxide layers) 22 cover surfaces of first, second, third, and fourth semiconductor layers 12-1, 12-2, 12-3, and 12-4 in the third direction within the slit. Furthermore, a conductive layer (for example, metal layer and conductive polysilicon layer) 21 is formed within this slit.

The upper surface of conductive layer 21 (the surface in the first direction) is at least lower than the surface of insulating layer 14a at semiconductor substrate 10 side (that is, the upper surface of conductive layer 21 is closer to semiconductor substrate 10 as compared to the surface of conductive layer 21). Insulating layer 14b used as a hard mask is formed on conductive layer 21 within the slit. In this embodiment, the upper surface of insulating layer 14b is lower than the upper surface of insulating layer 14a; however, both surfaces may be set at the same level.

Conductive layer 21 functions, for example, as an erasure electrode to which positive voltage is applied in the data erase operation of memory cells MC in fin structure Fin for better erasure efficiency.

Memory cells MC in first, second, third, and fourth NAND strings S1, S2, S3, and S4 each include gate insulating layer (tunnel oxidation layer) 15, floating gate electrode 16-FG, interelectrode insulating layer 17, and control gate electrode 18-CG on the surfaces of first, second, third, and fourth semiconductor layers 12-1, 12-2, 12-3, and 12-4 in a third direction which is perpendicular to the first and second directions.

The first conductive layers of floating gate electrodes 16-FG are independent from any memory cell MC in first, second, third, and fourth NAND strings S1, S2, S3, and S4.

Furthermore, in the present embodiment, the width of first, second, third, and fourth semiconductor layers 12-1, 12-2, 12-3, and 12-4 in the third direction is narrower than that of insulating layers 13 in the third direction, and floating gate electrodes 16-FG of memory cells MC are stored in recesses between insulating layers 13.

Control gate electrode 18-CG includes a second conductive layer (for example, a conductive polysilicon layer) which extends in the first direction along the surface of first, second, third, and fourth semiconductor layers 12-1, 12-2, 12-3, and 12-4 in the third direction and is shared with first, second, third, and fourth NAND strings S1, S2, S3, and S4.

Here, in the present embodiment, as described in the first embodiment section, insulating layers 14a and 14b used as hard masks have total width t1 in the third direction which is equal to or narrower than width t2 of fourth semiconductor layer 12-4 in the third direction within the area covered with control gate electrode 18-CG to separate floating gate electrode 16-FG of the memory cells MC connected in series in first, second, third, and fourth NAND strings S1, S2, S3, and S4.

Due to the separation process of floating gate electrode 16-FG of memory cells MC, the cross-sectional shape of insulating layer 14a in the third direction changes. The cross-sectional shape has sharp corners (as in FIG. 48) in the area covered with control gate electrode 18-CG while having round corners (as in FIG. 49) in the area not covered with control gate electrode 18-CG.

With the above structure, a manufacturing method which can skip a shrinking step (isotropy etching) of insulating layer 14a as a hard mask layer can be achieved. The details will be described below. The initial thickness of insulating layer 14a can be reduced and the width of insulating layer 14a in the third direction can be formed with high accuracy.

Materials

As in the first embodiment, materials used for the above VG-FG type VLB may be selected arbitrarily from those suitable for respective generations of semiconductor memories. Since the examples of such materials have already been explained in detail in the first embodiment section, repetition is avoided here. Note that conductive layer 21 contains a metal layer and conductive polysilicon layer. For example, conductive layer 21 contains the same material used in floating gate electrode 16-FG.

Example of Manufacturing Method

FIGS. 50 to 58 show the example of the manufacturing method of the VG-FG type VLB in FIGS. 46 to 49.

Initially, as shown in FIG. 46, a p type or n type silicon substrate whose plane orientation (100) and relative resistance 10 to 20 Ωcm is prepared as semiconductor substrate 10, for example. On semiconductor substrate 10, insulating layers 11 and 13 as silicon oxide layers and first, second, third, and fourth semiconductor layers 12-1, 12-2, 12-3, and 12-4 as polycrystalline silicon layers are formed alternately. Then, insulating layer 14a as a hard mask layer (for example, aluminum nitride layer) is formed on insulating layers 13.

Now, as shown in FIG. 51, a resist pattern is formed on insulating layer 14a by the PEP. Then, insulating layer 14a is patterned by RIE using the resist pattern as a mask. The width of insulating layer 14a in the third direction is set to a value suitable for the separation process of the floating gate electrode described below. Furthermore, insulating layer 14a has a slit which is parallel with the surface of semiconductor substrate 10 and extending in the second direction (which is drawn perpendicularly to FIG. 51) orthogonal to the third direction. After that, the resist pattern is removed.

Then, as shown in FIG. 52, resist pattern 23 is formed on insulating layers 13 and 14a by the PEP. Resist pattern 23 has openings corresponding to slits in insulating layer 14a. Then, insulating layer 13 and first, second, third, and fourth semiconductor layers 12-1, 12-2, 12-3, and 12-4 are etched by RIE using insulating layer 14a and resist pattern 23 as masks.

As a result, as shown in FIG. 53, a slit is formed passing through insulating layer 13 and first, second, third, and fourth semiconductor layers 12-1, 12-2, 12-3, and 12-4.

Next, as shown in FIG. 54, insulating layers (for example, silicon oxide layers) 22 are formed by, for example, thermal oxidation, in the slit to fit on the surfaces of first second, third, and fourth semiconductor layers 12-1, 12-2, 12-3, and 12-4 in the third direction.

Then, conductive layers (for example, conductive polysilicon layers) 21 to fill the slit are formed on insulating layers 13 and 14a by, for example, an LPCVD method. Furthermore, as shown in FIG. 56, conductive layers 21 are etched to only reside within the slit.

Here, after being etched back, the upper surface of conductive layer 21 (the surface in the first direction of layered first, second, third, and fourth semiconductor layers 12-1, 12-2, 12-3, and 12-4) is set to be lower than the upper surface of insulating layer 14a used as a hard mask layer, and preferably, be in proximity to the upper surface of insulating layer 13 which is disposed uppermost among the other insulating layers 13.

Next, as shown in FIG. 57, insulating layer 14b is formed on uppermost insulating layer 13 to cover insulating layer 14a. Insulating layer 14b may optionally be a silicon oxide layer, silicon nitride layer, or resist layer containing carbon. If insulating layer 14a is an aluminum nitride layer, insulating layer 14b should preferably be a silicon nitride layer.

Then, insulating layer 14b is etched by anisotropy etching to reside within the slit and side walls of insulating layer 14a used as a hard mask. As a result of that, insulating layer 14b becomes a side wall mask layer.

Next, as shown in FIG. 58, insulating layer 13, fourth semiconductor layer 12-4, insulating layer 13, third semiconductor layer 12-3, insulating layer 13, second semiconductor layer 12-2, insulating layer 13, and first semiconductor layer 12-1 are etched in the order stated by anisotropy etching using hard mask layer 14a and side wall mask layer 14b as masks. At that time, a part of insulating layer 11 as the device separation insulating layer is also etched.

Consequently, a fin structure Fin is formed.

The processes performed thereafter are the same as those of the first embodiment (refer to FIGS. 10 to 20), and detailed explanations are omitted.

The VG-FG type VLB in FIGS. 46 to 49 is manufactured by the above-described processes.

Note that, in this manufacturing method, conductive layer 21 as an erasure electrode can be formed with merely one additional PEP step as compared to the manufacturing method of the first embodiment. Furthermore, conductive layer 21 used as an erasure electrode can improve efficiency in the erase operation.

Fourth Embodiment

The present embodiment features floating gate electrodes and control gate electrodes disposed alternately in the second direction in which fin structure extends.

In this case, two control gate electrodes cover two side surfaces of one floating gate electrode in the second direction. Thus, as compared to the first embodiment, a facing area between the control gate electrode and the floating gate electrode is increased, and as a result of that, charge amount in the floating gate electrode can be controlled by the control gate electrodes with higher controllability.

Structure

Figure 59:
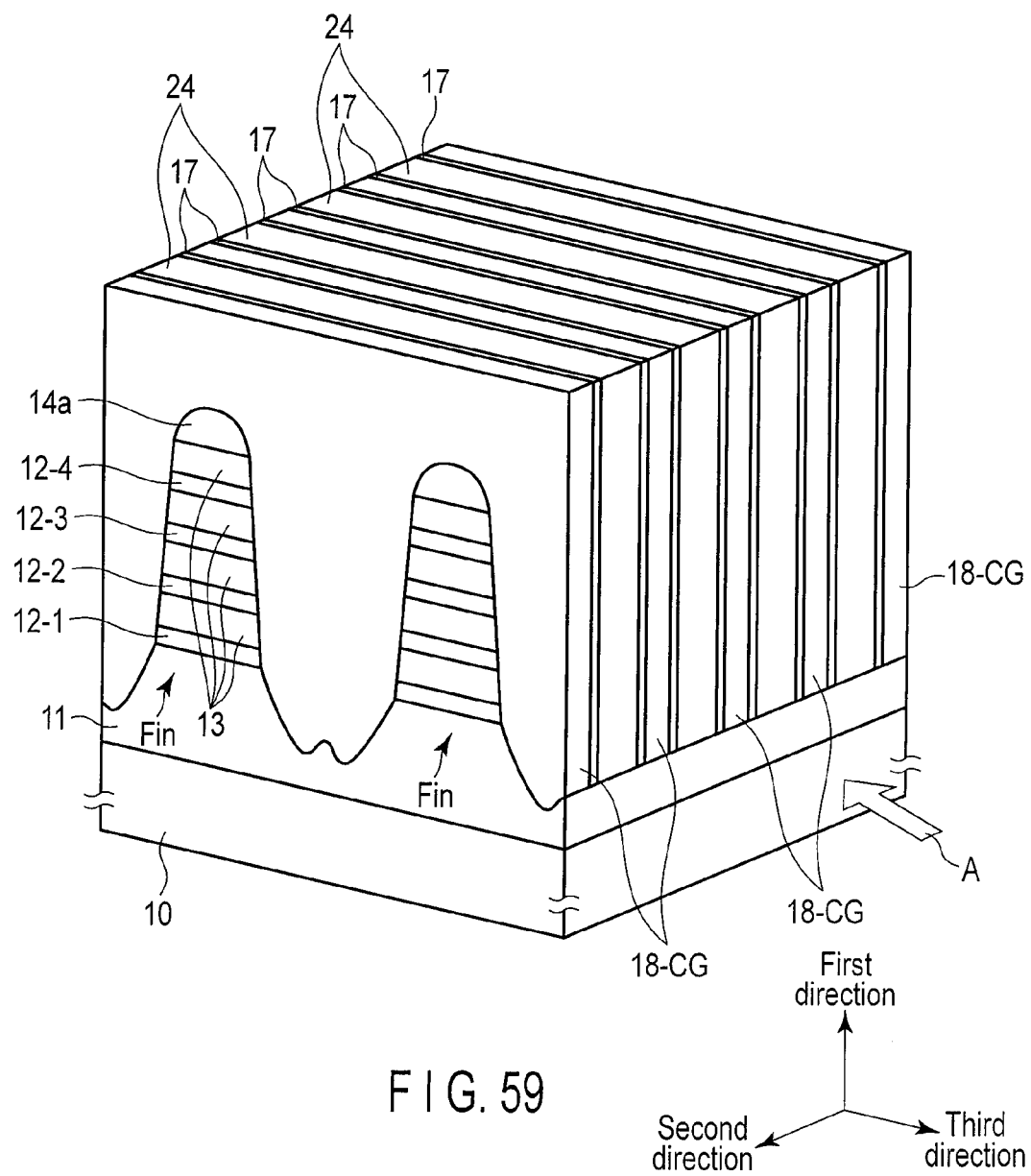
FIG. 59 is a perspective view showing a fourth embodiment.
Figure 60:
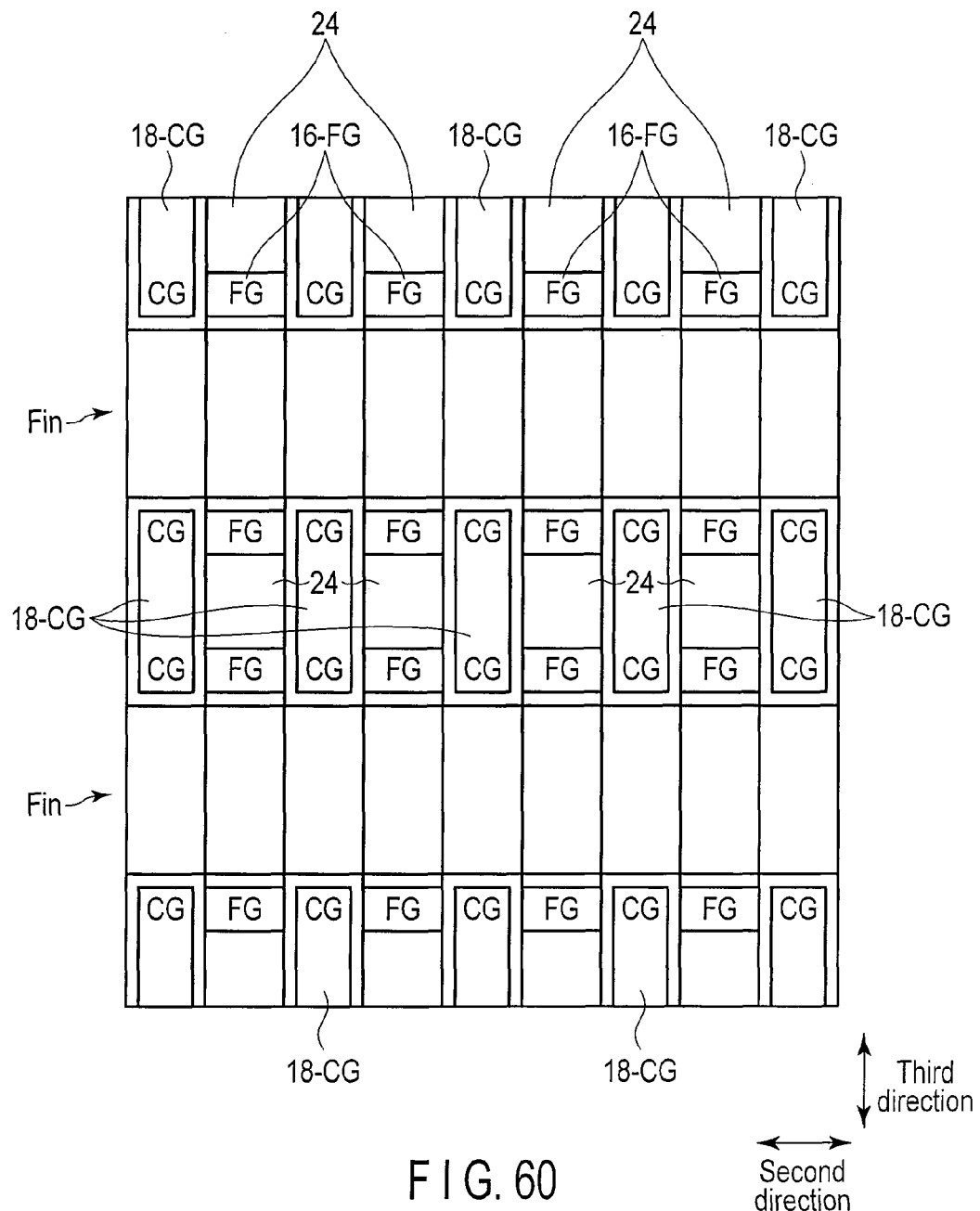
FIG. 60 is a plane view showing the structure in FIG. 59.
Figure 61:
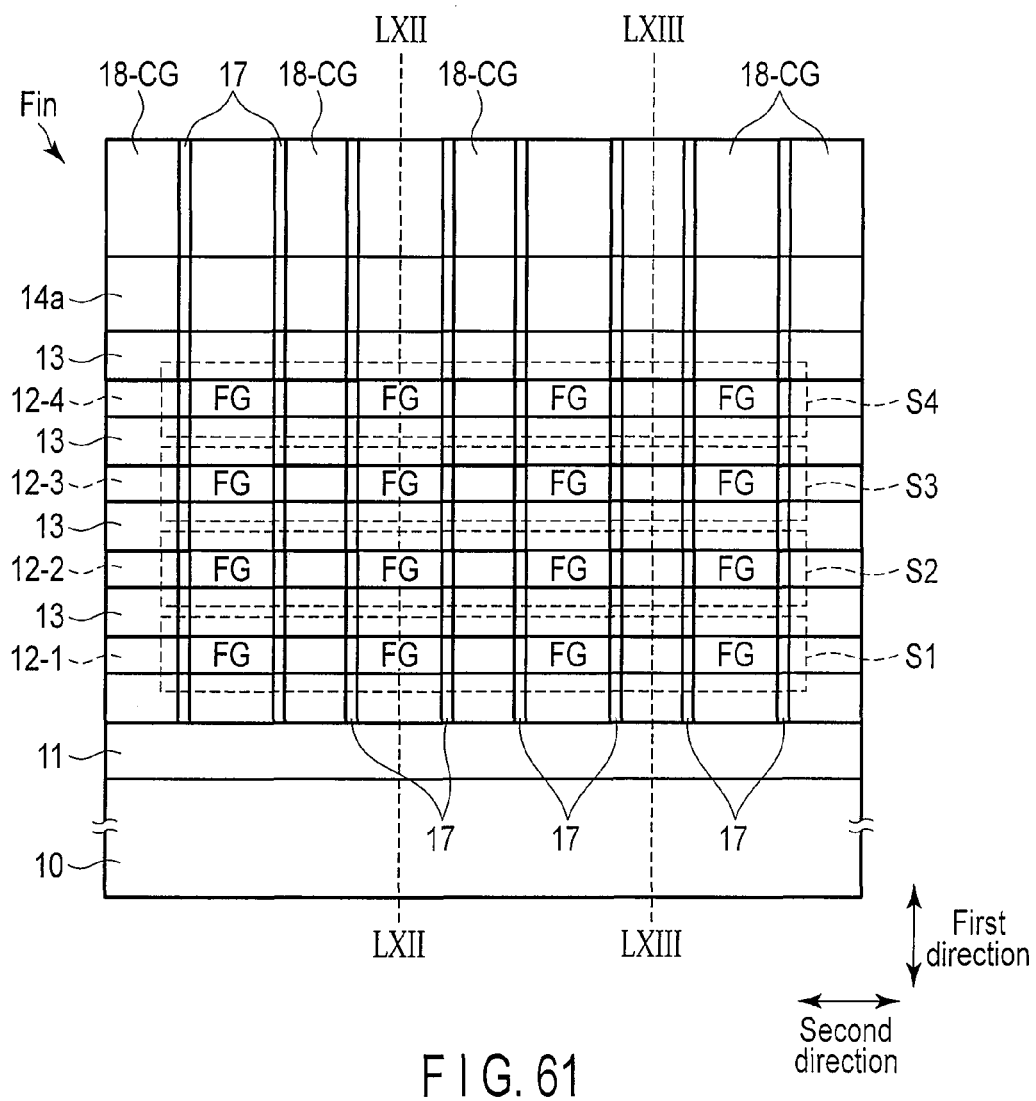
FIG. 61 is a side view seen along arrow A in FIG. 59.
Figure 63:
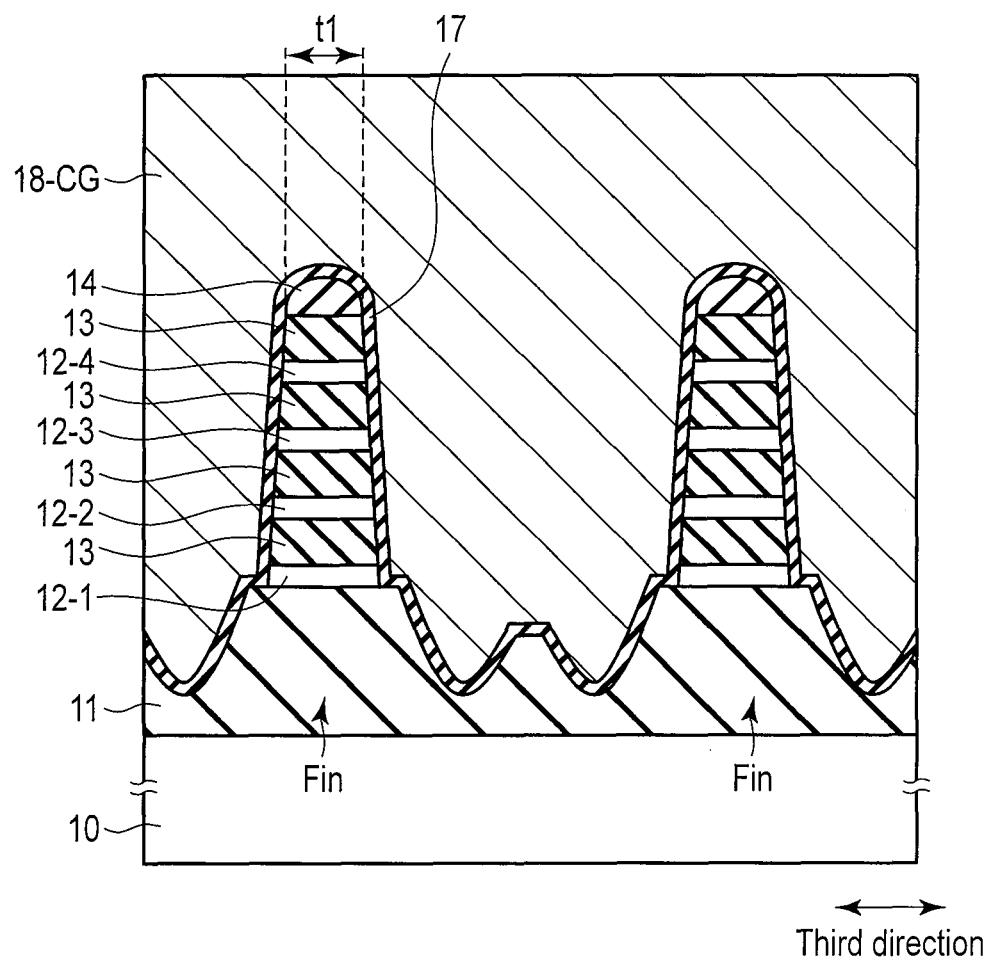
FIG. 63 is a cross-sectional view taken along line LXIII-LXIII in FIG. 61.

FIG. 59 shows the structure of the VG-FG type VLB. FIG. 60 is a plane view of the fin structure in FIG. 59. FIG. 61 is a side view showing the structure in FIG. 59 seen along arrow A. FIG. 62 is a cross-sectional view taken along line LXII-LXII in FIG. 61. FIG. 63 is a cross-sectional view taken along line LXIII-LXIII in FIG. 61.

This embodiment is based on the structure of the above-described first embodiment (the VG-FG type VLB in FIGS. 1 to 4) and technical points different from the structure are explained. That is, elements corresponding to those explained in the first embodiment section are referred to by the same reference numbers and explanation considered redundant is omitted.

On insulating layer 11, first, second, third, and fourth semiconductor layers (active areas) 12-1, 12-2, 12-3, and 12-4 are disposed. First, second, third, and fourth semiconductor layers 12-1, 12-2, 12-3, and 12-4 are insulated from one another by insulating layers 13. Insulating layers 14a and 14b used as hard mask layers are disposed upon insulating layer 13 on fourth semiconductor layer 12-4 which is disposed uppermost among the four semiconductor layers. Insulating layer 14a contains an oxide or a nitride of elements selected from a group consisting of Al, Hf, Ta, Ti, and W.

Memory cells MC in first, second, third, and fourth NAND strings S1, S2, S3, and S4 each include gate insulating layer (tunnel oxidation layer) 15, floating gate electrode 16-FG, interelectrode insulating layer 17, and insulating layer 24 on the surfaces of first, second, third, and fourth semiconductor layers 12-1, 12-2, 12-3, and 12-4 in a third direction which is perpendicular to the first and second directions.

The first conductive layers of floating gate electrodes 16-FG are independent from any memory cell MC in first, second, third, and fourth NAND strings S1, S2, S3, and S4.

Furthermore, in the present embodiment, the width of first, second, third, and fourth semiconductor layers 12-1, 12-2, 12-3, and 12-4 in the third direction is narrower than that of insulating layers 13 in the third direction, and floating gate electrodes 16-FG of memory cells MC are stored in recesses between insulating layers 13.

Here, in the present embodiment, interelectrode insulating layer 17 and control gate electrode 18-CG are not disposed on the surface of floating gate electrode 16-FG in the third direction. This is the technical point greatly different from the first embodiment. Interelectrode insulating layer 17 and control gate electrode 18-CG are disposed on two surfaces of floating gate electrode 16-FG in the second direction (the direction to which fin structure Fin extends), respectively.

That is, interelectrode insulating layer 17 and control gate electrode 18-CG in the first embodiment (in FIGS. 1 to 4) are replaced with insulating layer 24 in the present embodiment. Spaces between control gate electrodes 18-CG in the first embodiment are replaced with interelectrode insulating layers 17 and insulating layers 24.

Control gate electrode 18-CG includes a second conductive layer (for example, a conductive polysilicon layer) which extends in the first direction along the surface of first, second, third, and fourth semiconductor layers 12-1, 12-2, 12-3, and 12-4 in the third direction and is shared with first, second, third, and fourth NAND strings S1, S2, S3, and S4.

Here, in the present embodiment, as described in the first embodiment section, insulating layer 14a used as a hard mask has width t1 in the third direction which is equal to or narrower than the width t2 of fourth semiconductor layer 12-4 in the third direction within the area covered with control gate electrode 18-CG to separate floating gate electrode 16-FG of memory cells MC connected in series in first, second, third, and fourth NAND strings S1, S2, S3, and S4.

Due to the separation process of floating gate electrode 16-FG of memory cells MC, the cross-sectional shape of insulating layer 14*a* in the third direction changes. The cross-sectional shape has sharp corners (as in FIG. 62) in the area covered with insulating layer 24 while having round corners (as in FIG. 63) in the area not covered with insulating layer 24 (in the area covered with control gate electrode 18-CG).

With the above structure, a manufacturing method which can skip a shrinking step (isotropy etching) of insulating layer 14*a* as a hard mask layer can be achieved. The details will be described below. The initial thickness of insulating layer 14*a* can be reduced and the width of insulating layer 14*a* in the third direction can be formed with high accuracy.

Materials

As in the first embodiment, materials used for the above VG-FG type VLB may be selected arbitrarily from those suitable for respective generations of semiconductor memories. Since the examples of such materials have already been explained in detail in the first embodiment section, repetition is avoided here.

Note that insulating layer 24 is formed of an insulating layer applicable to an interlayer insulating layer such as a silicon oxide layer.

Example of Manufacturing Method

FIGS. 64 to 68 show the example of the manufacturing method of the VG-FG type VLB in FIGS. 59 to 63.

Figure 64:
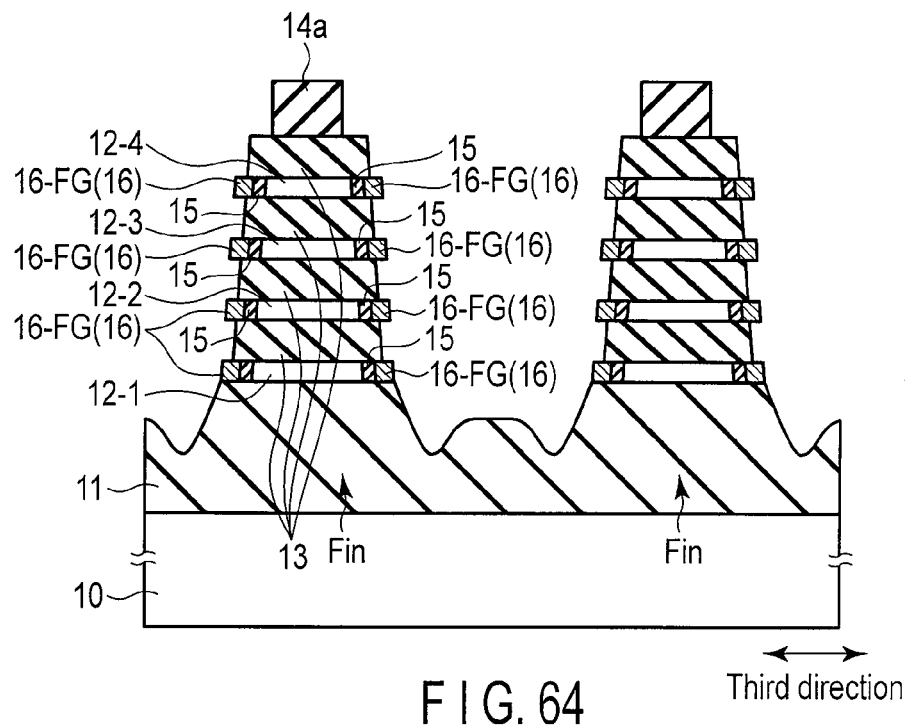

Initially, as shown in FIG. 64, gate insulating layers (tunnel insulating layers) 15, and floating gate electrodes 16-FG which are used as first conductive layers 16 are formed on surfaces of first, second, third, and fourth semiconductor layers 12-1, 12-2, 12-3, and 12-4 in the third direction in fin structure Fin, insulating layers 13 are shrunk, and side wall mask layers 14*b* are removed. These processes are performed in line with the processes performed in the first example of manufacturing method (refer to FIGS. 5 to 15) of the first embodiment.

Here, the structural elements formed in line with the processes shown in FIGS. 5 to 15 are referred to by the same reference numbers in FIG. 64.

Figure 65:
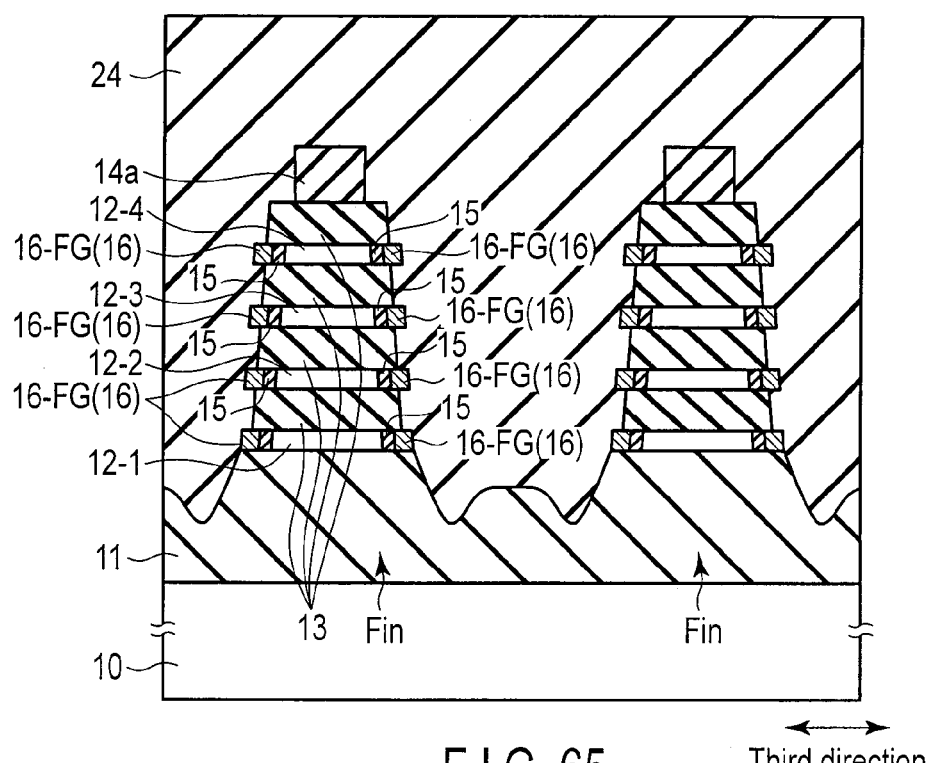

Next, as shown in FIG. 65, the entire surface of fin structure Fin is covered with insulating layer 24 by, for example, a CVD method. Insulating layer 24 completely fills the space between two fin structures Fin adjacent to each other in the third direction. The upper surface of insulating layer 24 is flattened out by, for example, the CMP.

Figure 66:
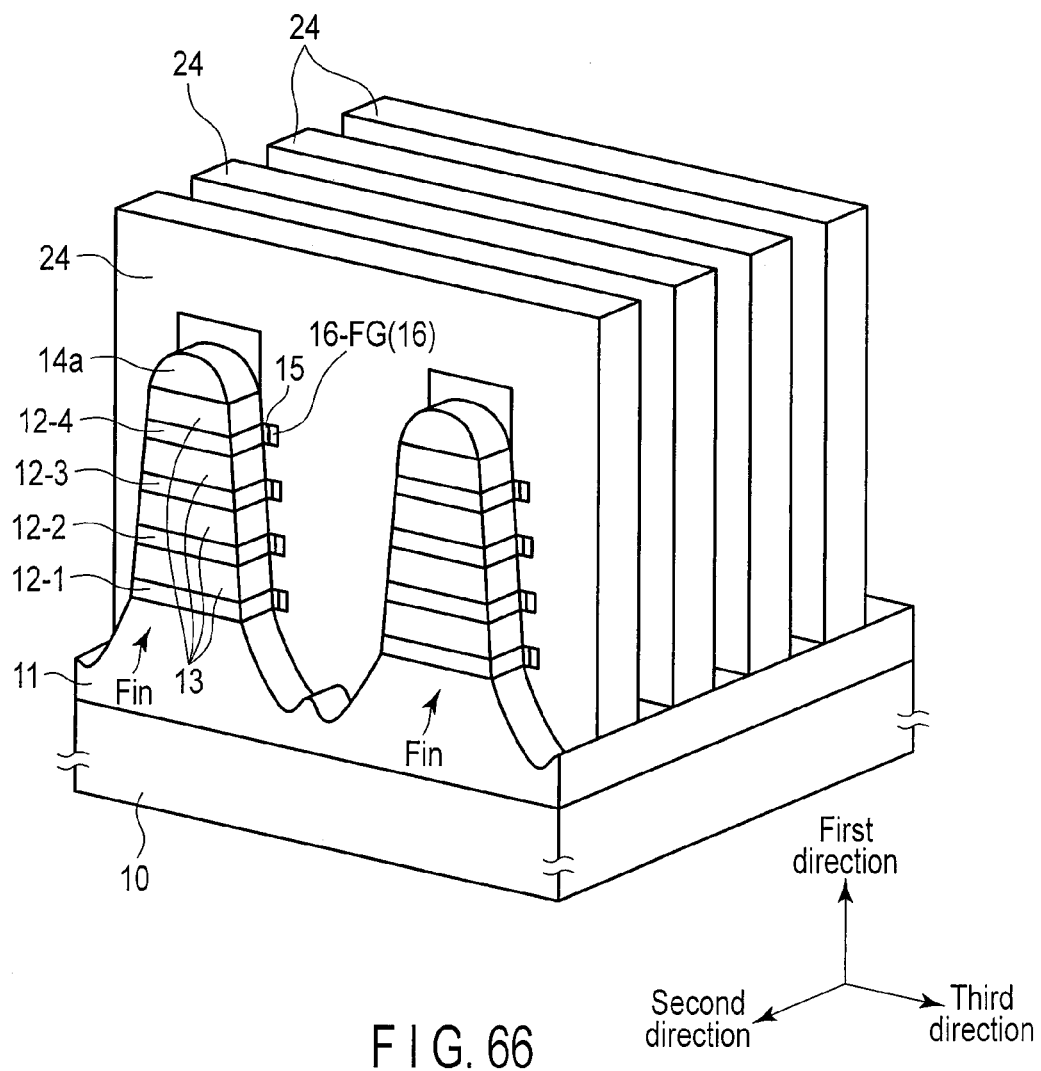

Next, as shown in FIGS. 66 and 67, a resist pattern is formed on insulating layers 24 by the PEP. Insulating layer 24 is patterned using the resist pattern as a mask.

The resist pattern used for patterning includes line and space patterns extending in the third direction. Thus, floating gate electrodes 16-FG within the area not covered with the resist pattern are removed. That is, in a single NAND string, floating gate electrodes 16-FG composing a single layer extending in the second direction are separated from each other memory cell by memory cell by this step.

Note that, even in the area not covered with the resist pattern, first, second, third, and fourth semiconductor layers 12-1, 12-2, 12-3, and 12-4 and insulating layers 11 and 13 which are covered with hard mask layers 14*a* are not removed.

Furthermore, during the patterning process of insulating layer 24, hard mask layers 14*a* within the area not covered with the resist pattern are etched to a certain extent while functioning as masks. As a result of that, the cross-sectional shape of hard mask layers 14*a* has round portions within the area not covered as shown in FIGS. 66 and 67.

After that, the resist pattern is removed.

Figure 68:
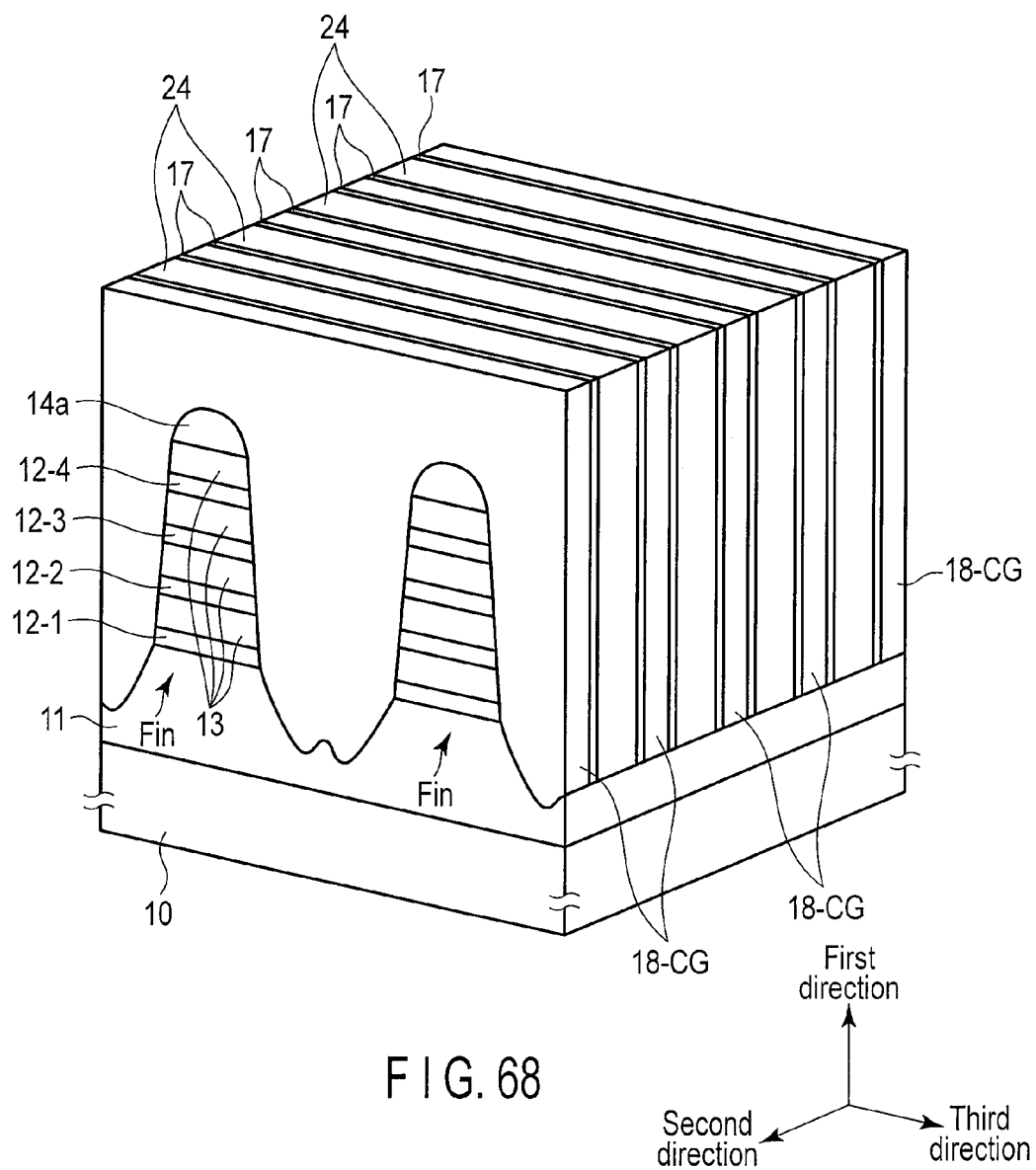

Next, as shown in FIG. 68, interelectrode insulating layer (for example, $SiO_2/Si_3N_4/SiO_2$) 17 used for covering two side surfaces of floating gate electrode 16-FG in the second direction is prepared by, for example, the CVD method. Interelectrode insulating layer 17 further covers the surface of insulating layer 24 in the second direction. Then, control gate electrode 18-CG is formed in spaces between insulating layers 24 for completely filling spaces between fin structures Fin.

Here, interelectrode insulating layer 17 and control gate electrode 18-CG are formed by a damascene process. That is, after being formed in the spaces between insulating layers 24, interelectrode insulating layer 17 and control gate electrode 18-CG are polished by the CMP to only reside within the spaces between insulating layers 24. At that time, the upper surface of insulating layer 24 may be used as the endpoint for the CMP.

Lastly, although this is not shown, the spaces between control gate electrodes 18-CG having line and space patterns are filled with interlayer insulating layers (for example, silicon oxide layers) by, for example, the CVD.

The VG-FG type VLB in FIGS. 59 to 63 is manufactured by the above-described processes.

Fifth Embodiment

The present embodiment features an insulating layer (for example, a silicon nitride layer) functioning as a charge trap to be used as a charge storage layer of a memory cell (VG-MONOS type).

As with the other cases, the separation of the charge storage layers in the direction of extension of the NAND strings (the extension of the fin structure) is necessary for improving the performance in this case. Therefore, structure and manufacturing method described below are effective to improve the performance of a VG-MONOS type VLB.

Structure

Figure 70:
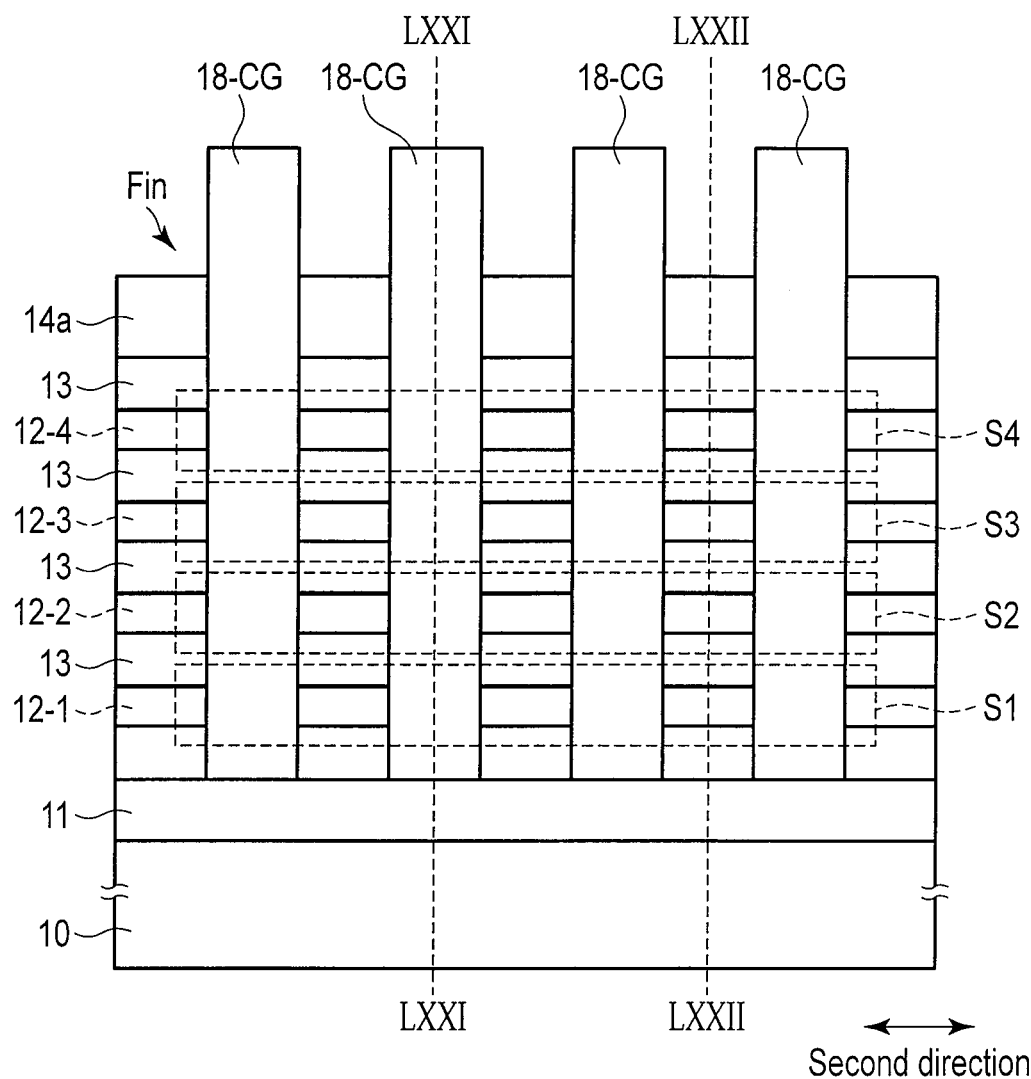
FIG. 70 is a side view seen along arrow A in FIG. 69.
Figure 71:
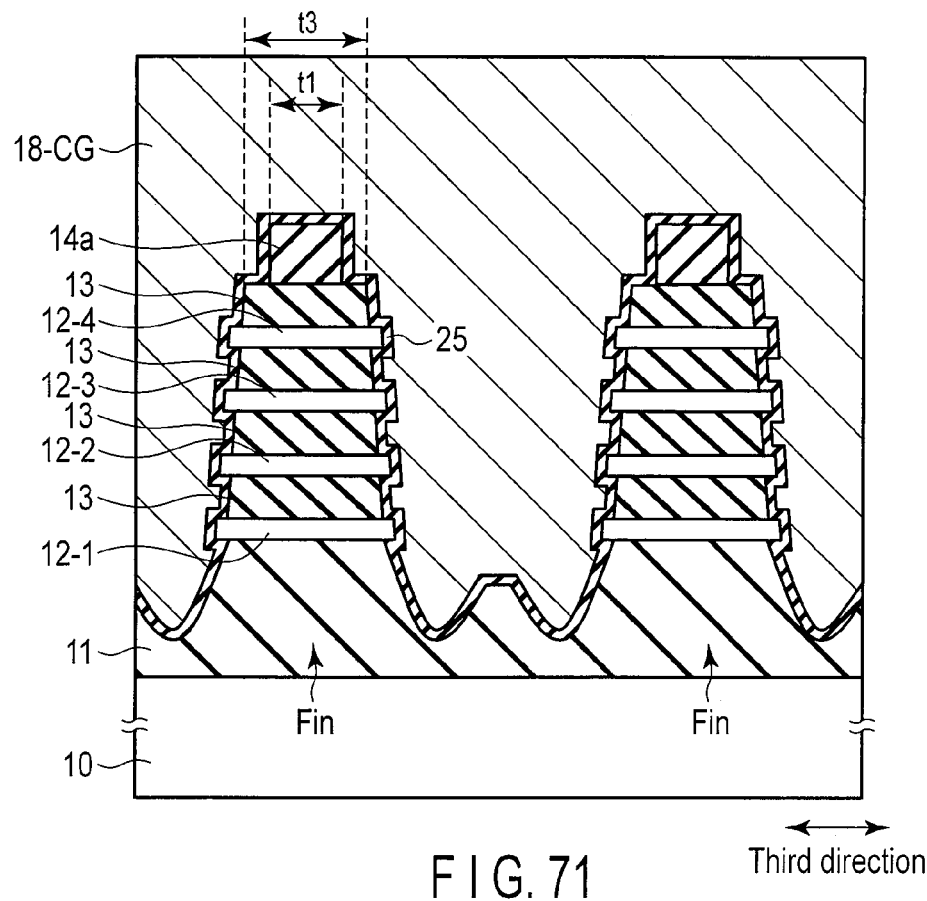
FIG. 71 is a cross-sectional view taken along line LXXI-LXXI in FIG. 70.
Figure 72:
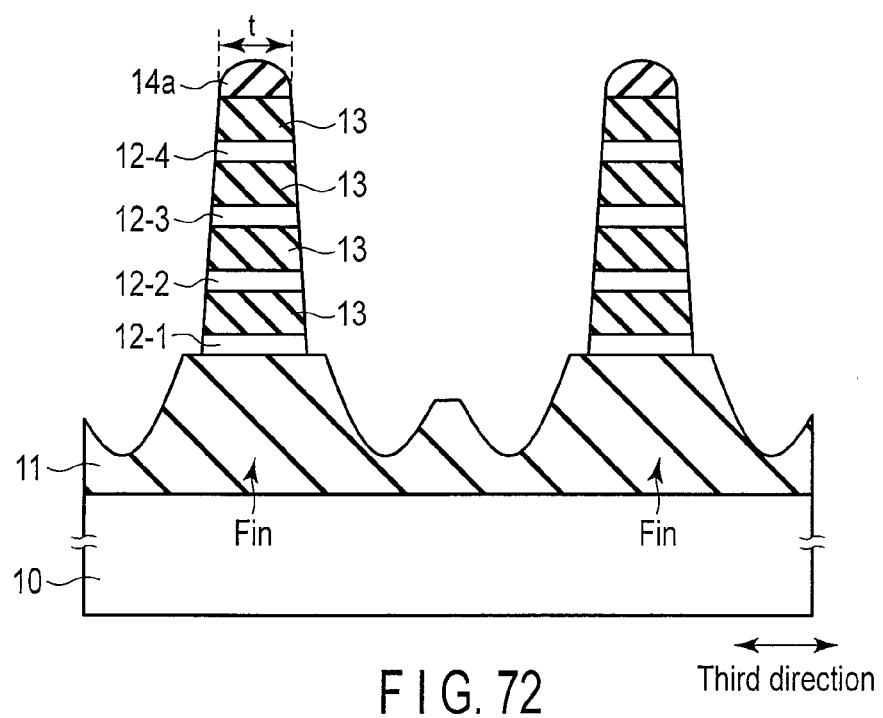
FIG. 72 is a cross-sectional view taken along line LXXII-LXXII in FIG. 70.

FIG. 69 shows the structure of the VG-MONOS type VLB. FIG. 70 is a side view showing the structure in FIG. 69 seen along arrow A. FIG. 71 is a cross-sectional view taken along line LXXI-LXXI in FIG. 70. FIG. 72 is a cross-sectional view taken along line LXXII-LXXII in FIG. 72.

Semiconductor substrate 10 is, for example, a silicon substrate. Insulating layer 11 is, for example, a silicon oxide layer referred to as buried oxide (BOX) and used as a device separation insulating layer.

On insulating layer 11, first, second, third, and fourth semiconductor layers (active areas) 12-1, 12-2, 12-3, and 12-4 are insulated from one another and stacked in the first direction which is perpendicular to the surface of semiconductor substrate 10 while extending in the second direction parallel to the surface of semiconductor substrate 10.

In the present embodiment, the four semiconductor layers are stacked on the insulating layer; however, the structure is not limited thereto and the stack may be of simply two or more semiconductor layers. Since the memory volume increases as the number of stacked semiconductor layers increases, the larger is preferable.

The insulation between first, second, third, and fourth semiconductor layers 12-1, 12-2, 12-3, and 12-4 is performed by insulating layers (for example, silicon oxide layers) 13.

Upon insulating layer 13 on fourth semiconductor layer 12-4 which is disposed uppermost among the four semiconductor layers, insulating layer (upper insulating layer) 14*a* is formed as a hard mask layer. In the present embodiment, insulating layer 14a contains an oxide or a nitride of elements selected from a group consisting of Al, Hf, Ta, Ti, and W. For example, insulating layer 14a contains aluminum nitride (AlN).

A fin structure is composed of first, second, third, and fourth semiconductor layers 12-1, 12-2, 12-3, and 12-4, and insulating layers 13 and 14a. First, second, third, and fourth semiconductor layers 12-1, 12-2, 12-3, and 12-4 should preferably be monocrystalline but may be polycrystalline or amorphous instead.

First, second, third, and fourth NAND strings (memory strings) S1, S2, S3, and S4 use first, second, third, and fourth semiconductor layers 12-1, 12-2, 12-3, and 12-4, respectively, as a channel. First, second, third, and fourth NAND strings S1, S2, S3, and S4 each include memory cells MC connected in series in the second direction.

Memory cells MC in first, second, third, and fourth NAND strings S1, S2, S3, and S4 each include charge trap layered structure 25 and control gate electrode 18-CG on the surfaces of first, second, third, and fourth semiconductor layers 12-1, 12-2, 12-3, and 12-4 in a third direction which is perpendicular to the first and second directions.

Figure 73:
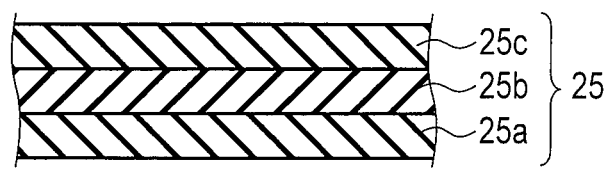
FIG. 73 is a cross-sectional view showing an example of the structure of insulating layer 25.

Charge trap layered structure 25 includes, for example, gate insulating layer (tunnel oxidation layer) 25a, charge trap layer (for example, a silicon nitride layer) 25b, and block insulating layer 25c as shown in FIG. 73. Block insulating layer 25c blocks a leak between charge trap layer 25b and control gate electrode 18-CG.

In charge trap layered structure 25, charge trap layer 25b and block insulating layer 25c are separated from each other memory cell by memory cell in the direction of extension of first, second, third, and fourth NAND strings S1, S2, S3, and S4 (the direction of extension of fin).

In the present embodiment, the width of each of first, second, third, and fourth semiconductor layers 12-1, 12-2, 12-3, and 12-4 in the third direction is wider than that of insulating layers 13 in the third direction, and charge trap layer (charge storage layer) 25b of memory cells MC is formed along projections of first, second, third, and fourth semiconductor layers 12-1, 12-2, 12-3, and 12-4 between insulating layers 13.

Control gate electrode 18-CG extends in the first direction along the surface of first, second, third, and fourth semiconductor layers 12-1, 12-2, 12-3, and 12-4 in the third direction, and is shared with first, second, third, and fourth NAND strings S1, S2, S3, and S4.

Furthermore, control gate electrode 18-CG completely fills a space between two fin structures Fin adjacent in the third direction (filling is confined within the space between the memory cells MC in two adjacent fin structures Fin). Control gate electrode 18-CG, as a whole, extends in the third direction when being viewed from the above of semiconductor substrate 10.

Here, in the below-described manufacturing method of the present embodiment, insulating layer 14a used as a hard mask has width t1 in the third direction which is equal to or narrower than width t3 of uppermost insulating layer 13 in the third direction within the area covered with control gate electrode 18-CG to separate charge trap layer (charge storage layer) 25b of memory cells MC connected in series in first, second, third, and fourth NAND strings S1, S2, S3, and S4.

Due to the separation process of charge trap layer (charge storage layer) 25b of memory cells MC, the cross-sectional shape of insulating layer 14a in the third direction changes. The cross-sectional shape has sharp corners (as in FIG. 71) in the area covered with control gate electrode 18-CG while having round corners (as in FIG. 72) in the area not covered with control gate electrode 18-CG.

In the present embodiment, the four NAND strings are stacked corresponding to four semiconductor layers; however, the structure is not limited thereto and the stack may be of simply two or more NAND strings corresponding to the same number of semiconductor layers.

Furthermore, in the present embodiment, gate insulating layer 25a is removed in the area not covered with control gate electrode 18-CG (as in FIG. 72); however, gate insulating layer 25a may remain in this area on condition that charge trap layer (charge storage layer) 25b is removed from the area.

With the above structure, a manufacturing method which can skip a shrinking step (isotropy etching) of insulating layer 14a as a hard mask layer can be achieved. The details will be described below. The initial thickness of insulating layer 14a can be reduced and the width of insulating layer 14a in the third direction can be formed with high accuracy.

Materials

As in the first embodiment, materials used for the above VG-MONOS type VLB may be selected arbitrarily from those suitable for respective generations of semiconductor memories. Since the examples of such materials have already been explained in detail in the first embodiment section, repetition is avoided here.

Note that charge trap layer (charge storage layer) 25b is formed of a material selected from a groups consisting of silicon nitride (SiN, $Si_3N_4$), silicon oxynitride (SiON), aluminum oxide ($Al_2O_3$), aluminum oxynitride (AlON), hafnium ($HfO_2$), hafnium aluminate ($HfAlO_3$), hafnium nitride (HfON), hafnium nitride aluminate (HfAlON), hafnium silicate (HfSiO), hafnium nitride silicate (HfSiON), lanthanum oxide ($La_2O_3$), and lanthanum alminate ($LaAlO_3$).

Charge trap layer (charge storage layer) 25b may be formed of the above material with modified composite ratio, for example, of silicon nitride having composite ratio of silicon to nitride different from the above.

Gate insulating layer 25a and block insulating layer 25c are formed of the same materials used for gate insulating layer 15 and interelectrode insulating layer 17 in the first embodiment.

Example of Manufacturing Method

FIGS. 74 to 80 show the example of the manufacturing method of the VG-MONOS type VLB in FIGS. 69 to 73.

Figure 74:
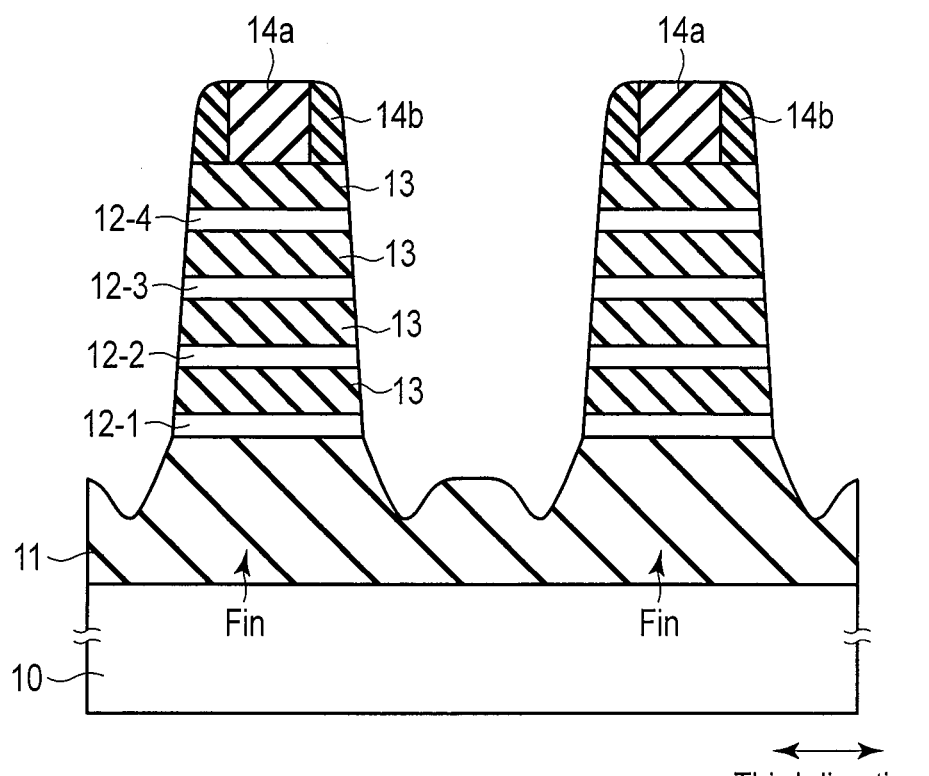

Initially, as shown in FIG. 74, fin structures Fin are prepared in line with the processes described in the first example of the manufacturing method section (with reference to FIGS. 5 to 9) of the first embodiment.

Here, the structural elements formed in line with the processes shown in FIGS. 5 to 9 are referred to by the same reference numbers in FIG. 74.

Then, as shown in FIG. 75, the surfaces of insulating layers 13 in the third direction are recess-etched by, for example, wet etching or isotropy dry etching using $HF/NH_3$ gas.

Here, amount c of shrink (etching width) of insulating layers 13 is necessary to be set to such a value equal to or smaller than width a of side wall mask layer 14b in the third direction. This is, as described below, for securely separating charge trap layer (charge storage layer) 25b of memory cells within the area not covered with control gate electrode.

As a result, projections of first, second, third, and fourth semiconductor layers 12-1, 12-2, 12-3, and 12-4 are formed on the surfaces of fin structures Fin in the third direction.

Then, side wall mask layer 14b is removed.

Thus, as shown in FIG. 76, only hard mask layer 14a having a predetermined width suitable for separating charge trap layer 25b resides on insulating layers 13.

That is, by the above step, the same advantage obtained by conventional hard mask layer shrinking techniques can be achieved. Furthermore, since the shrinking step of a hard mask layer (an integrated mask) performed conventionally can be skipped, the initial thickness of hard mask layer 14a can be reduced and the width thereof can be set with high accuracy.

Furthermore, by the above step, charge trap layer in a single NAND string (one layer extending in the second direction) can be securely separated memory cell by memory cell during patterning the control gate as described below.

Then, as shown in FIG. 76, charge trap layered structure 25 is formed to cover the projections of first, second, third, and fourth semiconductor layers 12-1, 12-2, 12-3, and 12-4. In this embodiment, charge trap layered structure 25 covers the entirety of fin structure Fin.

Then, as shown in FIG. 77, the entire surface of fin structure Fin is covered with conductive layer 18a used as a polycrystalline silicon layer by, for example, the CVD. Conductive layer 18a completely fills a space between two adjacent fin structures Fin arranged in the third direction.

Here, as shown in FIG. 78, the upper surface of conductive layer 18a and a part of charge trap layered structure 25 are polished by the CMP. At that time, the upper surface of hard mask layer 14a may be used as the endpoint for the CMP.

Then, conductive layer (for example, a metal layer) 18b is formed on conductive layer 18a by, for example, the CVD.

Furthermore, if need be, the upper surface of conductive layer 18b (the surface in the first direction) may be flattened out by the CMP. In that case, the CMP should preferably be performed after forming the insulating layer such as a silicon oxide layer on conductive layer 18b.

Next, a resist pattern is formed on conductive layers 18b by the PEP. Control gate electrodes 18-CG (conductive layers 18a and 18b) are patterned using the resist pattern as a mask.

The resist pattern used for patterning includes line and space patterns extending in the third direction.

Thus, as shown in FIGS. 79 and 80, conductive layers 18a and 18b and charge trap layered structure 25 within the area not covered with the resist pattern are removed. That is, in a single NAND string, charge trap layered structure 25 composing a single layer extending in the second direction is separated from each other memory cell by memory cell by this step.

Note that, even in the area not covered with the resist pattern, first, second, third, and fourth semiconductor layers 12-1, 12-2, 12-3, and 12-4 and insulating layers 11 and 13 which are covered with hard mask layers 14a are not removed.

Furthermore, during the patterning process of control gate electrode 18-CG, hard mask layers 14a within the area not covered with the resist pattern are etched to a certain extent while functioning as masks. As a result of that, the cross-sectional shape of hard mask layers 14a has round portions within the area not covered as shown in FIGS. 79 and 80.

When the cross-sectional shape of hard mask layer 14a in the third direction shapes corner portions in the area covered with resist patterns 19 and control gate electrodes 18b, accuracy of separating charge trap layered structure 25 memory cell by memory cell can be improved.

When the cross-sectional shape of hard mask layer 14a in the third direction shapes round portions in the area not covered with resist patterns 19 and control gate electrodes 18b, facility to fill a space between word lines (control gate electrodes 18-CG) with an interlayer insulating layer can be improved as described below.

After that, the resist pattern is removed.

Lastly, although this is not shown, the space between control gate electrodes 18-CG having line and space patterns is filled with an interlayer insulating layer (for example, a silicon oxide layer) by, for example, the CVD.

The VG-MONOS type VLB in FIGS. 69 to 73 is manufactured by the above-described processes.

Application Examples

Now, a VLB for application examples is explained.

FIG. 81 shows the VLB for application examples.

First, second, third, and fourth memory strings are formed on the surface areas of first, second, third, and fourth semiconductor layers 12-1, 12-2, 12-3, and 12-4, respectively within fin structures Fin. The one ends of first, second, third, and fourth memory strings are connected to common source line SL while the other ends are connected to a beam structure 31.

First, second, third, and fourth memory strings include memory cells MC connected in series, block selection transistors SGT interposed between memory cells MC, and assist gate transistors AGT interposed between beam structure 31 and memory cells MC.

Block selection transistor SGT is shared with fin structures Fin in one block BK and includes one select gate line common with fin structures Fin in one block BK.

Assist gate transistor AGT is shared with first, second, third, and fourth memory strings in one fin structure Fin and includes one select gate line common with first, second, third, and fourth memory strings in one fin structure Fin. That is, the select gate line of assist gate transistor AGT is independent in each fin structure Fin.

Beam structure 31 extends in the third direction to prevent a collapse of fin structure Fin. Beam structure 31 includes, similarly to fin structure Fin, first, second, third, and fourth semiconductor layers 12-1, 12-2, 12-3, and 12-4 and insulating layers 11, 13, and 14. At the one end of beam structure 31 in the third direction, first, second, third, and fourth layer selection transistors LST are disposed.

First, second, third, and fourth layer selection transistors LST use first, second, third, and fourth semiconductor layers 12-1, 12-2, 12-3, and 12-4 as channels, and select one of first, second, third, and fourth semiconductor layers 12-1, 12-2, 12-3, and 12-4.

First, second, third, and fourth layer selection transistors LST are arranged in the third direction, and include first, second, third, and fourth select gate electrodes 33-1, 33-2, 33-3, and 33-4 disposed with certain pitches P in the order stated from a contact plug (common electrode) 32 side.

First, second, third, and fourth select gate electrodes 33-1, 33-2, 33-3, and 33-4 at least extend in the first direction along the surfaces of first, second, third, and fourth semiconductor layers 12-1, 12-2, 12-3, and 12-4 in the second direction.

In this example, first, second, third, and fourth select gate electrodes 33-1, 33-2, 33-3, and 33-4 cover the upper surface of beam structure 31 in the first direction and two side surfaces thereof in the second direction. That is, layer selection transistors LST are formed in a double gate structure.

Furthermore, first layer selection transistor LST including first select gate electrode 33-1 has a normally-on channel in first semiconductor layer 12-1. That is, first layer selection transistor LST including first select gate electrode 33-1 is normally on in first semiconductor layer 12-1 and is on/off controllable in second, third, and fourth semiconductor layers 12-2, 12-3, and 12-4.

Second layer selection transistor LST including second select gate electrode 33-2 has a normally-on channel in second semiconductor layer 12-2. That is, second layer selection transistor LST including second select gate electrode 33-2 is normally on in second semiconductor layer 12-2 and is on/off controllable in first, third, and fourth semiconductor layers 12-1, 12-3, 12-4.

Third layer selection transistor LST including third select gate electrode 33-3 has a normally-on channel in third semiconductor layer 12-3. That is, third layer selection transistor LST including third select gate electrode 33-3 is normally on in third semiconductor layer 12-3 and is on/off controllable in first, second, and fourth semiconductor layers 12-1, 12-2, and 12-4.

Fourth layer selection transistor LST including fourth select gate electrode 33-4 has a normally-on channel in fourth semiconductor layer 12-4. That is, fourth layer selection transistor LST including fourth select gate electrode 33-4 is normally on in fourth semiconductor layer 12-4 and is on/off controllable in first, second, and third semiconductor layers 12-1, 12-2, and 12-3.

Note that the normally-on channels of first, second, third, and fourth semiconductor layers 12-1, 12-2, 12-3, and 12-4 can be formed of n-type impurity (pentavalent element such as arsenic and phosphorus), p-type impurity (trivalent element such as boron and indium), or an impurity region containing both impurities.

With the above-described first, second, third, and fourth layer selection transistors LST, contact plug 32 can be used as a common electrode to first, second, third, and fourth semiconductor layers 12-1, 12-2, 12-3, and 12-4. That is, there is no necessity of providing individual contact plugs in first, second, third, and fourth semiconductor layers 12-1, 12-2, 12-3, and 12-4, and the size of a contact region can be reduced.

Note that the width of beam structure 31 in the second direction may be the same as or different from the width of fin structure Fin in the third direction. Preferably, the width of beam structure 31 in the second direction should be wider than the width of fin structure Fin in the third direction for the purposes of reducing wiring resistance in beam structure 31 and preventing a collapse of fin structure Fin.

Furthermore, contact plug (common electrode) 32 contains metal elements such as W and Al. Bit line BL is connected to contact plug 32.

CONCLUSION

As can be understood from the above, the present embodiments can reduce the initial thickness of the hard mask used for fin processing and separating charge storage layer and can improve the accuracy of shrinking of the hard mask after the fin processing. Therefore, nonvolatile semiconductor memory device suitable for miniaturization and manufacturing method of the same can be achieved.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method of manufacturing a nonvolatile semiconductor memory device including a semiconductor substrate; a stacked layer structure including first to n-th semiconductor layers (n is a natural number equal to or larger than 2) stacked in a first direction which is perpendicular to a surface of the semiconductor substrate, and an upper insulating layer stacked on the n-th semiconductor layer, the stacked layer structure extending in a second direction which is parallel to the surface of the semiconductor substrate; and first to n-th NAND strings provided on surfaces of the first to n-th semiconductor layers in a third direction which is perpendicular to the first and second directions respectively, wherein each of the first to n-th NAND strings includes memory cells connected in series, each of the memory cells includes a charge storage layer and a control gate electrode, the charge storage layers of the memory cells are separated from one another, and the upper insulating layer includes an oxide or a nitride of an element selected from a group of Al, Hf, Ta, Ti, and W, the method comprising:
forming a sidewall mask layer on a sidewall of a hard mask layer as the upper insulating layer;
forming the stacked layer structure by anisotropic etching using the hard mask layer and the sidewall mask layer as a mask;
forming a charge storage material on a surface of the stacked layer structure in the third direction;
removing the sidewall mask layer after forming the charge storage material;
forming a control gate material on the surface of the stacked layer structure in the third direction after removing the sidewall mask layer;
forming a gate mask layer on the stacked layer structure and the control gate material;
forming the control gate electrode of each of the memory cells by patterning the control gate material using the gate mask layer as a mask; and
separating the charge storage layers of the memory cells from one another by patterning the charge storage material using the hard mask layer as a mask in an area which is not covered with the gate mask layer, while the control gate material is patterned.

2. A method of manufacturing a nonvolatile semiconductor memory device including a semiconductor substrate; a stacked layer structure including first to n-th semiconductor layers (n is a natural number equal to or larger than 2) stacked in a first direction which is perpendicular to a surface of the semiconductor substrate, and an upper insulating layer stacked on the n-th semiconductor layer, the stacked layer structure extending in a second direction which is parallel to the surface of the semiconductor substrate; and first to n-th NAND strings provided on surfaces of the first to n-th semiconductor layers in a third direction which is perpendicular to the first and second directions respectively, wherein each of the first to n-th NAND strings includes memory cells connected in series, each of the memory cells includes a charge storage layer and a control gate electrode, the charge storage layers of the memory cells are separated from one another, and the upper insulating layer includes an oxide or a nitride of an element selected from a group of Al, Hf, Ta, Ti, and W, the method comprising:
forming a hard mask layer as the upper insulating layer, the hard mask layer including first and second layers;
forming a sidewall mask layer on a sidewall of the hard mask layer;
forming the stacked layer structure by anisotropic etching using the second layer and the sidewall mask layer as a mask;
forming a charge storage material on a surface of the stacked layer structure in the third direction;

removing the second layer and the sidewall mask layer after forming the charge storage material;

forming a control gate material on the surface of the stacked layer structure in the third direction after removing the second layer and the sidewall mask layer;

forming a gate mask layer on the stacked layer structure and the control gate material;

forming the control gate electrode of each of the memory cells by patterning the control gate material using the gate mask layer as a mask; and separating the charge storage layers of the memory cells from one another by patterning the charge storage material using the first layer as a mask in an area which is not covered with the gate mask layer, while the control gate material is patterned.

3. The method of claim 2, wherein the first layer includes an oxide or a nitride of an element selected from a group of Al, Hf, Ta, Ti, and W, and the second layer includes an element in the sidewall mask layer.

4. The method of claim 2, wherein the first layer includes an oxide or a nitride of an element selected from a group of Al, Hf, Ta, Ti, and W, and the second layer includes one of a silicon oxide layer, a silicon nitride layer, and a resist layer including carbon.

5. A method of manufacturing a nonvolatile semiconductor memory device including a semiconductor substrate; a stacked layer structure including first to n-th semiconductor layers (n is a natural number equal to or larger than 2) stacked in a first direction which is perpendicular to a surface of the semiconductor substrate, and an upper insulating layer stacked on the n-th semiconductor layer, the stacked layer structure extending in a second direction which is parallel to the surface of the semiconductor substrate; and first to n-th NAND strings provided on surfaces of the first to n-th semiconductor layers in a third direction which is perpendicular to the first and second directions respectively, wherein each of the first to n-th NAND strings includes memory cells connected in series, each of the memory cells includes a charge storage layer and a control gate electrode, the charge storage layers of the memory cells are separated from one another, and the upper insulating layer includes an oxide or a nitride of an element selected from a group of Al, Hf, Ta, Ti, and W, wherein the stacked layer structure includes a slit passing through the upper insulating layer and the first to n-th semiconductor layers in the first direction, a first insulating layer covering a surface of the first to n-th semiconductor layers provided in the slit in the third direction, a conductive layer provided in the slit, and a second insulating layer covering the conductive layer in the first direction, the method comprising:

forming a slit in the first to n-th semiconductor layers by anisotropic etching using a hard mask layer as the upper insulating layer having the slit;

forming the first insulating layer on surfaces of the first to n-th semiconductor layers provided in the slit in the third direction;

forming a conductive layer in the slit;

forming a sidewall mask layer in the slit and on a sidewall of the hard mask layer; and forming the stacked layer structure by anisotropic etching using the hard mask layer and the sidewall mask layer as a mask.

6. The method of claim 5, further comprising:

forming a charge storage material on a surface of the stacked layer structure in the third direction;

removing the sidewall mask layer after forming the charge storage material;

forming a control gate material on the surface of the stacked layer structure in the third direction after removing the sidewall mask layer;

forming a gate mask layer on the stacked layer structure and the control gate material;

forming the control gate electrode of each of the memory cells by patterning the control gate material using the gate mask layer as a mask; and separating the charge storage layers of the memory cells from one another by patterning the charge storage material using the hard mask layer as a mask in an area which is not covered with the gate mask layer, while the control gate material is patterned.

7. The method of claim 6, further comprising:

leaving a part of the sidewall mask layer in the slit as the second insulating layer when the sidewall mask layer is removed; and separating the charge storage layers of the memory cells from one another using the hard mask layer and the sidewall mask layer in the slit as a mask, while the control gate electrode of each of the memory cells is formed.

8. A method of manufacturing a nonvolatile semiconductor memory device including a semiconductor substrate; a stacked layer structure including first to n-th semiconductor layers (n is a natural number equal to or larger than 2) stacked in a first direction which is perpendicular to a surface of the semiconductor substrate, and an upper insulating layer stacked on the n-th semiconductor layer, the stacked layer structure extending in a second direction which is parallel to the surface of the semiconductor substrate; and first to n-th NAND strings provided on surfaces of the first to n-th semiconductor layers in a third direction which is perpendicular to the first and second directions respectively, wherein each of the first to n-th NAND strings includes memory cells connected in series, each of the memory cells includes a charge storage layer and a control gate electrode, the charge storage layers of the memory cells are separated from one another, and the upper insulating layer includes an oxide or a nitride of an element selected from a group of Al, Hf, Ta, Ti, and W, wherein each of the memory cells includes a first insulating layer and the charge storage layer in the order stated on a surface of the first to n-th semiconductor layers in the third direction, and includes a second insulating layer and the control gate electrode covering two surfaces of the charge storage layer in the second direction, the method comprising:

forming a sidewall mask layer on a sidewall of a hard mask layer as the upper insulating layer;

forming the stacked layer structure by anisotropic etching using the hard mask layer and the sidewall mask layer as a mask;

forming a charge storage material on a surface of the stacked layer structure in the third direction;

removing the sidewall mask layer after forming the charge storage material;

forming an insulating material on the surface of the stacked layer structure in the third direction after removing the sidewall mask layer;

forming a gate mask layer on the stacked layer structure and the insulating material;

forming a line and space pattern by patterning the insulating material using the gate mask layer as a mask;

separating the charge storage layers of the memory cells by patterning the charge storage material using the hard mask layer as a mask in an area which is not covered with the gate mask layer, while the line and space pattern is formed; and forming the second insulating layer and the control gate electrode in the space of the line and space pattern, the second insulating layer and the control gate electrode covering surfaces of the charge storage layer in the second direction.

9. A method of manufacturing a nonvolatile semiconductor memory device including a semiconductor substrate; a stacked layer structure including first to n-th semiconductor layers (n is a natural number equal to or larger than 2) stacked in a first direction which is perpendicular to a surface of the semiconductor substrate, and an upper insulating layer stacked on the n-th semiconductor layer, the stacked layer structure extending in a second direction which is parallel to the surface of the semiconductor substrate; and first to n-th NAND strings provided on surfaces of the first to n-th semiconductor layers in a third direction which is perpendicular to the first and second directions respectively, wherein each of the first to n-th NAND strings includes memory cells connected in series, each of the memory cells includes a charge storage layer and a control gate electrode, the charge storage layers of the memory cells are separated from one another, and the upper insulating layer includes an oxide or a nitride of an element selected from a group of Al, Hf, Ta, Ti, and W, wherein the stacked layer structure includes first to (n+1)-th insulating layers stacked in the first direction, the i-th semiconductor layer (i is one of 1 to n) is provided between the i-th insulating layer and the (i+1)-th insulating layer, each of the first to n-th semiconductor layers has a width narrower than that of each of the first to (n+1)-th insulating layers in the third direction, and the charge storage layers of the memory cells are provided in concave portions between the first to (n+1)-th insulating layers respectively, the method comprising:
- forming a sidewall mask layer on a sidewall of a hard mask layer as the upper insulating layer;
- forming the stacked layer structure by anisotropic etching using the hard mask layer and the sidewall mask layer as a mask;
- forming the concave portions between the first to (n+1)-th insulating layers by etching a surface of the first to n-th semiconductor layers in the third direction, a width of the etching being equal to or smaller than that of the sidewall mask layer in the third direction; and
- forming the charge storage layers of the memory cells in the concave portions respectively.

10. A method of manufacturing a nonvolatile semiconductor memory device including a semiconductor substrate; a stacked layer structure including first to n-th semiconductor layers (n is a natural number equal to or larger than 2) stacked in a first direction which is perpendicular to a surface of the semiconductor substrate, and an upper insulating layer stacked on the n-th semiconductor layer, the stacked layer structure extending in a second direction which is parallel to the surface of the semiconductor substrate; and first to n-th NAND strings provided on surfaces of the first to n-th semiconductor layers in a third direction which is perpendicular to the first and second directions respectively, wherein each of the first to n-th NAND strings includes memory cells connected in series, each of the memory cells includes a charge storage layer and a control gate electrode, the charge storage layers of the memory cells are separated from one another, and the upper insulating layer includes an oxide or a nitride of an element selected from a group of Al, Hf, Ta, Ti, and W, wherein the stacked layer structure includes first to (n+1)-th insulating layers stacked in the first direction, the i-th semiconductor layer (i is one of 1 to n) is provided between the i-th insulating layer and the (i+1)-th insulating layer, and the upper insulating layer which is covered with the control gate electrode has a width equal to or narrower than that of the (n+1)-th insulating layer in the third direction; and wherein each of the first to n-th semiconductor layers has a width wider than a width of each of the first to (n+1)-th insulating layers in the third direction, and the charge storage layers of the memory cells are provided along convex portions of the first to n-th semiconductor layers respectively, the method comprising:
- forming a sidewall mask layer on a sidewall of a hard mask layer as the upper insulating layer;
- forming the stacked layer structure by anisotropic etching using the hard mask layer and the sidewall mask layer as a mask;
- forming the convex portions of the first to n-th semiconductor layers by etching a surface of the first to (n+1)-th insulating layers in the third direction, a width of the etching being equal to or smaller than that of the sidewall mask layer in the third direction; and
- forming the charge storage layers of the memory cells along the convex portions respectively.

* * * * *